US007024660B2

(12) United States Patent
Andrade et al.

(10) Patent No.: US 7,024,660 B2
(45) Date of Patent: Apr. 4, 2006

(54) DEBUGGING A PROGRAM INTENDED TO EXECUTE ON A RECONFIGURABLE DEVICE USING A TEST FEED-THROUGH CONFIGURATION

(75) Inventors: Hugo A. Andrade, Austin, TX (US); Brian Keith Odom, Georgetown, TX (US); Cary Paul Butler, Austin, TX (US); Joseph E. Peck, Round Rock, TX (US); Newton G. Petersen, Austin, TX (US)

(73) Assignee: National Instruments Corporation, Austin, TX (US)

( * ) Notice: Subject to any disclaimer, the term of this patent is extended or adjusted under 35 U.S.C. 154(b) by 728 days.

(21) Appl. No.: 10/055,691

(22) Filed: Oct. 29, 2001

(65) Prior Publication Data

US 2003/0192032 A1   Oct. 9, 2003

Related U.S. Application Data

(63) Continuation of application No. 10/034,565, filed on Oct. 19, 2001, which is a continuation-in-part of application No. 09/499,503, filed on Feb. 7, 2000, now Pat. No. 6,608,638, which is a continuation-in-part of application No. 09/229,695, filed on Jan. 13, 1999, now Pat. No. 6,311,149.

(60) Provisional application No. 60/313,136, filed on Aug. 17, 2001, provisional application No. 60/312,252, filed on Aug. 14, 2001, provisional application No. 60/074,806, filed on Feb. 17, 1998.

(51) Int. Cl.
  *G06F 9/44*   (2006.01)
(52) U.S. Cl. ............................ 717/124; 716/4; 714/25; 714/27; 714/31
(58) Field of Classification Search ............... 717/124; 716/34, 16–18, 4; 714/25, 33, 39, 27, 31
   See application file for complete search history.

(56) References Cited

U.S. PATENT DOCUMENTS 4,901,221 A   2/1990   Kodosky et al.

(Continued)

FOREIGN PATENT DOCUMENTS

DE   42 05 524 A1   8/1992

(Continued)

OTHER PUBLICATIONS

Levi, Delon; Guccione, Steven A; "GeneticFPGA: Evolving Stable Circuits on Mainstream FPGA Devices", Jul. 1999, IEEE, retrieved Dec. 7, 2004.*

(Continued)

*Primary Examiner*—Wei Y. Zhen
*Assistant Examiner*—Mary Steelman
(74) *Attorney, Agent, or Firm*—Meyertons, Hood, Kivlin, Kowert & Goetzel, P.C.

(57) ABSTRACT

A system and method for debugging a program which is intended to execute on a reconfigurable device. A computer system stores a program that specifies a function, and which is convertible into a hardware configuration program (HCP) and deployable onto a programmable hardware element comprised on the device. The HCP is generated based on the program, specifies a configuration for the programmable hardware element that implements the function, and further specifies usage of one or more fixed hardware resources by the programmable hardware element in performing the function. A test configuration is deployable on the programmable hardware element by a deployment program, where, after deployment, the programmable hardware element provides for communication between the fixed hardware resources and the program. The program is executable by a processor in the computer system, where during execution the program communicates with the one or more fixed hardware resources through the programmable hardware element.

88 Claims, 40 Drawing Sheets

U.S. PATENT DOCUMENTS

| | | | |
|---|---|---|---|
| 5,309,556 | A | 5/1994 | Sismilich |
| 5,493,507 | A * | 2/1996 | Shinde et al. ............... 703/14 |
| 5,497,498 | A | 3/1996 | Taylor |
| 5,535,342 | A | 7/1996 | Taylor |
| 5,541,849 | A | 7/1996 | Rostoker et al. |
| 5,555,201 | A | 9/1996 | Dangelo et al. |
| 5,583,749 | A | 12/1996 | Tredennick et al. |
| 5,603,043 | A * | 2/1997 | Taylor et al. ............... 712/1 |
| 5,638,299 | A | 6/1997 | Miller |
| 5,652,875 | A | 7/1997 | Taylor |
| 5,684,980 | A | 11/1997 | Casselman |
| 5,732,277 | A | 3/1998 | Kodosky et al. |
| 5,737,235 | A | 4/1998 | Kean et al. |
| 6,009,256 | A | 12/1999 | Tseng et al. |
| 6,052,524 | A * | 4/2000 | Pauna ............... 703/22 |
| 6,064,409 | A | 5/2000 | Thomsen et al. |
| 6,112,020 | A * | 8/2000 | Wright ............... 716/17 |
| 6,118,938 | A * | 9/2000 | Lawman et al. ............... 716/16 |
| 6,219,628 | B1 | 4/2001 | Kodosky et al. |
| 6,226,776 | B1 | 5/2001 | Panchul et al. |
| 6,230,307 | B1 | 5/2001 | Davis et al. |
| 6,247,147 | B1 * | 6/2001 | Beenstra et al. ............... 714/39 |
| 6,282,627 | B1 * | 8/2001 | Wong et al. ............... 712/15 |
| 6,532,573 | B1 * | 3/2003 | Kurosaka ............... 716/5 |
| 6,539,438 | B1 * | 3/2003 | Ledzius et al. ............... 710/8 |
| 6,571,373 | B1 * | 5/2003 | Devins et al. ............... 716/5 |
| 6,802,026 | B1 * | 10/2004 | Patterson et al. ............... 714/35 |

FOREIGN PATENT DOCUMENTS

| | | |
|---|---|---|
| DE | 692 32 869 T2 | 9/2003 |
| WO | WO 94 10627 A | 5/1994 |
| WO | WO 94 15311 A | 7/1994 |

OTHER PUBLICATIONS

Patterson, Cameron; "High Performance DES Encryption in Virtex FPGAs using JBits", p. 113-121, 2000 IEEE, retrieved Dec. 7, 2004.*

Scalera, Johathan; jones, Mark; "A Run-Time Reconfigurable Plug-In for the Winamp MP3 Player", p. 319-320, 2000 IEEE, retrieved Dec. 7, 2004.*

Xie, H.A.; Forward, K.E.; Adams, K.M.; Leask, D; "An SBus Monitor Board", p. 1-8, 1995, ACM, retrieved Dec. 7, 2004.*

XP000554820 Edwards, et al., "Software acceleration using programmable hardware devices," IEEE Proceedings: Computers and Digital Techniques, vol. 143, No. 1, Jan. 1996, pp. 55-63.

XP000380758 Lesser, et al, "High Level Synthesis and Generating FPGAs with the BEDROC System," Journal of VLSI Signal Processing, vol. 6, No. 2, Aug. 1993, pp. 191-214.

Ade, M; Lauwereins, R; Peperstraete, J.A.; Hardware-Software Codesign with GRAPE, Proceedings of the Sixth IEEE International Workshop on Rapid System Prototyping, pp. 40-47, Jun. 9, 1995.

Lauwereins, R; Engels, M; Ade, M; Peperstraette, J; Grape-II: A System-Level Prototyping Environment for DSP Applications, Computer, vol. 28, Issue 2, pp. 35-43, Feb. 1995.

Lysaght, P; Stockwood, J; A Simulation Tool for Dynamically Reconfigurable Field Programmable Gate Arrays, IEEE Transactions on Very Large Scale Integration Systems, vol. 4, Issue 3, pp. 381-390, Sep. 1996.

De Coster, GRAPE-II: An Introduction [online]. Automatic Control and Computer Architectures Department. Katholieke Universiteit Leuven, Belgium, Feb. 22, 1996 [retrieved Oct. 6, 1999] Retrieved from the Internet @ http://www.esat.kuleuven.ac.be/acca.

Weban et al., A Software Development System for FPGA-based Data Acquisition Systems, Proceedings of the IEEE Symposium on FPGAs for Custom Computing Machines, pp. 28-37, Apr. 1996.

Petronino et al., An FPGA-based Data Acquisition System for a 95 GHz. W-band Radar, IEEE International Conference on Acoustics, Speech and Signal Processing, vol. 5, pp. 4105-4108, Apr. 1997.

Boulay et al., A High Throughput Controller for a 256-Channel Cardiac Potential Overlapping System, Canadian Conference on Electrical and Computer Engineering, vol. 1, pp. 539-542, Sep. 1995.

Collamati et al. "Induction Machine stator Fault On-line Diagnosis Based on LabVIEW Environment", Mediterranean Electrotechnical Conference, vol. 1, p. 495-498, May 1996.

Spoelder et al., "Virtual Instrumentation: A Survey of Standards and Their Interrelation", Proc. IEEE Instr. and Measurement Tech. Conf., vol. 1, pp. 676-681, May 1997.

Srinivasan et al., "LabVIEW program Design for On-Line Data Acquisition and Predictive Maintenance", Proc. Of the 30th Southeastern Symp. On System Theory, pp. 520-524, Mar. 1998.

Wahidanabanu et al., "Virtual Instrumentation with Graphical Programming for Enhanced Detection and Monitoring of Partial Discharges", Proc. Electrical Insulation Conf. 1997, pp. 291-296, Sep. 1997.

Choosing Block-Diagram Tools for DSP Design, http://www.bdti.com/articles/info_dspmt95blockdiagram.htm, May 9, 2003, pp. 1-7.

Real-Time Workshop for Use with Simulink, User's Guide, May 1994, 229 pages.

Guide to Rapid Prototyping with Simulink, Real-Time Workshop and dSPACE, 1995, 16 pages.

Real-Time Interface to Simulink, RTI 30, User's Guide, 1995, 125 pages.

Kevin J Gorman and Kourosh J. Rahnamai, "Real-Time Data Acquisition and Controls Using MatLAB", 1995, 4 pages.

SPW—MatLAB Co-Simulation Interface Product Data Sheet, 1996, 2 pages.

Signal Processing WorkSystem, MatLAB Interface User's Guide, Oct. 1995, 72 pages.

Alta Group of Cadence Design Systems, Inc., 1995, 34 pages.

Code Generation System Product Data Sheet, 1994, 8 pages.
SPW/CGS Porting Kits Product Data Sheet, Nov. 1994, 2 pages.

MultiProx for SPW Product Data Sheet, Aug. 1994, 4 pages.
DSP ProCoder for SPW Product Data Sheet, Nov. 1994, 4 pages.

Xanalog Corporation Sales Manual, Jan. 1987, 8 pages.
Available XA-1000 Literature and Its Use, 1986, 2 pages.
Xanalog, XA-1000 Programming ICONS, 1986.
Xanalog's CAE System: The Fastest AT Alive, Mass High Tech, vol. 4, No. 22, Aug. 1988, 1 page.

Xanalog The Computer Aided Engineering Workstation Comes to Simulation, Simulation vol. 47, No. 1, Jul. 1986, 3 pages.

Xanalog RT Real Time Analog and Digital I/O, Oct. 1990, 4 pages.

Xanalog/SC+, Sep. 1990, 4 pages.
Xanalog Specializing in Workstations for Continuous Dynamic Simulation, 1987, 24 pages.
Xanalog Real-Time User Guide, 1994, 28 pages.

Lee et al., "Gabriel: A Design Environment for Programmable DSPs", Nov. 7, 1988, 13 pages.

Lee et al., "A Design Tool for Hardware and Software for Multiprocessor DSP Systems", May 1989, 4 pages.

Gabriel 0.7 Overview, 1990, 5 pages.

Joseph T. Buck and Edward A. Lee, "Scheduling Dynamic Dataflow Graphs with Bounded Memory Using the Token Flow Model", http://www.synopsys.com/, 1995, 4 pages.

Edward A. Lee, "Design Methodology for DSP", 1992, 4 pages.

Pino et al., Interface Synthesis in Heterogeneous System-Level DSP Design Tools, May 1996, 4 pages.

Jose Luis Pino, Master's Report, "Software Synthesis for Single-Processor DSP Systems Using Ptolemy", May 1993, 48 pages.

Asawaree Kalavade and Edward A. Lee, "A Hardware-Software Codesign Methodology for DSP Applications", 1993, 12 pages.

Pino et al., "Automatic Code Generation for Heterogeneous Multiprocessors", 1994, 4 pages.

Tool Chest continues to Grow, Electronic Engineering Times, Dec. 15, 1995, 2 pages.

Pino et al., Mapping Multiple Independent Syunchronous dataflow Graphs onto Heterogeneous Multiprocessors, Oct. 1994, 6 pages.

Asawaree Kalavade and Edward A. Lee, Hardware/Software Co-Design Using Ptolemy—A Case Study, Sep. 1992, 18 pages.

Pino et al, "Software Synthesis for DSP Using Ptolemy", 1995, 15 pages.

Vol. 1—Ptolemy 0.7 User's Manual, 1997, 532 pages.

i-Logix Product Overview, 1996, 52 pages.

Press Release, i-Logix Statemate MAGNUM Supports PCs, Jan. 31, 1997, 2 pages.

Press Release, i-Logix Signs Reseller Agreement for Virtual Prototypes, Inc.'s VAPS Product Line, Feb. 11, 1997, 2 pages.

Press Release, "i-Logix Introduces Rhapsody, Object-Oriented analysis, Design and Implementation Tool", Feb. 10, 1997, 2 pages.

Statemate/C Product Overview, 1995, 4 pages.

Press Release, "i-Logix and Integrated Systems Link Statemate MAGNUM and MATRIX AutoCode" Jan. 3, 1997, 2 pages.

Press Release, i-Logix and Wind River unveil Industry's First Rapid Prototyping Solution for Testing Embedded Systems at ESC West in San Jose, Sep. 17, 1996, 3 pages.

Press Release, i-Logix Inc. Endorses Unified Modeling Language, Jan. 16, 1997, 1 page.

Levy, M., "DSP Design Tools Target FPGAs" www.reed-electronics.com/ednmag/archives/1996/062096/13df2.htm, Jun. 20, 1996.

Heimdahl, M.P.E., Keenan, D.J., "Generating Code from Hierarchical State-Based Requirements," Proceedings of IEEE International Symposium on Requirements Engineering (RE'97), Jan. 1997.

Integrated Systems, Inc., "MATRIXx Product Family Technical Specifications," Product Manual, Copyright 1995.

Pauer, E.K., "Multiprocessor System Development for High Performance Signal Processing Applications," Proceedings of the 1997 IEEE Int. Workshop on Rapid System Prototyping (RSP), Copyright 1997.

Drusinsky, D., "Extended State Diagrams and Reactive Systems," Dr. Dobb's Journal, Oct. 1994.

Ade, M., Lauwereins, R., and Peperstraete, J.A., "Hardware-Software Codesign with GRAPE," Rapid System Prototyping, Proceedings of the Sixth IEEE International Workshop on Rapid System Prototyping (RSP'95), 1995.

Chen, X., Ling, X., Amano, H., "Software Environment for WASMII: a Data Driven Machine with a Virtual Hardware," Proceedings of 4th Workshop on Field-Programmable Logic and Applications (FPL '94), pp. 208-219, Springer Verlag, Sep. 1994.

* cited by examiner

DEBUGGING A PROGRAM INTENDED TO EXECUTE ON A RECONFIGURABLE DEVICE USING A TEST FEED-THROUGH CONFIGURATION

PRIORITY DATA

This application claims benefit of priority of U.S. provisional application Ser. No. 60/313,136 titled "Reconfigurable Measurement System Utilizing a Programmable Hardware Element" filed Aug. 17, 2001, whose inventors were Brian Keith Odom, Joseph Peck, Hugo Andrade, Cary Paul Butler, James J. Truchard, Matt Novacek and Newton Petersen;

This application claims benefit of priority of U.S. provisional application Ser. No. 60/312,252 titled "A Reconfigurable I/O Measurement System" filed Aug. 14, 2001, whose inventors were Brian Keith Odom, Joseph Peck, Hugo Andrade, Cary Paul Butler, James J. Truchard, Newton Petersen, and Matt Novacek.

CONTINUATION DATA

This application is a continuation of U.S. patent application Ser. No. 10/034,565 titled "Reconfigurable Test System" filed Oct. 19, 2001, whose inventors are Arthur Ryan, Hugo Andrade, and Brian Keith Odom, which is a continuation-in-part of U.S. patent application Ser. No. 09/229,695 titled "Reconfigurable Test System" filed Jan. 13, 1999, now U.S. Pat. No. 6,311,149 whose inventors were Arthur Ryan, Hugo Andrade, and Brian Keith Odom, which claims benefit of priority of U.S. provisional application Ser. No. 60/074,806 titled "Dynamic Hardware and Software Reconfiguration for Telecommunication Testing" filed Feb. 17, 1998 whose inventors were Arthur Ryan, Hugo Andrade.

This application is a continuation-in-part of U.S. utility application Ser. No. 09/499,503 titled "System and Method for Configuring a Programmable Hardware Instrument to Perform Measurement Functions Utilizing Estimation of the Hardware Implementation and Management of Hardware Resources," filed Feb. 7, 2000 now U.S. Pat. No. 6,608,638, whose inventors were Jeffrey L. Kodosky, Hugo Andrade, Brian Keith Odom, Cary Paul Butler, and Andrew Mihal.

FIELD OF THE INVENTION

The present invention relates to measurement and control, and particularly to measurement devices with programmable logic for performing interface, measurement, and control functions.

DESCRIPTION OF THE RELATED ART

Scientists and engineers often use measurement or instrumentation systems to perform a variety of functions, including laboratory research, process monitoring and control, data logging, analytical chemistry, test and analysis of physical phenomena, and control of mechanical or electrical machinery, to name a few examples. An instrumentation system typically includes transducers and other detecting means for providing "field" electrical signals representing a process, physical phenomena, equipment being monitored or measured, etc. Exemplary transducers include thermocouples, strain gauges, pressure sensors, microphones and cameras. As one example, detectors and/or sensors are used to sense the on/off state of power circuits, proximity switches, pushbutton switches, thermostats, relays or even the presence of positive or negative digital logic-level signals. The instrumentation system typically also includes interface hardware for receiving the measured field signals and providing them to a processing system, such as a personal computer. The processing system typically performs data analysis and presentation for appropriately analyzing and displaying the measured data.

Often, the field signals may comprise high common-mode voltages, ground loops, or voltage spikes that often occur in industrial or research environments which could damage the computer system. In that case, the instrumentation system typically includes signal conditioning circuitry, such as isolation circuitry, e.g., opto-couplers, for eliminating ground-loop problems and isolating the computer from potentially damaging voltages. Signal conditioning modules are typically provided for conditioning the raw field voltage signals by amplifying, isolating, filtering or otherwise converting the signals to appropriate signals for the computer system. In one embodiment, the analog signals are then provided to a plug-in data acquisition (DAQ) input/output (I/O) board, which is plugged into one of the I/O slots of a computer system. The DAQ board may include analog-to-digital (A/D) converters for converting the analog signals to corresponding digital signals. The computer system may have an I/O bus and connectors or slots for receiving I/O boards. Of course, other types of computer systems and I/O buses may be used to implement a processing system.

In general, measurement and control cards or devices have a particular set of resources on-board for use in measurement or control tasks, such as counters, analog to digital converters (ADC), I/O ports, filters, etc. This is especially true with respect to mass produced cards or devices, such as National Instruments MIO (Multifunction I/O) DAQ (Data Acquisition) series. These devices typically include a set of resources which meets the needs of a large majority of users. For example, a typical card may include a 16 channel multiplexed AI (analog input) in front of an A/D (analog to digital) converter, 2 analog outputs (AO), 8 digital lines, ~10 timing/triggering lines, 2 general purpose counters, plus one or more timing/triggering engines.

However, in many cases the set of provided resources is a superset of those required for a particular application. In other words, for a given application there are likely to be components on the card or device which are not used. Conversely, for some applications the resources provided on the card or device may not be quite what is needed, and so either additional components may be added to the device, or a different product or device may be selected for the task. For example, a particular sensor, such as a quadrature encoder, may require extra digital logic between the sensor and a supplied counter to count not only the samples or hits of a signal, but also the direction of the signal at each hit, i.e., up or down, in order to correctly receive the signals from the sensor. In other words, there are many cases where the standard card or device provides more or less resources than required for an application or task.

In addition, in many instances it would be desirable for the user to be able to program and reprogram a measurement device to perform different functions. This would allow the user to purchase one measurement device and use this measurement device for multiple different uses. This would also allow the user more flexibility in creating customer-defined measurement solutions. Therefore, improved measurement systems are desired which address one or more of the issues described above.

SUMMARY

Various embodiments of a system and method for measurement (including data acquisition) and/or control (including automation) operations are described. The system includes a measurement device, which may be referred to as a reconfigurable I/O (RIO) device, RIO unit, or a RIO. The RIO device may include at least one programmable hardware element which is configurable to perform a measurement and/or control function. The RIO device may also include one or more fixed hardware resources coupled to the programmable hardware element.

A typical RIO measurement system includes a computer system coupled to a RIO measurement device or unit. In one embodiment, the RIO device is a standalone device, and the RIO device may be coupled to a computer system or network solely for programming purposes. A computer system may also be coupled to the RIO device for programming and supervisory control, logging, or other types of co-processing. The RIO device may have various form factors such as a computer board or card, a PXI card, a VXI card, a standalone device, a smart sensor, a smart camera, etc.

As mentioned above, the RIO unit includes a programmable hardware element, such as a field programmable gate array (FPGA). The RIO device may also include one or more fixed hardware resources, such as counters, timers, A/D converters, signal conditioning logic, computer interface logic, etc. The RIO device may also include connectors for communicating with external components or systems, such as the computer system.

As used herein, the term "measurement device" is intended to include any of various types of devices that are operable to acquire and/or store data, and which may optionally be further operable to analyze or process the acquired or stored data. Examples of measurement devices include various types of instruments, such as oscilloscopes, multimeters, etc., as well as data acquisition devices or cards, devices external to a computer that operate similarly to data acquisition cards, smart sensors, one or more measurement modules in a chassis, and other similar types of devices.

The computer system may couple to the RIO measurement device through a serial bus, such as a USB (Universal Serial Bus) or IEEE 1394; a parallel bus such as PCI, PXI, VME, or VXI; or any other medium including a sensor bus; a network medium, such as Ethernet, a Control Area Network (CAN) or the Internet; wireless media such as IEEE 802.11 (Wireless Ethernet), Bluetooth, etc.; other serial or parallel buses, or any other transmission means. In one embodiment, the RIO measurement device may optionally also include one or more measurement modules, as well as one or more sensors or actuators which may be operable to couple to the modules and/or the RIO device and provide signals to the RIO measurement device for processing.

The host computer may comprise a CPU, a display screen, memory, and one or more input devices such as a mouse or keyboard. The host computer may operate with the RIO measurement device to analyze or measure data from the sensor/measurement device or to control the sensor and/or device. Alternatively, the computer may be used only to configure or program the RIO measurement device, i.e., the RIO unit, as described below.

In one embodiment, the computer system may store an application development environment used for creating programs. The computer system may also store a program implementing one or more measurement and/or control functions, i.e., a measurement program. The measurement program may be a graphical program implementing the one or more measurement functions. The measurement functions may perform one or more of signal acquisition, signal conditioning and conversion, control, signal analysis, signal display, and logging among others.

The computer system may be operable to execute the measurement program to perform the one or more measurement and/or control functions in conjunction with operation of the RIO and optionally one or more measurement modules and/or sensors. The measurement and control functions may include analysis of data or signals received from the RIO unit, control of RIO unit and/or measurement module operations, and user interface functions, among others.

In one embodiment, the computer system may be operable to deploy a portion or all of the measurement program (as a hardware configuration program) onto the programmable hardware element of the RIO unit. In one embodiment, the computer system may store and execute a deployment program for deploying a hardware configuration program onto a RIO unit. The RIO may then be operable to execute the hardware configuration program (corresponding to the measurement program) to perform the one or more measurement and/or control functions, possibly in conjunction with an optional measurement module and/or the computer system. During execution of the hardware configuration program by the FPGA, the FPGA may invoke or use one or more of the fixed hardware resources. The configured RIO may thus be operable to perform measurement and/or control operations. In one embodiment, the RIO may process and/or analyze the received signals, and may optionally send the results of the processing or analysis to the computer system for storage and/or further analysis. In another embodiment, the RIO may generate a control signal in response to the analysis, such as to an automation system.

In one embodiment, a RIO system may be configured to perform a function defined in a program or application, preferably a graphical program. In this embodiment, the application may first be designed e.g., in a graphical development environment, such as LabVIEW, LabVIEW FPGA, Simulink, etc., and then may be debugged in a simulation environment, described below. In the preferred embodiment, the graphical program may be developed in the G graphical programming language in the form of a graphical block diagram.

Then, the program (e.g., the graphical program) may be compiled to an FPGA hardware configuration program. In one embodiment, because of long compile times, the compiling may be performed on a client computer which is coupled to the host computer system 102 (functioning as a server) to avoid having to share the CPU resources of the host computer system. Compiling the program preferably produces an FPGA hardware configuration program which is operable to be deployed on the targeted FPGA on the RIO device.

Then, the hardware configuration program may be downloaded or deployed onto the FPGA. In one embodiment, downloading the hardware configuration program onto the FPGA may also include storing the hardware configuration program in a non-volatile memory coupled to the FPGA. The hardware configuration program may include the capability of invoking the various fixed hardware resources on the RIO device.

Finally, the deployed hardware configuration program may be executed on the FPGA to perform the functionality of the application. It is noted that in various embodiments, the FPGA may perform the functionality of the application in conjunction with the one or more fixed hardware resources comprised on the RIO with the FPGA. In other words, during execution of the hardware configuration program on the FPGA, the hardware configuration program may direct the FPGA to invoke various of the fixed hardware resources to perform particular functions. The RIO device may also operate with one or more of the host computer system, and/or one or more sensors and/or one or more measurement modules.

In one embodiment, the RIO measurement system may be configured to perform a measurement function. Performing the measurement function may include first acquiring a signal such as from a sensor or actuator, or from an external system. Then one or more of signal conditioning and signal conversion may be performed on the acquired signal, thereby generating data, e.g., results data. The signal conditioning and/or signal conversion may be performed by the RIO device, e.g., by the RIO FPGA, by the fixed hardware resources on the RIO device, or by a separate measurement module. The result data may include one or more of the original signal, the conditioned and/or converted signal, and information derived from or generated in response to the signal.

The programmable hardware element and/or the fixed hardware resource on the RIO may then perform the measurement function, e.g., on the signal or data. In other words, the RIO may perform a measurement function which was programmed into the programmable hardware element, such as filtering, pattern recognition, or other analysis. For another example, the RIO may generate control signals in response to an analysis of the data, such as to control one or more plant operations.

In another embodiment, in which the computer system comprises measurement software for performing a measurement function, the RIO unit may provide the data to the computer system. Then, the computer system may perform additional measurement functions, e.g., on the signal, where the measurement functions may include, measurement (including data acquisition) and/or control functions, as described above.

In one embodiment, a variety of digital interfaces, such as SPIbus and interfaces not known a priori, may be adapted to the resources of the RIO device.

Creation of the Graphical Program

In one embodiment, the host computer or server may store and execute a program (development program) which receives user input indicating a RIO configuration and/or task specification and generates a program, such as a graphical program, implementing the configuration and/or task. In a preferred embodiment, the development program may be a configuration wizard which is operable to lead the user through the configuration process, and to generate the graphical program, i.e., the measurement program. The wizard may utilize any of various graphical user interface (GUI) techniques to create the user-defined configuration, including drag and drop capabilities, menus, data fields, buttons, etc. For example, the wizard may provide (through the wizard GUI) a list or description of available resources such as I/O primitives, filters, counters, etc., and/or default or current values or suggested ranges for operating parameters for these resources. The user may select various of the resources and set their respective parameter values as desired.

In one embodiment, the wizard may present the available resources graphically (i.e., via icons), and may also graphically display the current configuration per the user's input. The user may drag and drop resources or components from the available resources to the current configuration diagram, and may remove resources from the configuration in the same manner. In one embodiment, the user may select, either graphically or through other means, one or more of the components in the configuration, and set timing, triggering, and/or synchronization parameters for the selected components. In another embodiment, the user may select two or more configured components and group them together, optionally giving the group a name and/or an associated icon. In this way, configured components may be organized and manipulated in a hierarchical manner. The wizard may further allow the user to add control structures such as loops and conditionals to the configuration, thereby providing higher level control functionality.

In one embodiment, the user may engage the configuration wizard on a server via a client computer system over a network, such as the Internet, i.e., using a client/server model. Client/server describes the relationship between two computer programs in which one program, the client, makes a service request from another program, the server, which fulfills the request. Although the client/server idea can be used by programs within a single computer, it is a more important idea in a network. In a network, the client/server model provides a convenient way to interconnect programs that are distributed efficiently across different locations.

In the usual client/server model, one server, sometimes called a daemon, is activated and awaits client requests. Typically, multiple client programs share the services of a common server program. Both client programs and server programs are often part of a larger program or application. In one embodiment, the client program may be a Web browser that requests services (the sending of Web pages or files) from a Web server (which technically is called a Hypertext Transport Protocol or HTTP server) in another computer somewhere on the Internet. Similarly, a computer with TCP/IP installed allows users to make client requests for files from File Transfer Protocol (FTP) servers in other computers on the Internet. The client program may provide various client functionality, such as browsing, requests for specific services (e.g., compilation), determining current configurations available, etc.

For example, in one embodiment, the client computer system may execute a client program (e.g., a browser) to connect to the host computer or server. The host computer or server may then display the wizard GUI on the client computer system display, thereby providing a mechanism for communication between the user and the wizard.

In response to the received user input, the wizard may generate the graphical program corresponding to the configuration, e.g., a LabVIEW diagram. The generated graphical program may itself be modified or edited by the user. Once the user is satisfied with the graphical program, conversion software may convert the graphical program into a hardware configuration program, as described below.

In addition, in one embodiment, the wizard may directly create a hardware configuration program through a variety of user input. The user input may include, but is not limited to, conventional hardware synthesis, selection from a library of pre-generated files, or direct implementation in an FPGA, or combinations thereof, etc.

Conversion of the Graphical Program to a Hardware Configuration Program

In one embodiment, the method may include the conversion of a graphical program, such as a graphical image processing or machine vision program, into hardware and/or software descriptions. The graphical program may comprise graphical code, such as interconnected function nodes or icons, and may use graphical data flow, graphical control flow and/or graphical execution flow constructs.

In one embodiment, programs of the present invention may create a VDiagram tree from the data structures of the graphical program. The VDiagram tree is an abstract hardware graph which represents at least a portion of the graphical program. The graph may be organized in a way that facilitates the generation of specific types of descriptions by back end programs of the present invention.

A hardware description may be generated from the abstract hardware graph by a back end program, and may be in any of various hardware description languages such as VHDL, EDIF, and Verilog. In the preferred embodiment, the hardware description comprises one or more VHDL files. A hardware netlist (preferably an FPGA-specific netlist) may be generated from the hardware description using various synthesis tools. As noted above, the term "netlist" comprises various intermediate hardware-specific description formats comprising information regarding the particular hardware elements required to implement a hardware design and the relationship among those elements. The hardware netlist is used to create or configure one or more functional hardware devices or hardware elements which are configured to execute the portion of the graphical program that is represented by the abstract hardware graph. As used herein, the term "hardware configuration program" refers to the program, bitfile, etc., which is loaded onto the programmable hardware element.

In one embodiment, the back end programs that convert the VDiagram tree to a hardware description may implement the functionality of components in the VDiagram component lists using constructs of their respective description languages. For example, a VHDL back end may create VHDL code to implement a component that performs a particular mathematical algorithm such as an exponential calculation. However, in one embodiment, such functional components are simply referenced as library components.

Thus, one embodiment of the present invention may comprise pre-compiled function blocks which implement these library components for particular hardware devices such as FPGAs. The various FPGA netlist synthesis tools used to generate an FPGA netlist from the hardware description may incorporate the pre-compiled function blocks into the FPGA netlist, and may also utilize hardware target-specific information in creating the netlist. For example, the exact form that the FPGA netlist takes may depend on the particular type of FPGA that will use the netlist, since FPGAs differ in their available resources.

An FPGA bit stream (hardware configuration program) may be generated from the FPGA netlist using readily available synthesis tools and uploaded to an FPGA. The FPGA may be comprised in a hardware device such as an interface board. After being programmed with the hardware configuration program, the FPGA is able to execute the portion of the graphical program that is exported to the hardware description. If the entire graphical program is not exported to the hardware description, then a portion of the program may execute on either a CPU implemented in the FPGA or on the general purpose CPU of the computer system. In either case, this portion of the graphical program may executed natively on the CPU, the graphical program may be converted to a text-based programming language (e.g., C) and then compiled for the CPU, or the graphical program may be compiled directly to machine language for execution on the CPU.

Where a portion of the graphical program is implemented on a CPU, the CPU may execute a real time operating system (e.g., LabVIEW RT), e.g., for performing supervisory control. In one embodiment, where the CPU couples to a display device (e.g., where the portion of the graphical program is implemented on the host CPU implemented in the host computer), then the portion that executes on the host may comprise the display portion of the program.

Simulation Environment

In one embodiment, a simulation environment, also referred to as a "Ghost" environment, may be used to test, analyze, and/or debug a hardware configuration program targeting the programmable hardware element (and one or more fixed hardware resources) comprised in a RIO system. In general, compile times for generating a hardware configuration program for an FPGA may take a lengthy time, e.g., many hours. In order to allow faster design and debugging, the "Ghost" simulation environment allows realistic simulation of a hardware configuration program in software, while still invoking the fixed hardware resources on the RIO device.

In one embodiment, as described above, the RIO system includes a programmable hardware element and one or more fixed hardware resources. The hardware configuration program may be designed to execute on the programmable hardware element and during execution the programmable hardware element may invoke various ones of the fixed hardware resources. During simulation, the programmable hardware element may be configured with a test feed-through configuration that may be optionally precompiled for the hardware target, and which may provide low level access to the fixed hardware resources on the reconfigurable board. In other words, when deployed on the programmable hardware element, the test feed-through configuration may provide for communication between the program executing on the host computer and the fixed hardware resources on the RIO device. This allows the host computer system to simulate execution of the hardware configuration program on the FPGA in software, while allowing the simulation software to invoke the actual fixed hardware resources on the RIO device, just as the FPGA would do.

In one embodiment, a set of I/O primitives, such as a set of standard LabVIEW I/O primitives, for the fixed hardware resources may be used to mediate data flow between the simulation program and the fixed hardware resources. When targeting the hardware (i.e., the programmable hardware element) these I/O primitives (possibly including standard LabVIEW primitives) may be converted into a hardware representation, such as an FPGA program file, as described above, and may take considerable time to compile. When targeting the test or simulation environment, i.e., the Ghost environment, the standard LabVIEW primitives may remain in software and run on the host computer, and thus compile very quickly. The I/O primitives may also remain in software, but redirect their functionality to the precompiled test feed-through configuration in hardware. Thus the I/O primitives executing on the host computer system can access the fixed hardware resources on the RIO device.

For example, consider a typical PID loop using an analog input and an analog output. This is commonly constructed as a while loop containing an I/O primitive for reading the analog input, the PID algorithm itself, and an I/O primitive for writing the analog output. When targeting hardware, all of these constructs may be converted to a hardware configuration program and downloaded to the FPGA on the RIO device. When targeting the Ghost environment, the precompiled test feed-through configuration may be quickly downloaded to the FPGA on the RIO device, and the while loop and PID algorithm may remain in software. As the diagram or program executes on the host, whenever an I/O primitive is called it communicates with the FPGA on the RIO device to interface to the actual hardware I/O. The test feed-through configuration on the FPGA allows the I/O primitive to communicate through the FPGA to the fixed hardware resources.

A key advantage to this solution is that software based debugging methodologies may be used for debugging the diagram (program) while retaining connectivity to real world signals that the hardware targeted application would provide. This functionality may be provided without any changes to the user's application and may be completely transparent. Therefore, the user may debug most functional issues related to the application or system, and so may concentrate primarily on timing issues after performing a full compilation.

In one embodiment, the test feed-through configuration may be extended to utilize a micro-controller implemented or configured in the FPGA. In other words, a processor (e.g., a micro-controller) may be implemented on the FPGA, then the program may be compiled for the FPGA-implemented processor. The program may then be executed on the FPGA-implemented processor (while maintaining the original I/O capabilities of the Ghost environment). Thus any timing issues arising from sharing the processor of the host computer system may be avoided.

As indicated above, the programmable hardware element may be configured or programmed with the test feed-through configuration, which provides connectivity between the fixed hardware resources and the program executing on the computer system.

In summary, a program may be stored on a memory of the computer system. The program preferably specifies a function, e.g., a measurement function, where the program is operable to be converted into a hardware configuration program and deployed on the programmable hardware element to perform the function. In other words, as in the systems described above, the program is meant to be deployed on the programmable hardware element, after which the programmable hardware element may be operable to perform the function in conjunction with one or more fixed hardware resources, as described above. As mentioned above, deploying the program may comprise converting the program into a hardware configuration program. It is again noted that the hardware configuration program specifies usage of the one or more fixed hardware resources by the programmable hardware element (in performing the function).

In order to test the program without waiting for a lengthy compilation of the program into a hardware configuration program, the simulation environment is provided. The programmable hardware element may be configured with a test feed-through configuration. After with the test feed-through configuration, the programmable hardware element is operable to provide for communication between the one or more fixed hardware resources and the program.

Finally, the computer system may execute the program for test and analysis. Executing the program includes the program communicating with the one or more fixed hardware resources through the programmable hardware element. In other words, the computer system may execute the program while maintaining connectivity with the one or more fixed hardware resources via the test feed-through configured programmable hardware element, and thus interacting with the "real world" signals and behavior of the hardware resources. This allows both fast and accurate testing of programs to be deployed on the RIO device.

In the preferred embodiment, the test feed-through configuration is pre-compiled, so that the programmable hardware element may be configured with the test feed-through configuration without having to perform a lengthy compilation. It should be noted that the debugging system and method described herein is applicable to any reconfigurable system using a programmable hardware element and one or more fixed hardware resources. For example, the program may be any of a measurement program which is executable to perform a measurement function, an automation program which is executable to perform an automation function, a control program which is executable to perform a control function, and a simulation program which is executable to perform a simulation function, among others.

Thus, in one embodiment, FPGA in a RIO system may be configured to include one or more of: I/O and timed I/O elements, buses, clocks, memories (e.g., FIFOs) and real time trigger buses (e.g., RTSI), various functions or features provided by a vendor, basic services and environment functions, and custom functions and interfaces provided or specified by the customer. Additionally, the FPGA may include debug/simulation functions which facilitate the testing and debugging process described above.

Programming Interface Protocol

In one embodiment, the RIO unit may comprise or be coupled to at least one measurement module which may be operable to provide connectivity to a sensor or actuator, and may be further operable to provide signal conditioning and/or signal conversion on the signal before sending the signal to the RIO unit. The RIO unit may be operable to receive interface protocol information from the measurement module specifying how to operate or interface with the measurement module. The RIO unit may then communicate the interface protocol information to the computer system. Alternatively, the measurement module may communicate the interface protocol information directly to the computer system. Based on the interface protocol information, the computer system may program or configure the programmable hardware element on the RIO unit to implement the interface as specified by the measurement module. In other words, the measurement module may tell the RIO how to "talk" with it, and the RIO may then tell the computer system how to program the RIO to communicate with the measurement module accordingly, or the measurement module may tell the computer system directly how to program the RIO. The computer system may then program the RIO unit (i.e., the programmable hardware element on the RIO unit), thereby implementing the interface specified in the interface protocol information communicated by the measurement module. This process may be referred to as initialization of the RIO/measurement module. The configured RIO and the measurement module may then be operable to perform measurement and control operations in conjunction with the sensor and/or the computer system.

In one embodiment, the measurement module may be in the form of a measurement cartridge and the RIO unit in the form of a RIO cartridge chassis or carrier which is operable to receive one or more of the measurement cartridges. Thus, the RIO may host a plurality of measurement cartridges, each of which may provide measurement and/or control functionality for a measurement or control operation or task. The RIO may be operable to communicate with each measurement cartridge (i.e., module) and be programmed or configured (e.g., by the computer system) to implement the respective interface of each measurement cartridge. In this manner a suite of sensors may be fielded, each of which feeds signals to a respective measurement cartridge which in turn communicates through a respective interface (protocol) with the RIO cartridge carrier. The RIO cartridge career (i.e., the RIO) may in turn couple to a computer system. Thus, the RIO device may support a heterogeneous plurality of interfaces without having to include a heterogeneous set of interface hardware components.

Other Example Embodiments

In one embodiment, the RIO unit may be designed to couple to a host computer system, wherein the host computer system may be used for programming or configuring the RIO unit. The host computer system may also be used to operate in conjunction with the RIO unit as a co-processor during RIO execution. In another embodiment, the host computer system may be used solely for programming or configuring the RIO unit. After configuration, the RIO unit may be disconnected from the host computer system and operated as a stand-alone device. As a stand-alone device, the RIO unit may couple to various sensors, actuators, measurement modules, etc., to perform a desired measurement function. A stand-alone RIO device may also be coupled to a network to communicate with other devices, including other RIO devices. In one embodiment, a RIO device is reconfigurable to operate either as a device controlled by a computer system and as a stand-alone device with network connectivity.

In one embodiment, the RIO unit may comprise a PXI card, i.e., may be implemented on a PXI card. The PXI card may be operable to plug into a PXI chassis or a suitably equipped computer system, and may implement the RIO functionality described above. It should be noted that other card based implementations besides the PXI card implementation are also contemplated, for example, PCI, VXI, Infiniband, or other protocols or platforms may be used to implement a carrier, the PXI card embodiment being but one example.

In one embodiment, the RIO unit may comprise or be coupled to a Personal Digital Assistant (PDA). Thus the PDA may comprise the RIO unit and may include one or more slots for measurement modules. Alternatively, the RIO may be in the form of an optionally detachable RIO module, which may in turn couple to a measurement module. The measurement module may in turn be operable to couple to a sensor or actuator, as described above. In one embodiment, the PDA may be operable to program the RIO (i.e., the RIO's programmable hardware element) with the interface protocol information provided by the measurement module, as described in detail above, and may be further operable to provide functionality related to a measurement and/or control task or operation. In another embodiment, the PDA may be used as an interface to another computer system. For example, a suitably equipped PDA may provide wireless communication for the RIO/measurement module.

In one embodiment, RIO based systems may be extended with external I/O expansion, i.e., with additional I/O connections for coupling to a plurality of measurement modules. A RIO cartridge or card may provide connectors for analog I/O and/or digital I/O. The digital I/O may be coupled to an I/O expansion device, such as a breakout backplane, which may provide connectivity for a plurality of measurement module cards or cartridges, and may thereby be operable to facilitate external, synchronized, and conditioned I/O for the measurement system.

In another embodiment, the RIO card or device may couple to an addressable backplane, for example, through an SPI with slot select capabilities, and which may provide a plurality of individually addressable slots for a plurality of measurement modules or cartridges, which may each be individually targeted for communication by the carrier. Additionally, the addressable backplane may be expandable, i.e., additional addressable backplanes may be coupled to the addressable backplane to provide additional slots for additional measurement modules.

In yet another embodiment, the RIO card or device may couple to a "DAQ in the cable", where a measurement module may be comprised in a cable connector. In other words, the features of a measurement module, as described above, may be included in one or both connectors of a cable which may be coupled to the RIO device or to a sensor/actuator, as desired.

Configuration Wizard

In one embodiment of the present invention, a configuration tool may be used to configure the RIO system. For example, the configuration tool may comprise one or more programs implementing a configuration wizard. The wizard may be operable to lead a user through the configuration process, receiving user input specifying the user requirements for the system, and generating a hardware configuration program for deployment on the RIO device. In one embodiment, the configuration tool (e.g., the wizard) may also be operable to deploy the hardware configuration program onto the RIO device.

In one embodiment, operations for creation and deployment of the hardware configuration program may occur on the customer or client computer system. The client computer system may be coupled to the RIO device and may store and execute a configuration wizard program to receive user input specifying or characterizing the system configuration. The wizard may then generate the hardware configuration program and deploy the hardware configuration program onto the RIO device (i.e., the FPGA 106 in the RIO device). The advantage to this approach is that the customer does not need to be connected to a vendor server. However, if software updates are required, for example, for backend tools or third party tools used in the process, it may be necessary to request the customer to perform the updates.

In another embodiment, a vendor may operate or host the configuration wizard on a server computer system, such as an e-commerce server, which may be accessible to users (i.e., customers) over a network, e.g., the Internet. The client computer system may be coupled to a server computer system over a network, such as the Internet. The configuration wizard program may be stored and executed on the server computer. Software executing on the client computer system (e.g., a browser program) may be used to access the server (i.e., the configuration wizard). The user may thereby engage the configuration wizard remotely to specify a configuration of the RIO system, and to download or deploy the resulting hardware configuration program generated by the configuration wizard onto the RIO device. In one embodiment, the vendor server may provide sales and purchasing services to the customer in addition to system configuration.

In one embodiment, the server program (configuration wizard) may present a graphical user interface (GUI) to the user on the client computer system 102 and receive input therefrom specifying user requirements for the system to be configured.

As described above, the RIO architecture provides a reconfigurable solution for adapting or customizing a measurement product to application requirements. There are several different approaches or support levels for performing the customization, each targeting a different class of users. For example, a basic support level may include providing precompiled hardware configurations from which the user may select a solution. This approach offers the least flexibility, but simplifies the choices that the user may consider. This approach may in many ways be considered a parameterized solution, in that the pre-defined nature of the hardware resources is very structured, with well defined acquisition modes and functionality.

In contrast, another embodiment of the invention offers very little pre-defined structure. This embodiment mixes program primitives (e.g., LabVIEW primitives) with low level I/O, and allows for the construction of timing, triggering, inline processing, and more. These building blocks can be pieced together to create the same functionality as the existing solutions, as well as much more capable operations. These blocks can often be combined in different ways to provide similar solutions, but one may be preferable to the other in terms of extensibility, resource utilization, etc. This approach offers the greatest flexibility, but requires a more sophisticated user.

In one embodiment, as mentioned above, a configuration wizard may bridge the gap between flexibility and ease of use. In one embodiment, the wizard may provide a drag and drop interface for creating the user defined RIO configuration. In another embodiment, the wizard may provide a menu and/or button based graphical interface for creating the user defined RIO configuration. In another embodiment, the wizard may provide a list of available resources, e.g., low level interface primitives such as AI, AO, and DIO, as well as a list of higher level functions that can be applied to these low-level primitives, including higher level interface functions such as counters built on top of DIO lines, or inline processing such as linearization or filtering for AI lines.

The user may select the resources required by an application, and configure any resources as necessary (for example, setting gain parameters on an analog input resource) using the configuration wizard. In one embodiment, the selections may be hierarchical, and may allow the user to add the higher level interface or inline processing in the same window. The user may then identify the timing and triggering requirements of the application, selecting from the resources identified/created in the previous step.

In each of these approaches a description file is preferably generated which uniquely identifies resources and features the user has selected. From this description file, G code (graphical code, i.e., National Instruments G graphical programming language) may be generated. HDL code may then be generated from the G code, and eventually a program binary file, i.e., a hardware configuration program, for the FPGA generated from the HDL code. In these approaches, caching schemes are preferably used so that the number of compilations may be minimized.

In one embodiment, specific features (as opposed to complete configurations) may be pre-compiled in such a way that they may be assembled or composed quickly into an appropriate configuration at the customer site. The advantage of this approach is that most of the relative placement and routing has been done up front, and so only a "quick" replacement and rerouting is needed to put the configuration together. In another embodiment of this approach, a set or library of complete configurations may be maintained and made available to the customer for a wide variety of applications. The user may select a best solution (i.e., configuration), then make modifications as needed.

Thus, in a preferred embodiment, one or more configuration wizards may generate graphical programs, e.g., LabVIEW diagrams based on customer entered requirements that are architecturally more scaleable to allow for changing customer requirements.

In one embodiment, typical applications may be grouped into a small number of classes. A wizard for each of these classes may be provided which queries the user about the application, then builds an appropriate LabVIEW diagram for the application. In one embodiment, there may be two aspect to this solution. The first is the definition of the classes and corresponding data structures. The second is the collection of wizards. In one embodiment, the wizards may use scripting, such as LabVIEW scripting, to generate the graphical programs or diagrams for each class of application.

Thus, representative diagrams of user applications, including timing, triggering, and data transfer to the host may be developed and grouped into classes. The different diagrams in a given class preferably have very similar structure. For example, a diagram for timed acquisition of analog input channels may look nearly identical to a diagram for timed acquisition of analog and digital input channels, even though it is possible to draw the diagrams very differently. A configuration wizard for each class may then be provided which may generate the appropriate graphical program in response to user input specifying a particular application or function.

In one embodiment, wizards may only include support for rudimentary functionality. In other words, wizards for basic acquisition, control loops, hardware in the loop testing, etc., may be provided. In another embodiment, the wizards may provide broad functionality in their respective areas of application. For example, in one embodiment, an acquisition wizard may only support pre- and post-triggering. In another embodiment, the acquisition wizard may also support external conversion, hardware gating, and other more advanced functionality.

Thus, the use of one or more configuration wizards may provide an easy to use interface which allows the user or customer to configure or construct custom configurations for a reconfigurable system (i.e., the programmable hardware element in a RIO system). More specifically, a wizard may provide the user access to configurable RIO functionality without the user having to be familiar with a particular development environment, such as LabVIEW.

Thus, the use of RIO devices in combination with a variety of platforms and computer systems provides a broad range of approaches for efficient and flexible measurement systems, including established platforms such as PCI/PXI and FieldPoint, USB/Ethernet devices, and small networked measurement nodes (e.g., smart sensors) for highly distributed measurement systems. Additionally, the adaptive (i.e., programmable) aspect of RIO systems in conjunction with measurement modules provides measurement and control solutions which may more accurately and efficiently match the measurement and control requirements of users. Finally, the use of graphical programs to configure the RIO hardware may greatly simply the configuration process.

BRIEF DESCRIPTION OF THE DRAWINGS

A better understanding of the present invention can be obtained when the following detailed description of the preferred embodiment is considered in conjunction with the following drawings, in which.

Figure 1:
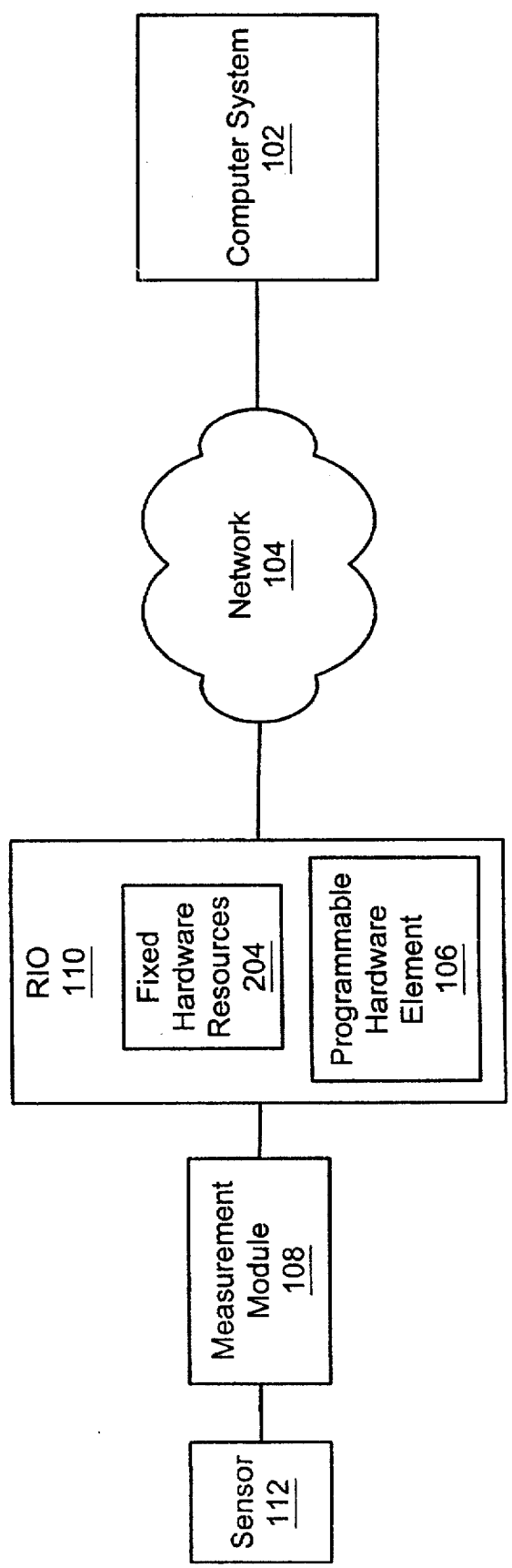
FIG. 1 is a block diagram of a networked RIO measurement system, according to one embodiment of the invention.

While the invention is susceptible to various modifications and alternative forms specific embodiments are shown by way of example in the drawings and will herein be described in detail. It should be understood however, that drawings and detailed description thereto are not intended to limit the invention to the particular form disclosed. But on the contrary the invention is to cover all modifications, equivalents and alternative following within the spirit and scope of the present invention as defined by the appended claims.

DETAILED DESCRIPTION OF THE EMBODIMENTS

Incorporation by Reference

The following U.S. Patents and patent applications are hereby incorporated by reference in their entirety as though fully and completely set forth herein.

U.S. Provisional Patent Application Ser. No. 60/312,252 titled "A Reconfigurable I/O Measurement System" filed Aug. 14, 2001, whose inventors were Brian Keith Odom, Joseph Peck, Hugo Andrade, Cary Paul Butler, James J. Truchard, Matt Novacek and Newton Petersen U.S. Provisional Patent Application Ser. No. 60/313,136 titled "Reconfigurable Measurement System Utilizing a Programmable Hardware Element" filed Aug. 17, 2001, whose inventors were Brian Keith Odom, Joseph Peck, Hugo Andrade, Cary Paul Butler, James J. Truchard, Matt Novacek and Newton Petersen U.S. patent application Ser. No. 09/229,695 titled "Reconfigurable Test System" filed on Jan. 13, 1999, whose inventors are Arthur Ryan, Hugo Andrade, and Brian Keith Odom, which is now U.S. Pat. No. 6,311,149.

U.S. Provisional Application Ser. No. 60/312,254 titled "Measurement System with Modular Measurement Modules That Convey Interface Information" filed on Aug. 14, 2001, whose inventors are Perry Steger, Garritt Foote, David Potter, and James J. Truchard.

U.S. patent application Ser. No. 06/312,242 titled "System and Method for Graphically Creating, Deploying and Executing Programs in a Distributed System" filed on Aug. 14, 2001, whose inventors are Jeffrey L. Kodosky, Darshan Shah, and Steven W. Rogers.

U.S. Provisional Application Ser. No. 60/312,359 titled "System and Method for Online Configuration of a Measurement System" filed on Aug. 15, 2001, whose inventors are Brian Sierer, Ganesh Ranganathan, Joseph Peck and Hugo Andrade.

U.S. patent application Ser. No. 09/891,571 titled "System and Method for Configuring an Instrument to Perform Measurement Functions Utilizing Conversion of Graphical Programs into Hardware Implementations" filed on Jun. 25, 2001, whose inventors are Jeffrey L. Kodosky, Hugo Andrade, Brian Keith Odom, Cary Paul Butler, and Kevin L. Schultz.

U.S. patent application Ser. No. 09/745,023 titled "System and Method for Programmatically Generating a Graphical Program in Response to Program Information," filed Dec. 20, 2000, whose inventors are Ram Kudukoli, Robert Dye, Paul F. Austin, Lothar Wenzel and Jeffrey L. Kodosky.

U.S. patent application Ser. No. 09/595,003 titled "System and Method for Automatically Generating a Graphical Program to Implement a Prototype", filed Jun. 13, 2000, whose inventors are Nicolas Vazquez, Jeffrey L. Kodosky, Ram Kudukoli, Kevin L. Schultz, Dinesh Nair, and Christophe Caltagirone.

U.S. patent application Ser. No. 09/886,455 titled "System and Method for Programmatically Generating a Graphical Program in Response to User Input", filed Jun. 20, 2001, whose inventors are Jeffrey D. Washington, Ram Kudukoli, Robert E. Dye and Paul F. Austin.

U.S. Pat. No. 4,914,568 titled "Graphical System for Modeling a Process and Associated Method," which issued on Apr. 3, 1990, whose inventors are Jeffrey L. Kodosky, James J. Truchard, and John E. MacCrisken.

U.S. Pat. No. 6,138,270 titled "System, Method and Memory Medium for Detecting Differences Between Graphical Programs," which issued on Oct. 24, 2000, and whose inventor is Ray Hsu.

U.S. Pat. No. 6,219,628 titled "System and Method for Converting Graphical Programs Into Hardware Implementations", which issued on Apr. 17, 2001, whose inventors are Jeffrey L. Kodosky, Hugo Andrade, Brian Keith Odom and Cary Paul Butler.

U.S. Pat. No. 6,173,438 titled "Embedded Graphical Programming System" filed Aug. 18, 1997, whose inventors are Jeffrey L. Kodosky, Darshan Shah, Samson DeKey, and Steve Rogers.

As used herein, the term "measurement device" is intended to include instruments, smart sensors, data acquisition devices or boards, and any of various types of devices that are operable to acquire and/or store data. A measurement device may also optionally be further operable to analyze or process the acquired or stored data. Examples of a measurement device include an instrument, such as a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. It is also contemplated that RIO technology as described herein may be used in control/automation and simulation systems.

Exemplary instruments include oscilloscopes, multimeters, spectroscopes, and any measurement, test, or automation instrument. A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

As used herein, the term "programmable hardware element" is intended to include various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. The programmable hardware element may also be referred to as a "reconfigurable core".

As used herein, the term "hardware configuration program" refers to any type of program, e.g., a netlist or bit file, that can be used to program or configure a programmable hardware element.

As used herein, the term "fixed hardware resources" includes hardware resources that have pre-defined functionality. Fixed hardware resources may have some programmable parameters. Examples of fixed hardware include physical I/O resources such as analog to digital converters (ADCs), digital to analog converters (DACs), and digital lines, among others. For example, in the case of a analog input comprising an ADC and a programmable gain stage, the gain parameter of the gain stage may be adjustable or configurable programmatically by the FPGA.

As used herein, the terms "data processing" and "data analysis" are used to refer to the processing of data to extract useful information from the data (such as an image) or determine characteristics of the data (or to determine characteristics of one or more objects represented by the data). The term "data processing function" may also include an operation or decision that is performed in response to the information extracted or characteristics determined from the data, i.e., a control function. The term "data processing function" is also intended to include a data processing (or control) algorithm that combines a sequence of two or more data processing functions or tools and/or decision operations that process a data in a desired way or which implement a data processing, control, or machine vision application, such as part inspection, automated assembly, data analysis, pattern matching, edge detection, alarm, logging, etc.

The term "measurement function" may include measurement and/or control functions, such as acquiring data, conditioning data, logging data, displaying data, analyzing and/or processing received data to generate a result, performing signal processing on received data, or otherwise analyzing and/or processing received data to perform a measurement. More specifically, a measurement function may include one or more of signal acquisition, signal conditioning, signal conversion, and measurement analysis. Examples of measurement functions include various instrumentation functions or control functions, including machine vision, image processing and motion control, among others.

The term "machine vision function" or "image processing function" includes tools such as edge detection, blob analysis, pattern matching, filtering, pixel transformations, and other image processing functions. The term "image processing" is used herein to refer to both "image processing" and "machine vision", to the extent these terms have different meanings.

In the present application, the term "graphical program" or "block diagram" is intended to include a program comprising graphical code, e.g., two or more nodes or icons interconnected in one or more of a data flow, control flow, or execution flow format, (and/or a "signal flow" format, which is considered a subset of data flow), where the interconnected nodes or icons may visually indicate the functionality of the program. Thus the terms "graphical program" or "block diagram" are each intended to include a program comprising a plurality of interconnected nodes or icons which visually indicate the functionality of the program. A graphical program may comprise a block diagram and may also include a user interface portion or front panel portion. The user interface portion may be contained in the block diagram or may be contained in one or more separate panels or windows. A graphical program may be created using any of various types of systems which are used to develop or create graphical code or graphical programs, including LabVIEW, DASYLab, and DiaDem from National Instruments, Agilent VEE (Visual Engineering Environment), Snap-Master by HEM Data Corporation, SoftWIRE from Measurement Computing, ObjectBench by SES (Scientific and Engineering Software), Simulink from The MathWorks, WiT from Coreco, Vision Program Manager from PPT Vision, Hypersignal, VisiDAQ, VisSim, and Khoros, among others. In the preferred embodiment, the system uses the LabVEEW graphical programming system available from National Instruments. Thus, in one embodiment, development tools typically used for software development may be used to configure hardware, i.e., the programmable hardware element.

In the present application, the term "program" may include a graphical program as described herein, a program developed in a textual-based programming language, such as C, C++, Basic, Fortran, Pascal, Java, etc., and programs developed in hardware description languages, such as VHDL, Verilog, or system description languages, such as SystemC.

In the present application, the term "measurement program" may include a program that performs a measurement function as described herein.

As used herein, the term "memory medium" includes a non-volatile medium, e.g., a magnetic media or hard disk, or optical storage; a volatile medium, such as computer system memory, e.g., random access memory (RAM) such as DRAM, SRAM, EDO RAM, RAMBUS RAM, DR DRAM, etc.; or an installation medium, such as a CD-ROM or floppy disks 104, on which the computer programs according to the present invention may be stored for loading into the computer system. The term "memory medium" may also include other types of memory or combinations thereof.

As used herein, the term "processor" includes a CPU (microprocessor or microcontroller), DSP, reconfigurable processor, or a hardcore or softcore inside an FPGA.

RIO Overview

The Reconfigurable Input/Output (RIO) architecture may be considered a template or pattern/platform for a reconfigurable measurement (including data acquisition), control (including automation) and/or simulation system, in which software and hardware components, as well as configuration and runtime behaviors, are defined. As used herein, the term "reconfigurable I/O" or "RIO" refers to a device, (e.g., a card) which includes at least one programmable hardware element. In simple terms, a RIO card or unit contains at least one programmable hardware element, i.e., a reconfigurable core, such as a field programmable gate array (FPGA), which may be surrounded by fixed hardware resources (e.g., I/O resources) (both on-board and off-board, e.g. measurement modules). The behavior of the reconfigurable core can be configured to better match the requirements of the measurement and/or control system. In an exemplary embodiment, the system may be implemented as an FPGA that is targeted by a development system, such as National Instrument LabVIEW or LabVIEW FPGA. Other embodiments are also contemplated, e.g., an embodiment which includes an addition of a microprocessor to the FPGA core.

Thus, the reconfigurable core (programmable hardware element) is the basis for RIO. This scaleable resource may include such functions as I/O interfacing, timing and triggering, inline processing, and embedded decision-making. Fixed hardware resources may be connected at the boundary of the reconfigurable core, and may typically provide one of four types of functionality:

1) a control and data path to a host computer;
2) an I/O interface to external systems;
3) optimized hardware elements; and
4) basic operating services.

These resources by themselves may not define the measurement and/or control system, but rather are the low-level building blocks for the creation of the system. The configuration or program (the hardware configuration program) in the reconfigurable core (e.g., the FPGA) builds on these blocks to define the system.

The interface at the boundary of the reconfigurable core provides RIO with a very flexible mechanism for connecting to the fixed resources. The fundamental interface at this boundary may comprise digital and/or analog pins, and the ability of RIO to organize and build on these pins in a hierarchical method is an important capability. RIO allows pins to be grouped into ports that perform specific interfacing functionality. For example, 4 digital pins may be associated with a fixed serial ADC, and together may be considered an interface port. A simpler example is a single digital pin defined as a 1-bit DIO port. The grouping at this level defines the most basic interface to each of the fixed resources.

These low-level ports can be further grouped to provide more advanced functionality. This functionality may include the creation of higher capability interfacing logic, such as counters built on top of several individual DIO ports, or the addition of logic to an interface, such as a digital filter placed inline with an ADC interface. This hierarchy of groups is not limited to one level, and may be arbitrarily deep.

It is important to note that RIO is not limited to digital only solutions. Other embodiments include reconfigurable digital and analog circuitry. The grouping and connecting of "logic" in the FPGA may also include reconfigurable analog building blocks that can be configured to perform user defined analog functionality, such as, for example, an uncommon ADC with 11 bits of resolution with an integrated analog low pass filter.

The concept of grouping pins also applies to communication mechanisms for RIO, such as for communicating with a host computer. The low-level grouping defines a physical interface which may connect to buses or interface chips implementing PCI, USB, IEEE-1394, Ethernet, etc. The creation of read and write registers on top of the physical interface may implement the actual communication. The use of these registers is application dependent, but their method of access may be generic.

Control and data paths (1) and the I/O interface (2) above are very similar in concept, but specific to the type of interface they are implementing and communicating with. As described in 3) above, communication paths may take advantage of optimized hardware elements. For example, to communicate with the host a hardwired PCI interface (e.g., National Instruments minMITE) may be utilized. If extraordinary FFT performance is desired or required, application specific integrated circuits (ASICs), specialized DSPs, or other FPGAs implementing Fast Fourier Transforms (FFT) may be used.

The operating services of 4) above may refer to external (or internal) blocks that provide basic services to the reconfigurable core, e.g., a basic clock reference (internal and external (system)), a reconfiguration path (from host or persistent store), and a persistent store. It can also include basic standard debugging interfaces, and connectivity to RAM, among other services.

In addition to the creation of user specific I/O interfaces, RIO may provide for the timing and triggering of these interfaces, allowing for very flexible relationships between resources. For example, the user may configure one group of I/O to be sampled at one rate, and another group at a completely independent rate. This same flexibility may apply to starting, stopping, pausing, etc. of I/O operations.

Another possible use of the reconfigurable core is to provide processing. The inclusion of decision making capabilities in the hardware may be useful at all levels of the measurement and/or control system. For example, decision logic on the programmable hardware element may be used to transform signals, such as converting quadrature signals into count and up/down controls for a counter, for inline processing, such as adding linearization to an analog input data stream, for creating complicated trigger sequences, such as state based triggering for bus analyzers, and for high-speed control loops, such as PID. This decision-making capability may provide wide flexibility to many applications, and in some cases may allow the application to run autonomously in the FPGA without any host computer interaction.

Yet another possible use of the programmable hardware element is to implement any of a variety of interfaces for communicating with a measurement module. In other words, the RIO device may be operable to be programmed with an interface protocol which is specific to a given measurement module. In addition, this programming may occur dynamically and/or automatically, such as upon connection to the module. These and other embodiments of the invention are described in detail below.

A RIO device as described herein may be capable of being configured or programmed (in hardware) to perform any of a variety of measurement, control, and/or simulation tasks, i.e., to assume the properties in hardware of various devices or configurations of devices, as well as measurement and/or control functions. A RIO device may be used to perform any of various types of hardware operations in any of various applications.

Exemplary applications targeted by RIO include, but are not limited to, measurement and data acquisition, embedded I/O and machine control, high-speed analog control loops, high density discrete control, hardware in the loop simulation, and applications requiring custom hardware triggering and/or digital logic, among others. In general, RIO may be particularly suitable for developing simple hardware functionality which is difficult to express in fixed hardware resources, including complex triggering, quadrature encoding, simple bit transfers, and the like, as well as hardware based interlocks, simple control algorithms, e.g., PID (proportional integral derivative), and simple measurements, DSP, rise time, fall time, RMS (root mean square), FIR (finite impulse response) filters, and period measurement, among others, although it is noted that RIO may be used for any other hardware development as well.

FIG. 1—Block Diagram of a RIO Measurement System

FIG. 1 is a block diagram of a RIO measurement system, according to an embodiment of the invention. As FIG. 1 shows, sensor 112 may optionally be coupled to a measurement module 108, described above, which may in turn be coupled to a RIO unit or RIO device, also referred to as a RIO 110. The RIO 110 may be coupled to computer system 102 via transmission medium 104, e.g., the Internet. Alternatively, the sensor 112 may couple directly to the RIO device 110, and measurement module 108 may not be included.

In the embodiment where the sensor 112 couples directly to the RIO device 110 (i.e., where there is no measurement module), the RIO device 110 may be operable to perform any necessary signal conditioning and/or signal conversion on the signals sent by the sensor 112. Alternatively, signal conditioning and/or signal conversion may not be necessary. The RIO device 110 may then perform analysis or other data processing on the signals, and send results of the analysis to the computer system 102 or another device. The RIO device 110 may also perform analysis and generate real time control signals to a process or system being controlled.

The measurement module 108 and the RIO unit (carrier) 110 together may provide the functionality of the RIO measurement device 110 of FIG. 1. For example, in one embodiment, the measurement module 108 may be operable to perform signal conditioning and/or signal conversion on the signals sent by the sensor 112, and to transmit results of such processing on to the RIO 110. In this embodiment, the measurement module 108 may include one or more fixed hardware resources used by the programmable hardware element on the RIO 110. In one embodiment, the RIO 110 may be operable to receive data from the measurement module 108, perform a function on the data, and communicate the data (possibly in a different format or form) to the computer system 102, e.g., over the transmission medium 104. For example, the RIO 110 may receive signal data in a proprietary format from the measurement module 108 and format the data for transmission over wireless Ethernet to the computer system 102.

The host computer 102 may comprise a CPU, a display screen, memory, and one or more input devices such as a mouse or keyboard as shown. The computer 102 may be used to configure or program the RIO measurement device 110, as described below. Additionally, the computer 102 may operate with the measurement device 110 to analyze or measure data from the sensor 112 and/or measurement device 110 or to control the sensor 112 and/or measurement device 110.

In one embodiment, the computer system 102 may store an application development environment (ADE) for creating programs. The ADE may include specific functionality for creating programs that are to be deployed on a RIO device 110. The ADE may also include specific functionality for a certain type of application, such as measurement, control, or automation, among others.

The computer system may also store a program implementing a function. For example, the computer system may store a program implementing one or more measurement functions, i.e., a measurement program, e.g., a program, such as a graphical program, implementing the one or more measurement functions.

The computer system 102 may be operable to execute the measurement program to perform the one or more measurement functions, preferably in conjunction with operation of the RIO 110 and/or measurement module 108. For example, the measurement program may be executable to perform one or more measurement and/or control functions, including analysis of data or signals received from the RIO 110, control of RIO and/or measurement module operations, user interface functions, and pattern recognition and/or characterization, among others.

The computer system 102 may store a deployment program which is executable to generate a hardware configuration program based on a program generated by the ADE. The deployment program may be part of the ADE. The deployment program may also be executable to transfer or deploy the hardware configuration program onto a programmable hardware element (or multiple programmable hardware elements) of a RIO device 110.

In the preferred embodiment, the RIO 110 includes at least one programmable hardware element 106, which may be programmed by computer system 102. In one embodiment, the RIO 110 may include a plurality of programmable hardware elements 106. The computer system 102 may also couple to multiple RIO units 110, wherein each RIO unit 110 includes one or more programmable hardware elements 106.

For example, the computer system 102 may couple to multiple RIO units 110, wherein the RIO units 110 may be distributed in various locations on a network (such as the Internet).

Where the RIO unit 110 includes a plurality of programmable hardware elements 106, the computer system 102 may be operable to transfer or deploy a hardware configuration program onto one or more (or all) of the plurality of programmable hardware elements of the RIO device 110. Thus the hardware configuration program may be generated and/or deployed in a manner to distribute the hardware configuration program across multiple programmable hardware elements 106. The hardware configuration program may also be generated and/or deployed in a manner to distribute the hardware configuration program across multiple RIO devices 110, wherein each RIO device may include one or more programmable hardware elements 106.

In one embodiment, the RIO device 110 may include one or more fixed hardware resources 204. Fixed hardware resources 204 may also be located external to the RIO device 110, such as the measurement module 108, or on the sensor 112. A deployed hardware configuration program on the RIO device 110 may be operable to invoke functionality of one or more of the hardware resources 204. A user may specify use of fixed hardware resources 204 when creating the program using the ADE. Alternatively, or in addition, the deployment program may automatically specify use of fixed hardware resources.

Thus, the RIO unit(s) 11 may be reconfigurable, i.e., programmable by an external computer system, such as computer system 102. More specifically, the computer system may be operable to deploy the measurement program onto the programmable hardware element(s) of the RIO unit(s) 110. In other words the computer system 102 may download the measurement program onto the programmable hardware element of the RIO 110, after which the RIO 110 may be operable to execute the measurement program to perform the one or more measurement and/or control functions.

After a measurement program has been deployed as a hardware configuration program onto the programmable hardware element of the RIO 110, the RIO may operate in a stand-alone fashion to perform the measurement function. For example, the RIO unit may be disconnected from the computer system 102 or from the network to which it is attached, and the RIO 110 may be used to perform the measurement function as a stand-alone device. Alternatively, the RIO device 110 may optionally operate in conjunction with operation of the measurement module 108, and possibly the computer system 102, as well as other devices, such as other RIOs 110, smart sensors, networked devices, etc. The configured RIO 110 and the measurement module 108 may thus be operable to perform measurement (i.e., data acquisition and/or control) operations using the sensor 112 and/or the computer system 102. More generally, a measurement function may be distributed across multiple devices, such as one or more RIO units 110, one or more sensors (such as smart sensors), one or more measurement modules, one or more computer systems, and/or one or more instruments or other devices.

In one embodiment, the RIO unit 110 may be operable to receive interface protocol information from the measurement module 108 specifying how to operate or interface with the measurement module 108. The RIO unit 110 may then communicate the interface protocol information to the computer system 102. Alternatively, the measurement module 108 may communicate the interface protocol information directly to the computer system 102. Based on the interface protocol information, the computer system 102 may program or configure the programmable hardware element 106 on the RIO unit 110 to implement the interface as specified by the measurement module 108. In other words, the measurement module 108 may tell the RIO 110 how to "talk" with it, and the RIO 110 may then tell the computer system 102 how to program the RIO 110 to communicate with the measurement module 108 accordingly (or the measurement module 108 may tell the computer system 102 directly how to program the RIO 110 (i.e., the RIO's programmable hardware element 106). The computer system 102 may then program the RIO 110 (i.e., the RIO's programmable hardware element 106), thereby implementing the interface specified in the interface protocol information communicated by the measurement module 108. This process may be referred to as initialization of the measurement module/RIO. Further details of this process are described below.

In one embodiment, the RIO device 110 may include an IP address and web server capabilities. Thus the RIO device 110 may be able to publish received signals or measurement data over the Internet. The RIO device 110 may similarly be operable to receive signal data over the Internet for processing. In another embodiment, one or more measurement cartridges 108 and/or sensors 112 coupled to the RIO device 110 may have an IP address and web server capabilities, and thus may be able to communicate with remote systems over the Internet, for example, to stream sensor data (e.g., numerical data or images) to a website for access by other systems or users.

The computer 102 may include a memory medium on which computer programs, according to the present invention may be stored. The memory medium may be comprised in the computer 102 where the programs are executed or may be located on a second computer which is coupled to the computer 102 through a network, such as a local area network (LAN), a wide area network (WAN), or the Internet. In this instance, the second computer operates to provide the program instructions through the network to the computer 102 for execution. Also, the computer system 102 may take various forms, including a personal computer system, mainframe computer system, workstation, network appliance, Internet appliance, personal digital assistant (PDA), television set-top box, instrument, or other device. In general, the term "computer system" can be broadly defined to encompass any device having at least one processor which executes instructions from a memory medium.

Thus, programs of the present invention may be stored in a memory medium of the respective computer 102, or in a memory medium of another computer, and executed by the CPU. The CPU executing code and data from the memory medium thus comprises a means for deploying a graphical program onto a RIO device 110 according to the steps described below.

The memory medium may store an ADE for creating programs having a desired functionality, wherein these programs are convertible to a hardware configuration program that can be deployed to a RIO device 110. Deployment may be performed by converting at least a portion of a program into a form for configuring or programming a programmable hardware element. In alternate embodiments, deployment may be performed by transferring the program to execute natively on a processor, or by converting the program to a different form and transferring the converted program for execution by a processor and memory. The RIO device 110 in FIG. 1 may be controlled by or configured by programs which are deployed or downloaded to the programmable hardware element on the RIO device 110. In various embodiments, the program deployed on the RIO device 110 may be any of various types, such as programs created in graphical languages, text-based programming languages, or hardware description languages, etc.

With respect to the ADE for creating the program to be deployed onto the RIO device 110, input to the ADE may be textual, graphical, a hardware description language, may be through a configuration environment (e.g., a wizard) or an API structural description.

In one embodiment, the memory medium may store a graphical programming development system for developing graphical programs. The memory medium may also store one or more deployment computer programs which are executable to deploy a program such as a graphical program.

As described below, in one embodiment the graphical program may be deployed by either one or more of: 1) converting the graphical program (or a portion thereof) into a hardware implementation (hardware configuration program) and configuring the programmable hardware element with this hardware implementation, 2) transferring a first portion of the graphical program (or a portion thereof) to a memory for execution by a processor (where the memory and processor are on the RIO device 110 or the computer system 102), wherein the processor may execute a graphical program execution engine and optionally a real time operating system), and deploying a second portion of the graphical program as a hardware configuration program on a programmable hardware element (e.g., a RIO device with mixed LabVIEW RT (Real Time) and LabVIEW FPGA execution); or 3) compiling a first portion of the graphical program (or a portion thereof) into an executable program and transferring the executable program to a memory for execution by a processor (where the memory and processor are on the RIO device 110 or the computer system 102), (where the processor may optionally execute a real time operating system), and deploying a second portion of the graphical program as a hardware configuration program on a programmable hardware element.

FIGS. 1A–1D—Various Embodiments of a RIO System

FIGS. 1A–1D illustrate various exemplary embodiments of a RIO system 110. The examples presented are meant to be illustrative only, and are not intended to limit the particular form or composition of the system.

Figure 1A:
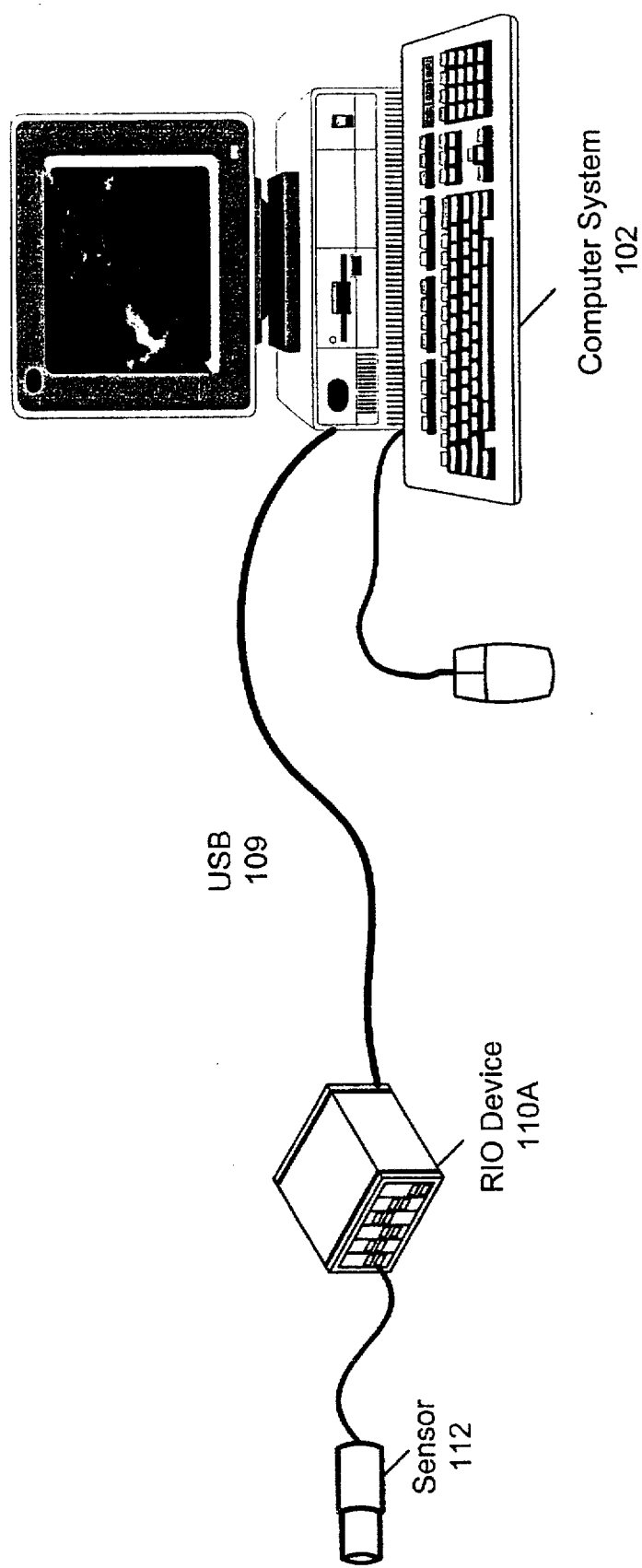
FIGS. 1A–1E illustrate various embodiments of a RIO system.

FIG. 1A illustrates a computer system 102 coupled to a RIO measurement or control device 110A according to one embodiment. As FIG. 1A shows, the computer system 102 may couple to the RIO measurement device 110A through a transmission medium, e.g., a serial bus, such as a USB 109. It should be noted that although a USB 109 is shown in this example, any other transmission medium may be used, including Ethernet, wireless media such as IEEE 802.11 (Wireless Ethernet) or Bluetooth, a network, such as a fieldbus, a Control Area Network (CAN) or the Internet, serial or parallel buses, or other transmission means.

As FIG. 1A shows, the RIO measurement device 110A may in turn couple to or comprise a sensor or actuator 112, such as a pressure or temperature gauge, a thermocouple, an imaging device (e.g., a camera), or any other type of sensor or actuator.

Figure 1B:
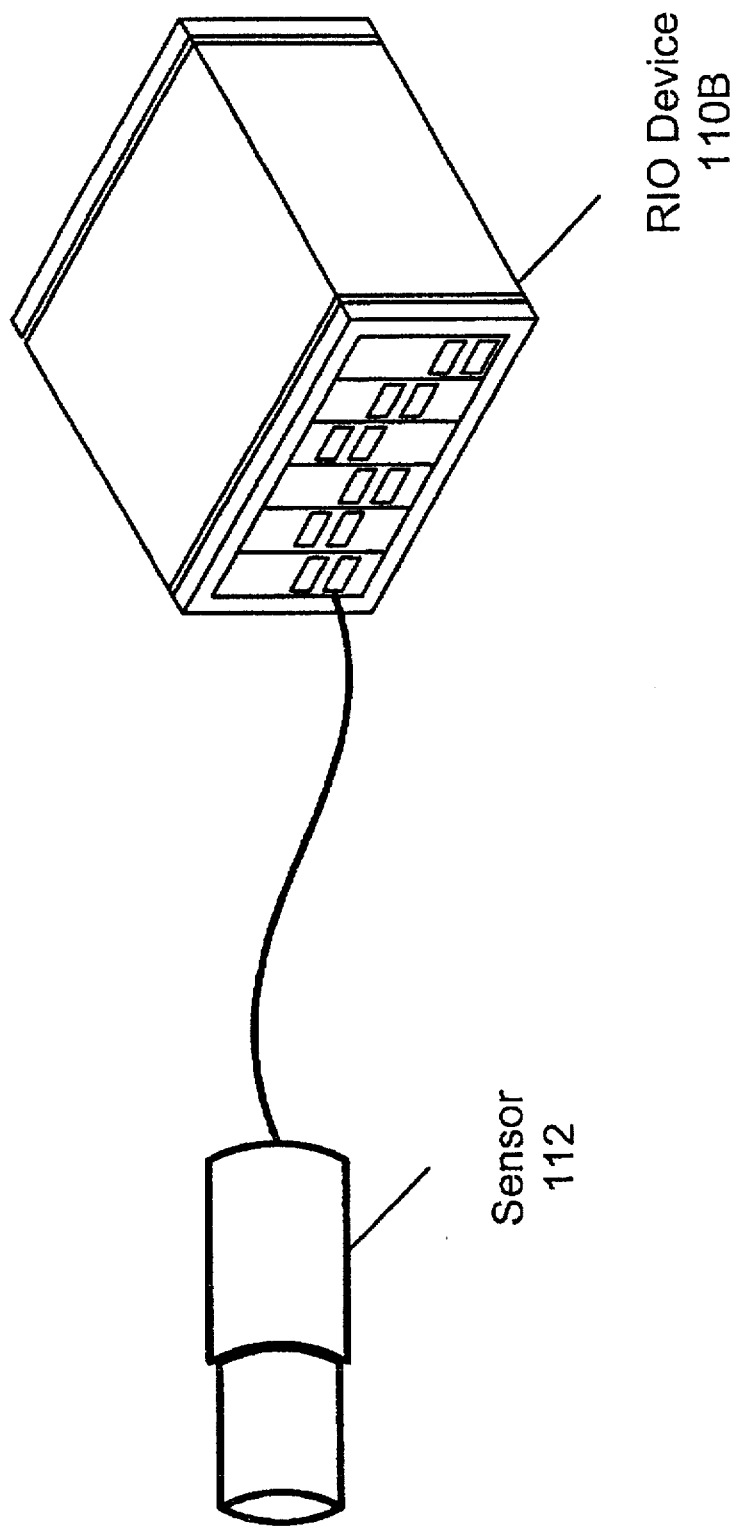

FIG. 1B illustrates a RIO system which comprises a RIO device 110B coupled to sensor 112. As shown in FIG. 1B, this RIO system does not include the computer system 102. Thus, the RIO device 110B may be operable to function independently of the computer system 102 of FIGS. 1 and 1A. As may be seen, the RIO device 110B may comprise a chassis having slots for one or more measurement modules. The measurement modules may be operable to perform one or more measurement, processing or control functions as described below. Each measurement module may perform various measurement and/or control functions, including data acquisition, signal conditioning, ADC, microprocessor, and optional isolation functions for sensor to digital operations. In one embodiment, the RIO device 110B may include a module 108 comprising a computer on a card, i.e., the functions of the computer system 102 may be performed by a module 108 comprised in a slot on the RIO device 110B.

The programmable hardware element 106 and the fixed hardware resources 204 of the RIO device 110 may be comprised in the chassis, or may both be comprised on one or more of the measurement modules 108. In one embodiment, the programmable hardware element 106 may be comprised in the chassis, and the fixed hardware resources 204 may be comprised on one or more measurement modules 108, or the fixed hardware resources 204 may be comprised in the chassis and in various ones of the measurement modules 108.

In one embodiment, the RIO measurement device 110B may include, in addition to the programmable hardware element 106 (e.g., the FPGA) and fixed hardware resources 204, a memory, such as a non-volatile memory or EEPROM, which may store a hardware configuration usable to program the FPGA.

In an embodiment where the RIO 110B implements an interface for communicating with a measurement module 108, an EEPROM 288 may contain an Electronic Data Sheet (EDS), defined by IEEE 1451.2, and an optional calibration history.

IEEE 1451.2 defines an interface between transducers and microprocessors useful in industrial automation and other fields. The standard defines a physical interface comprising a data transport serial link, in addition to triggering, interrupt and hot swap signaling. The standard also defines a transducer electronic data sheet, TEDS, that describes the functionality of the transducer in machine-readable form. The interface supports as many as 255 independent transducer channels. These may be accessed individually or as a unit. The standard may be used to implement a variety of measurement functions.

Figure 1C:
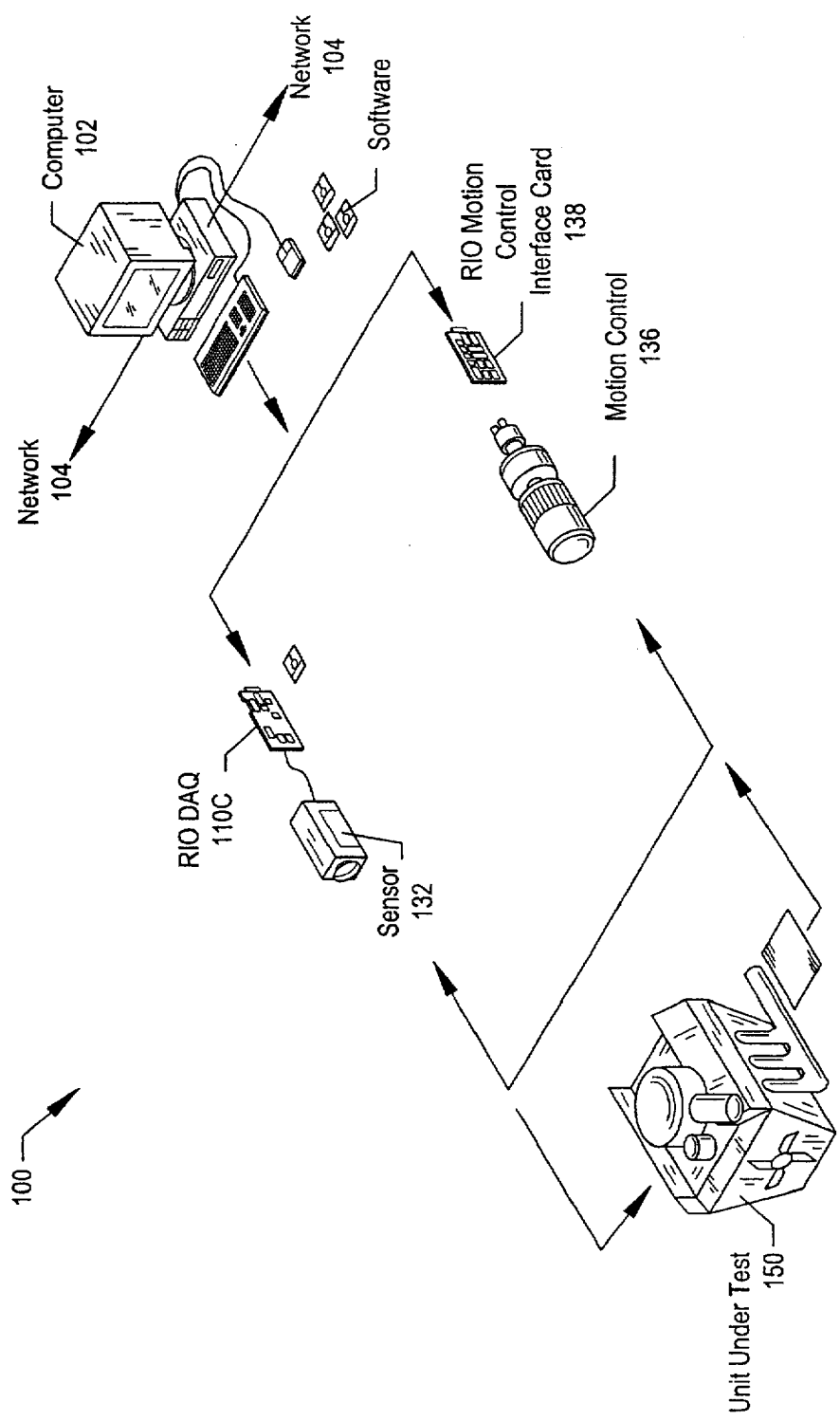

FIG. 1C illustrates a host computer system 102 coupled to a RIO measurement device 110C. FIG. 1C illustrates an exemplary measurement, control, or machine vision system 102. As FIG. 1C shows, the measurement device 110C may be a RIO device. The motion control interface 138 may also be a RIO Device. The measurement device 110C may in turn couple to or comprise a sensor, such as camera 132. The motion control interface 138 may in turn couple to a motion control unit 136.

The measurement device 110C may include a programmable hardware element for performing measurement and/or control functions as described below. The motion control interface 138 may also include a programmable hardware element 106 and one or more fixed hardware resources 204 for performing measurement and/or control functions as described below.

In one embodiment, the device 110C may not be present, and the sensor 132 may be a smart sensor which is or comprises a RIO device (e.g., a smart camera which is or comprises a RIO device 110). In another embodiment, the device 138 may not be present, and the motion control unit 136 may be a smart motion control device which is or comprises a RIO device.

The host computer 102 may comprise a CPU, a display screen, memory, and one or more input devices such as a mouse or keyboard as shown. The computer 102 may operate with the measurement device to analyze, measure or control a device or process 150. Alternatively, the computer 102 may be used only to configure the programmable hardware element in the measurement device 110C.

As shown, a sensor device or camera 132 may be coupled to the computer 102 via the measurement device or card 110C. The camera 132 and/or measurement device 110C may couple to the computer 102 through a serial bus, a network, or through other means. The motion control unit 136 and the RIO motion control interface 138 may also couple to the computer 102 through any means.

The measurement/control system 100 may be used in a manufacturing assembly, test, measurement, and/or control application, among others. For illustration purposes, a unit under test (UUT) 150 is shown which may be positioned by a motion control device 136 (and interface card 138), and imaged and analyzed by the camera 132 and measurement device 110C. It is noted that in various other embodiments the UUT 150 may comprise a process or system to be measured and/or analyzed.

Figure 1D:
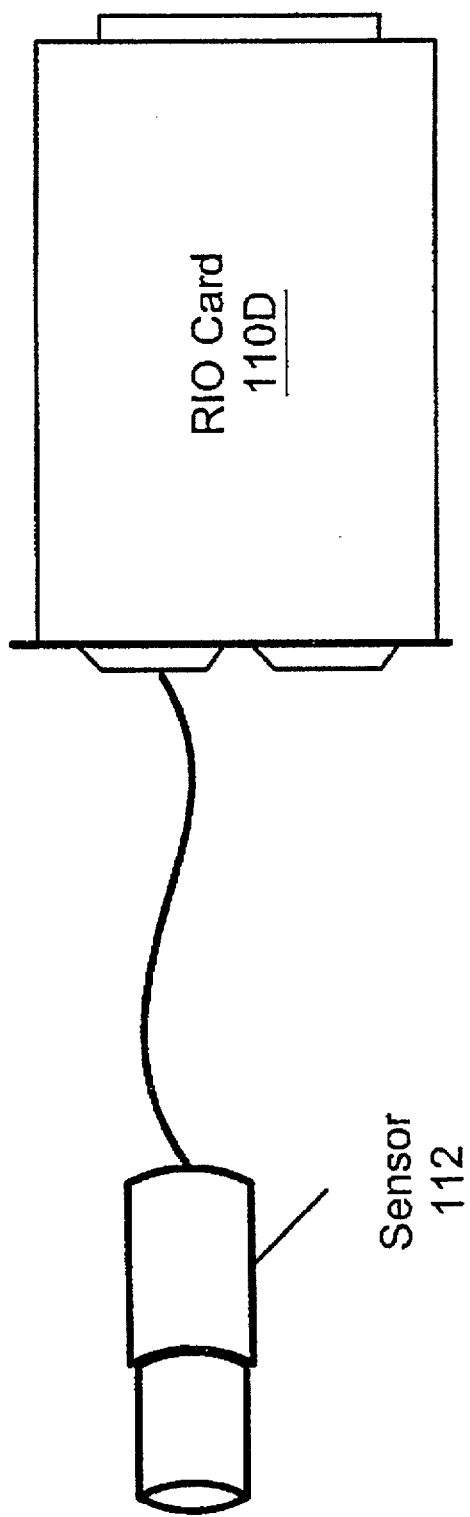

FIG. 1D illustrates an embodiment of a RIO system comprising a RIO card 110D coupled to sensor 112 through the card I/O connections. In this embodiment, the RIO card 110D may be coupled to a computer system for initialization/configuration then decoupled 102 and used independently from the computer system 102. For example, the configured RIO card 110D may be bolted or coupled to another device, e.g., a motion control device, or any other device or system.

Figure 1E:
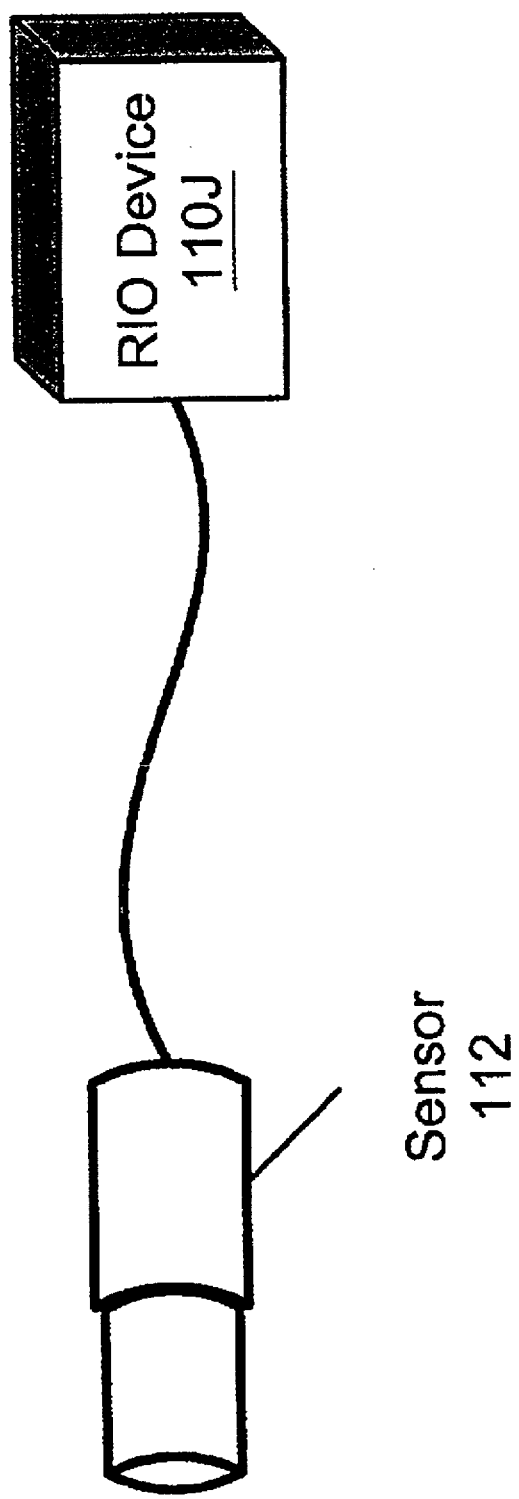

FIG. 1E illustrates an embodiment of a RIO device 110J implemented as a small form factor device which includes a programmable hardware element, one or more fixed hardware resources, an optional processor and memory, and an interface, such as an Ethernet, Internet, USB, FireWire, or other interface. For example, the RIO device 110J may be comprised in a small standalone device (e.g., a device with dimensions less than about 2" by 2" by 1"), a smart camera, a motion control device, wireless and wired telephones, network devices, a cable connector, a pacemaker, an I/O device, a PDA, artificial limbs, musical instruments, home appliances, surveillance devices, satellites, etc.

Thus, the RIO device 110J may assume a variety of forms and functionality, depending upon the particular application requirements. Other embodiments also contemplated are described below.

Figure 2A:
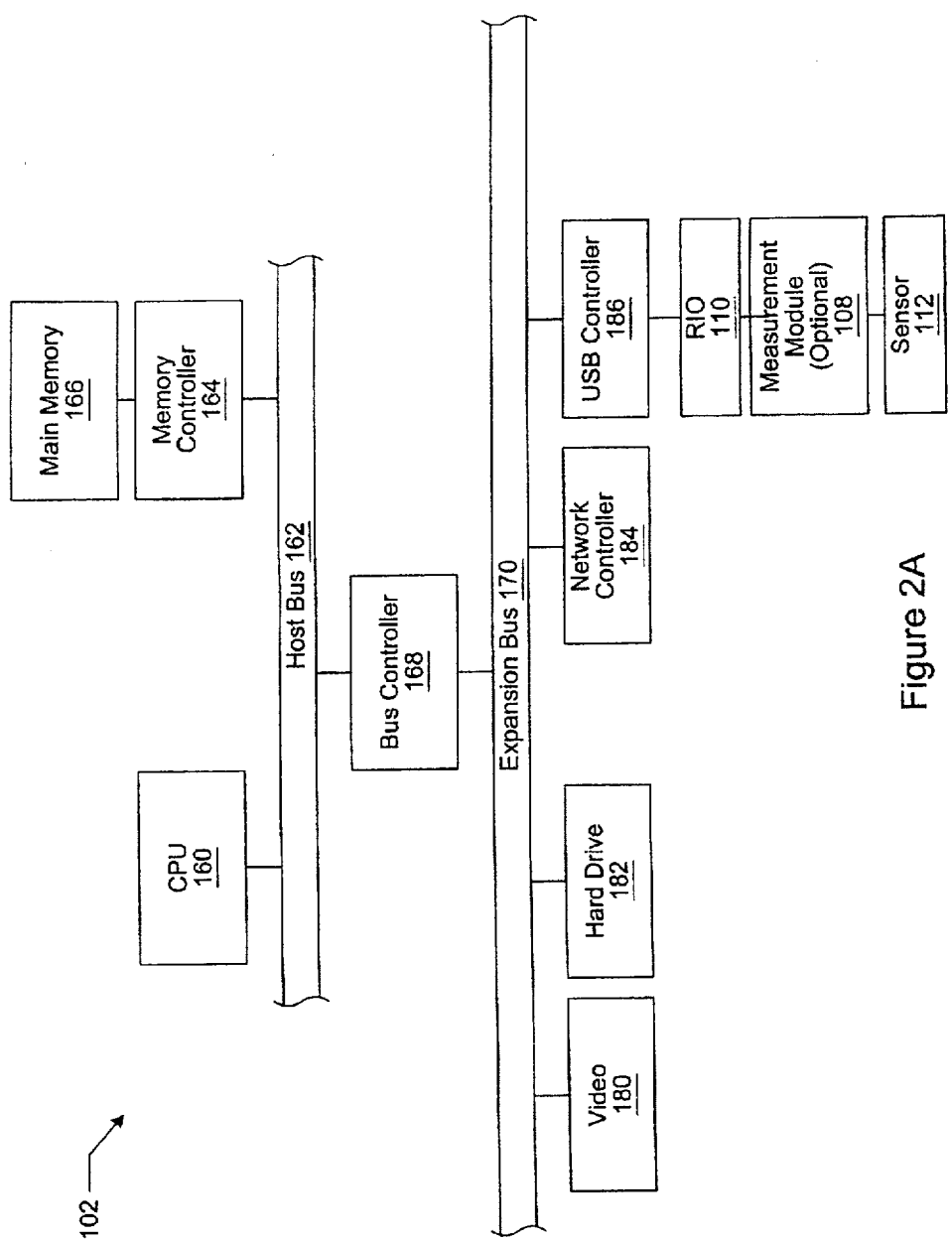
FIGS. 2A and 2B are block diagrams representative of the computer systems of FIGS. 1A, 1B, and 1C.
Figure 2B:
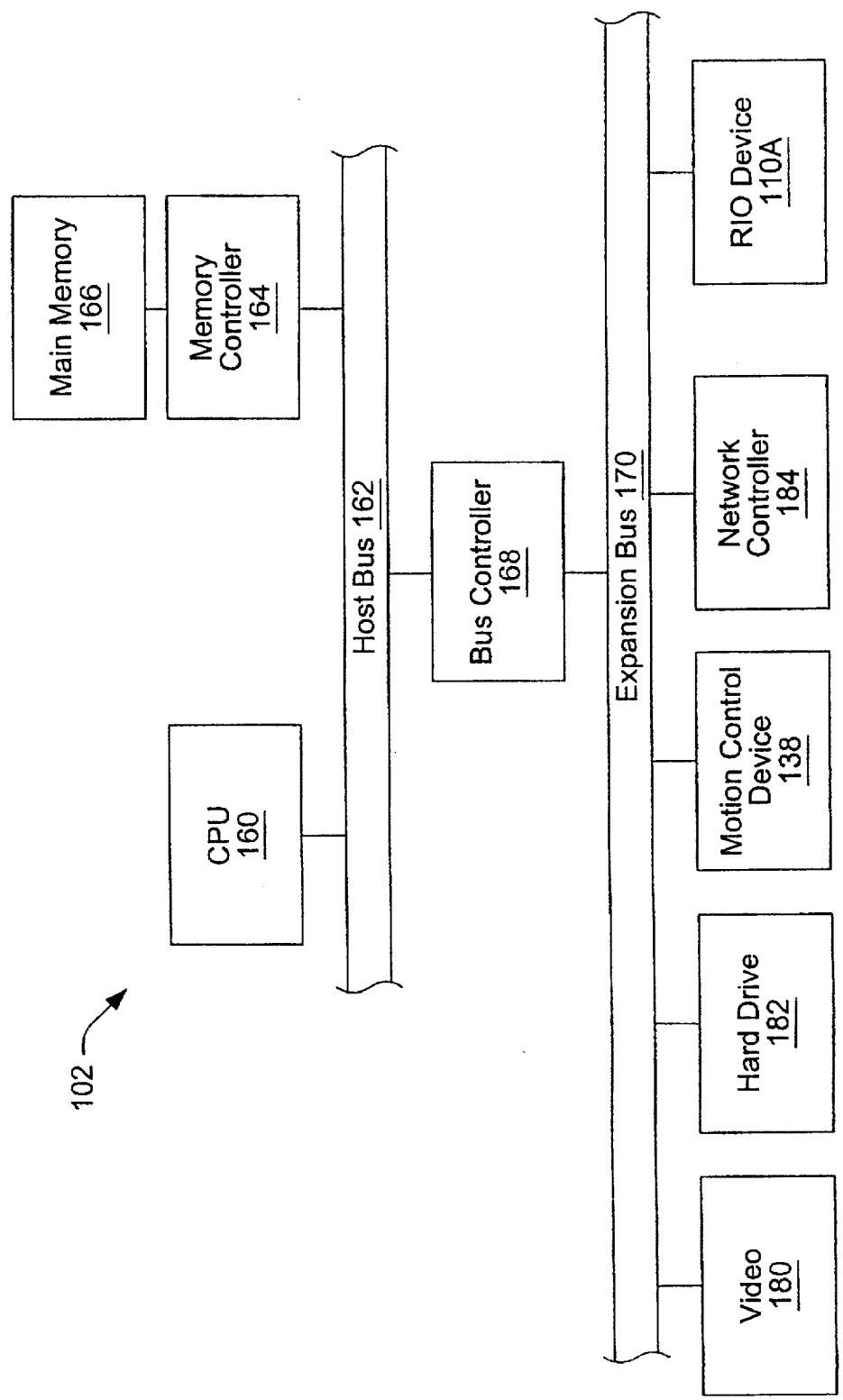

FIGS. 2A and 2B—Computer Block Diagrams

FIGS. 2A and 2B are exemplary block diagrams of the computer 102 of FIG. 1A–1C. The elements of a computer not necessary to understand the operation of the present invention have been omitted for simplicity. As FIGS. 2A and 2B show, the computer 102 may include at least one central processing unit (CPU) or processor 160 which is coupled to a processor or host bus 162. The CPU 160 may be any of various types, including an x86 processor, a PowerPC processor, a CPU from the Motorola family of processors, a CPU from the SPARC family of RISC processors, as well as others. Main memory 166 is coupled to the host bus 162 by means of memory controller 164. The main memory 166 may be operable to store one or more programs according to the present invention. For example, the memory medium 164 may store a program which is executable to use interface protocol information received from the RIO 110 to program or configure the programmable hardware element 106 comprised in the RIO 110. The main memory 166 may also store operating system software, i.e., software for operation of the computer system, as well as one or more application programs, as is well known to those skilled in the art. In addition, the main memory 166 may store one or more measurement programs which are executable to perform measurement (including DAQ) and/or control tasks.

The host bus 162 is coupled to an expansion or input/output bus 170 by means of a bus controller 168 or bus bridge logic. The expansion bus 170 is preferably the PCI (Peripheral Component Interconnect) expansion bus, although other bus types may be used. The expansion bus 170 may include slots for various devices.

In FIG. 2A, the devices coupled to the expansion bus 170 include a controller 186, e.g., a USB controller 186, here shown coupled to RIO 110. In this embodiment, the RIO 110 is coupled to an optional measurement module 108, e.g., a National Instruments small form-factor measurement module 108, which in turn is coupled to a sensor 112. In this embodiment, the devices also include network controller 184, video display subsystem 180 and hard drive 182 coupled to the expansion bus 170, also shown. It should be noted that the network controller 184 may be any type of network controller, including Ethernet, wireless Ethernet (IEEE 802.11), Bluetooth, and CAN, among others. Furthermore, the USB controller shown is meant to be illustrative only, i.e., any other type of controller may be used as desired to communicate with the RIO device 110. In other embodiments, the controller 186 may be comprised in the bus controller 168, or may be implemented in any other forms customary and known in the art.

In FIG. 2B, the examples of devices coupled to the expansion bus 170 shown include a RIO device 110A, a network controller 184 (such as for coupling to a device 110 over a network, as described above with reference to FIG. 1C), a motion control device 138, such as shown in FIG. 1B, as well as a hard drive 182, and a video display subsystem 180. The RIO device 110A may be implemented in any of various computer system components, such as network device 184, motion control device 138, bus controller 168, etc.

Figure 3A:
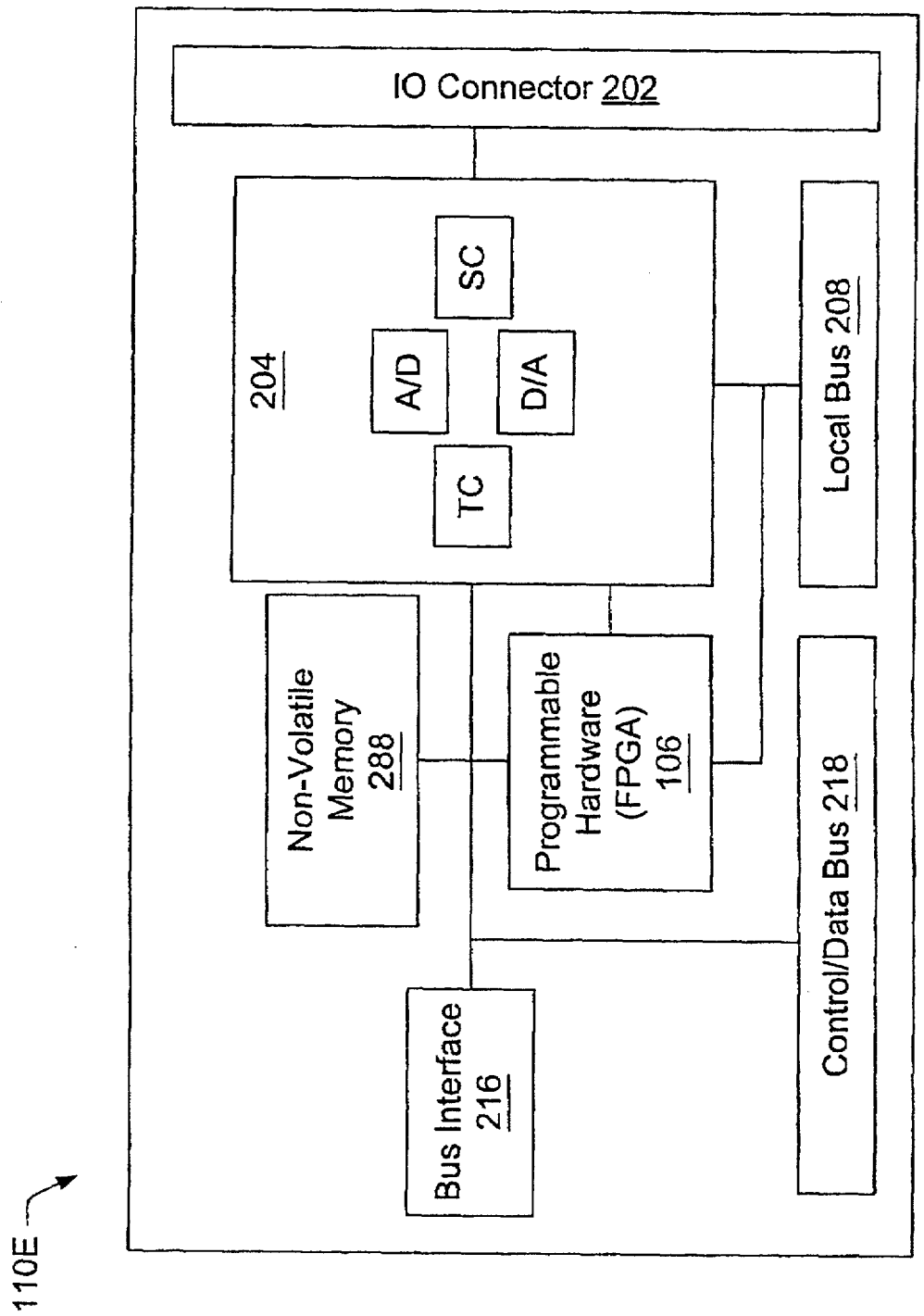
FIG. 3A is a block diagram illustrating a RIO card or device configured with a programmable hardware element, according to one embodiment of the present invention.
Figure 3B:
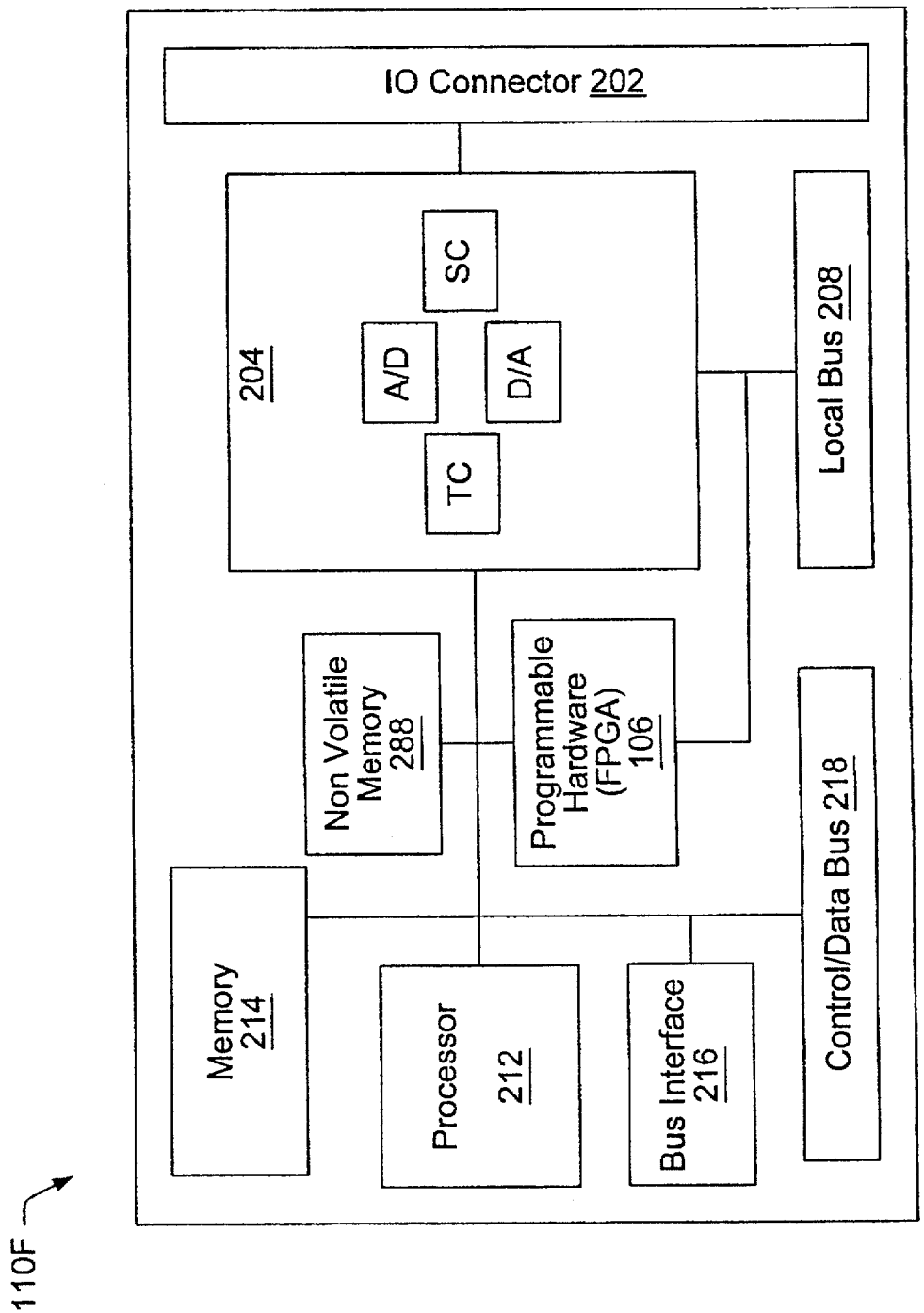
FIG. 3B is a block diagram illustrating a RIO card or device configured with a programmable hardware element and a processor and memory, according to one embodiment of the present invention.

FIGS. 3A and 3B—Reconfigurable I/O Devices

FIGS. 3A and 3B are block diagrams of embodiments of a RIO device including one or more programmable hardware elements 106, such as an FPGA, and example auxiliary components. FIGS. 3A and 3B show exemplary RIO device block diagrams, where the RIO device 110 is shown as a card or board. These embodiments also apply to other RIO device embodiments and form factors.

FIG. 3A—A RIO with Programmable Hardware

FIG. 3A is a block diagram illustrating a RIO device, e.g., a RIO card 110E, configured with programmable hardware according to one embodiment. It is noted that FIG. 3A is exemplary only, and a RIO card or device 110E configured with programmable hardware according to the present invention may have various architectures or forms, as desired. For example, the device may be internal or external to the computer 102, and may be connected to the computer through a network, such as the Internet. The RIO card 110E illustrated in FIG. 3A may be the RIO measurement device 110C or the motion control interface card 138, shown in FIG. 1C, or any of the RIO devices shown in FIGS. 1A–2B, or any other type of measurement or control device as desired.

As shown in FIG. 3A, the RIO card 110E preferably includes programmable hardware element 106. In one embodiment, the programmable hardware 106 may comprise a field programmable gate array (FPGA) such as those available from Xilinx, Altera, etc. The RIO card 110E may also include a non-volatile memory 288 coupled to the programmable hardware element 106. In this embodiment, the non-volatile memory 288 may be used for storing FPGA state information which may be used to initialize, configure, or program the FPGA 106 to perform a measurement or control function or implement an interface, as described above.

In one embodiment, the programmable hardware element 106 may be operable to perform one or more of: I/O interfacing, timing and triggering, inline processing, and embedded decision-making. For example, new triggering options or a different mix of counters may be implemented on the programmable hardware element 106 for an application. In converting the program into the hardware implementation form, the computer system 102 may generate a hardware description which is usable to configure the FPGA 106 to perform the functionality as specified in the program. Note that the term "hardware description" may refer generally to intermediate and final forms of the implementation, or may refer specifically to the form of the program used to generate a netlist. The conversion process, and specific intermediate forms of the converted program are described in detail below with reference to FIGS. 12 and 13.

The RIO card 110E may also include one or more fixed hardware resources 204. The fixed hardware resources 204 may be coupled or connected at the boundary of the programmable hardware element 106. The fixed hardware resources 204 may provide various dedicated hardware functionality that may be used in conjunction with the programmable hardware element 106. In one embodiment, these fixed hardware resources 204 may provide various types of functionality, including one or more of: 1) control and data path to a host computer; 2) I/O interfacing to the external system; 3) optimized hardware elements; and/or 4) basic operating services. For example, the fixed hardware resources may comprise fixed physical I/O resources, including ADCs, DACs, and digital lines, among others.

In one embodiment, these resources are low-level building blocks that may be used in creation of the system. As noted above, these fixed hardware resources 204 may be used in conjunction with or by the programmable hardware element 106, wherein the configuration deployed onto the programmable hardware element 106 can use or build on these blocks to define a measurement and/or control system.

As also shown in FIG. 3A, the RIO card 110E may include an I/O connector 202 which is operable to send/receive signals. The I/O connector 202 may present analog and/or digital connections for receiving/providing analog or digital signals, such as image signals, pixel data, or any other type of signal or data, such as from a sensor or actuator 112. In one embodiment, the I/O connector 202 may be adapted for coupling to an external camera. The I/O connector 202 may be an example of a fixed hardware resource 204.

Thus, in one embodiment, everything behind the I/O can be redefined as desired to implement a given functionality, i.e., only the physical I/O is static (e.g., more ADCs can't generally be added, unless a mixed signal FPGA, described below, is configurable to implement them). The configuration for the programmable hardware element 106 may be "tuned" to a specific application, and may therefore minimize incompatibilities between the application and system hardware.

As one example, the fixed hardware resources 204 may comprise resources referred to as data acquisition (DAQ) logic 204. As shown, the data acquisition logic 204 may comprise analog to digital (A/D) converters, digital to analog (D/A) converters, timer counters (TC) and signal conditioning (SC) logic as shown. The DAQ logic 204 may provide data acquisition functionality of the I/O device 110E. In one embodiment, the DAQ logic 204 comprises 4 A/D converters, 4 D/A converters, 23 digital I/Os, a RTSI connector, and a TIO. This extra hardware is useful for signal processing and motion control applications. The programmable hardware element 106 may be coupled to the DAQ logic 204 and may also be coupled to a local bus interface 208, described below. The programmable hardware element or FPGA 106 may access these resources directly, thereby enabling creation of very powerful data processing applications, among others.

As shown, the RIO card 110E may further include bus interface logic 216 and a control/data bus 218. In one embodiment, the RIO card 110E is a PCI bus-compliant interface card adapted for coupling to the PCI bus of the host computer 102, or adapted for coupling to a PXI (PCI extensions for Instrumentation) bus. The bus interface logic 216 and the control/data bus 218 thus present a PCI or PXI interface. The bus interface logic 216 and the control data bus 218 may be examples of fixed hardware resources 204.

The RIO card 110E may also include local bus interface logic 208. The local bus interface logic 208 may interface to a local bus used for data transfer. In one embodiment, the RIO card 110E may present a RTSI (Real Time System Integration) bus for routing timing and trigger signals between the RIO card 110E and one or more other devices or cards, such as a motion device. The local bus interface logic 208 and/or the RTSI bus may each also be an example of a fixed hardware resource 204.

Thus, in addition to the programmable hardware element 106, the RIO card 110 may include fixed hardware resources 204 which may operate in conjunction with the programmable hardware element 106 to perform measurement and/or control functions. Said another way, after hardware description is deployed onto the programmable hardware element 106, the programmable hardware element 106 may be operable to directly perform a first portion of the measurement function, and invoke the one or more fixed hardware resources 204 to perform a second portion of the measurement function. In other words, the first portion of the measurement function is actually performed by the programmable hardware element 106, while the second portion of the measurement function, although initiated or directed by the programmable hardware element, is actually performed by the fixed hardware resources 204. Thus, the hardware description may specify the first portion of the measurement function to be performed directly by the programmable hardware element, and usage of the one or more fixed hardware resources 204 by the programmable hardware element 106 to perform the second portion of the measurement function.

As mentioned above, in a preferred embodiment, the FPGA may be configured by the computer system 102 by implementing a program, such as a graphical program, on the FPGA. If the (graphical) program contains portions which are only executable on a processor (as opposed to a programmable hardware element 106), then those portions may be executed by a different part of the system, such as by a processor comprised in the computer system 102. Thus in the embodiment of FIG. 3A, any supervisory control portion of the graphical program which is necessary or desired to execute on a programmable processor in software may be executed by the host CPU in the computer system 102, and is not executed locally on the RIO card 110E. Thus a graphical program can be created on the computer 102, or on another computer in a networked system, and at least a portion of the graphical program can be converted into a hardware implementation form for execution in the FPGA 106 or by fixed hardware resources 204. The portion of the graphical program converted into a hardware implementation form is preferably a portion which requires fast and/or real time execution.

FIG. 3B—A RIO with Programmable Hardware and Processor

In the embodiment of FIG. 3B, in addition to the programmable hardware 106 (FPGA), a RIO card 110F may further include a dedicated on-board processor 212 and memory 214. In various embodiments, the processor 212 may comprise one or more of a processor and memory, a micro-controller, and a digital signal processor (DSP). This enables a portion of the graphical (or other) program to be compiled into machine language for storage in the memory 214 and execution by the processor 212. A portion of the graphical program may also (or instead) be transferred to the memory 214 in its native format for execution by the processor. This may be in addition to a portion of the graphical program being converted into a hardware implementation form in the FPGA 106. The memory 214 may store a real time operating system (RTOS) for execution by the processor 212. Where the graphical program executes in its native format on the device 110F, the memory may also store a graphical program execution engine (e.g., LabVIEW RT) that is executed by the processor 212.

Thus, in one embodiment, after a graphical program has been created, a portion of the graphical program may be transferred and/or compiled for execution on the on-board processor 212 and executed locally on the RIO card 110F via the processor 212 and memory 214, and a second portion of the graphical program may be translated or converted into a hardware executable format and downloaded to the FPGA 106 for hardware implementation. One example of this is a mixed LabVIEW RT/LabVIEW FPGA embodiment, where a first portion of a LabVIEW graphical program executes on a processor and memory (e.g., LabVIEW RT), and a second portion (which may require more real time deterministic operation) executes in the FPGA.

As mentioned above, as one example, a first portion of a block diagram (that requires real time or fast execution) of a graphical program may be converted into a hardware executable format and downloaded to the FPGA 106 for hardware implementation, and a second portion of a block diagram (that may not require real time performance) may be stored in the memory 214 as program instructions and executed by the processor 212, in either a compiled or interpreted manner. As another example, a portion or all of the block diagram portion of the graphical program may be converted into a hardware executable format and downloaded to the FPGA 106 for hardware implementation, and a user interface portion (or front panel portion) of the graphical program may be stored in the memory 214 as program instructions and executed by the processor 212, in either a compiled or interpreted manner. Thus the portion of the graphical program which requires the most real time or deterministic (reliable and consistent) performance may be executed directly in hardware for fast operation, and other parts of the block diagram, or the user interface portion, which may not require real time performance, may execute on the processor 212. Where the processor 212 executes the user interface portion, the processor 212 may then send resulting signals to the video subsystem for display of the user interface on the computer display. The host computer CPU may also execute the user interface portion instead of the processor 212.

In one embodiment, the programmable hardware element itself may include a fixed, built-in ("hardcore") processor, where at least a portion of the measurement program is operable to be executed by the processor. In another embodiment, the programmable hardware element may be configurable to implement a processor ("softcore") which is operable to execute at least a portion of the measurement program.

As mentioned above, the programmable hardware 106 may comprise a field programmable gate array (FPGA) such as those available from Xilinx, Altera, etc. The programmable hardware element 106 may be coupled to the DAQ logic 204 and may also be coupled to local bus interface 208, described above.

As also mentioned above, in one embodiment, the RIO card 110F also includes a non-volatile memory 288, which may be coupled to the programmable hardware element 106, the processor 212 and the memory 214. The non-volatile memory 288 may be operable to store the hardware configuration program received from the host computer system to enable execution of the hardware configuration program in the programmable hardware element 106 prior to or during booting of the computer system 102. The non-volatile memory 288 may also store software transferred to the memory 214 and used by the processor 212, such as a RTOS and/or a graphical program execution engine.

As mentioned above, a typical example of a measurement I/O device or board may include a 16 channel multiplex AI (analog input) in front of an A/D (analog to digital) converter, 2 analog outputs (AO), 8 digital lines, ~10 timing/triggering lines, 2 general purpose counters, plus one or more timing/triggering engines. Generally, the timing/triggering engines and digital logic for inter-component communications and for communicating with a host are comprised in an Application Specific Integrated Circuit (ASIC). The ASIC is a fixed functionality integrated circuit, and is thus not generally subject to modification by a user. As also mentioned above, there may be many applications whose requirements don't exactly match this set of resources.

In one embodiment of the invention, the programmable hardware element 106 (e.g., the FPGA) of a RIO device 110 may partially or completely replace the ASIC, i.e., the onboard digital logic, thereby providing a means to configure or program application specific components as required. For example, in one embodiment, the FPGA 106 may couple to an ADC via one or more digital lines. The FPGA 106 may comprise an array of configurable low level digital pins (rudiments) which may be defined or configured to implement digital lines and logic. Thus, by replacing the standard DAQ digital (and optionally, analog) logic in a system or card with a reconfigurable core or programmable hardware element 106, e.g., an FPGA, the functionality of the system or card may be defined by the configuration of the programmable hardware element 106. Additionally, the configuration may be downloaded "in the field," e.g., a pre-compiled configuration may be provided over a network or via wireless means to the RIO device 110 and installed on the FPGA 106 to implement the desired functionality. In one embodiment, this feature may be used to perform hardware updates on installed equipment remotely, thereby eliminating the need for a human to travel to the site and physically remove and replace the hardware. In another embodiment, new configurations for a hardware product may be defined and deployed after product release. For example, "hardware patches" fixing a bugs of flaws may be used in a similar manner as software patches in software systems.

For example, the low level digital pins which may be configured to implement digital filters, controls, counters, timing and triggering engines, and/or other digital components. In other words, the digital logic commonly provided by the ASIC may instead be provided by a suitably configured FPGA 106. In this way, the digital logic specifically required by the user (or application) may be configured on the FPGA, thereby providing a "custom fit" of the board or device to the requirements.

Some examples of functionality which a suitably programmed or configured programmable hardware element 106 may provide include, but are not limited to:

I/O lines—for example, input lines may be defined and grouped for specific functionality, and may include various counters, custom triggers, etc., as desired. For example, a group of 4 digital input lines may be dedicated for receiving input from an on-board ADC;

flexible timing/triggering—may provide higher level control of, organization of, and relationships between configured components, allowing groups of components to operate relatively independently from other groups of components, e.g., one group of components may operate at 1 MHz, while another group of components operates concurrently at 10 MHz; and algorithms—higher level constructs such as control loops, decisions, combinations of control structures, state machine decisions, control of analog and digital read/write operations, time stamps, etc., may provide software like logic and flow with hardware performance.

Thus, in one embodiment, the ADC, possibly operating under control of the programmable hardware element 106, may receive analog input from a sensor 112, and convert the analog signals to digital form. The configured FPGA 106 may receive the digital signals and process them according to the configured logic. The processed digital signals may then be routed to memory, to other components in the measurement device 110, and/or to an external system, such as the computer system 102. Other fixed hardware resources may also be arranged in the vicinity of the FPGA 106, such as DACs (digital/analog converter), DIOs (digital I/O ports), and/or any other type of circuit component.

In another embodiment, the FPGA 106 may be a mixed signal FPGA. As used herein, the term "mixed signal FPGA" refers to an FPGA which includes both digital gates and analog components. In one embodiment, the analog components may include relatively high-level components such as comparators, DAQs, filters, and ADCs, which may be used in conjunction with the configured digital logic and lines to provide any of a variety of measurement and/or control functions, as described above. In another embodiment, the analog components may include low-level analog components or rudiments such as transistors, op amps, capacitors, inductors, and/or resisters, from which higher-level analog components may be built or configured. Thus, if a user had need for an I/O card comprising an analog Butterworth filter and a 9-bit ADC, such a circuit could be configured on a RIO card or device 110. Additionally, if at a later time the user's requirements changed, the circuit could be modified to accommodate the new requirements.

Thus, the use of an FPGA 106 to implement digital logic in a measurement device provides a flexible solution to application specific digital logic requirements. Additionally, the use of a mixed signal FPGA extends the approach to include programmatically configurable analog components, which, in combination with the configurable digital logic, provides a broad, flexible solution approach to measurement and control system development. More specifically, various embodiments of the RIO system may provide improved I/O solutions for real time systems and applications (e.g., Lab-VIEW RT based applications), providing support, for example, for simultaneous sampling, synchronized AI, AO, DIO, and TIO (timed I/O), and balanced analog I/O, as well as providing a single point architecture. Additionally, RIO may facilitate use of a simplified register map, such as for interfacing with other systems. Finally, as noted above, RIO provides for customized functionality of measurement, control, automation, and simulation hardware, thereby providing the flexibility of software based systems with the performance of hardware.

Figure 3C:
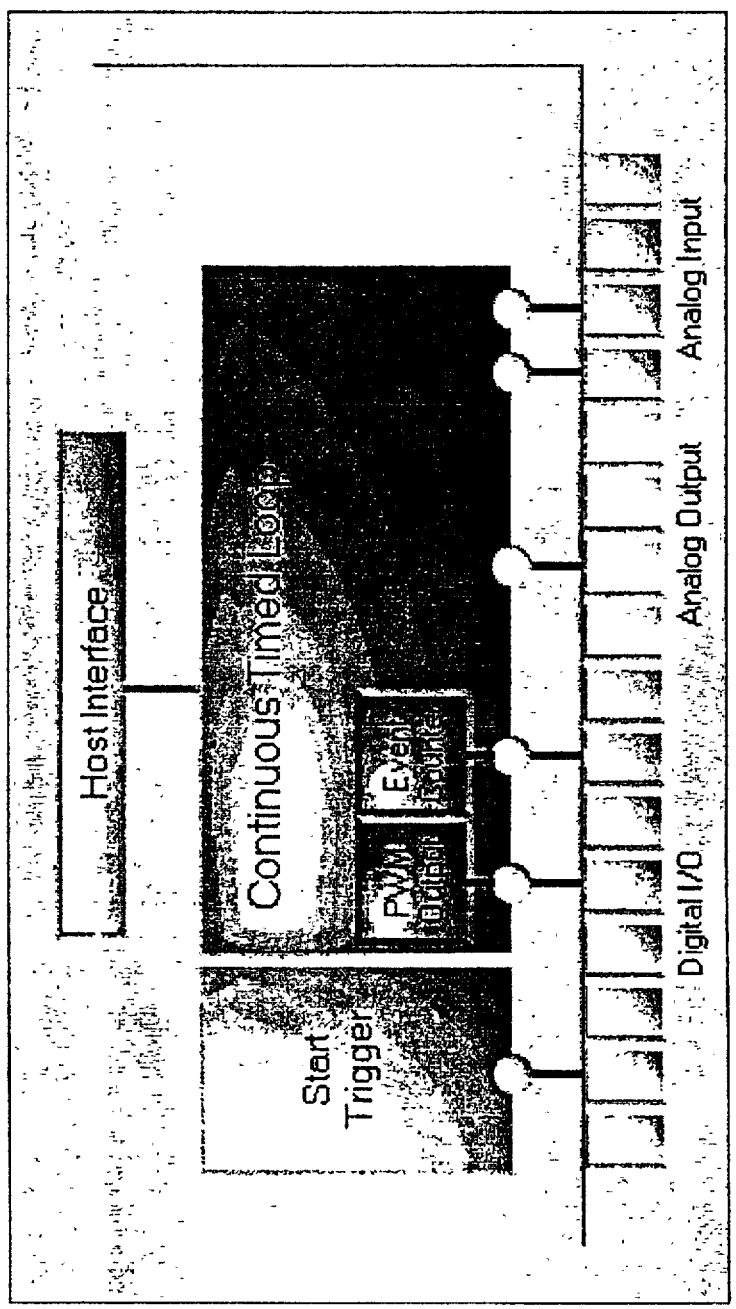
FIG. 3C illustrates example functionality of a programmable hardware element, according to one embodiment.

FIG. 3C—Programmable Hardware Functionality

FIG. 3C illustrates example functionality of a configured programmable hardware element 106 (e.g., an FPGA) in a RIO device 110. As FIG. 3C shows, the programmable hardware element 106 may include a plurality of digital I/O lines, as well as analog output and analog input lines, for communicating with other components or systems. In this example configuration, the FPGA 106 includes a start trigger coupled to one of the digital I/O lines, a continuous timed loop comprising a pulse width modulated output coupled to a digital I/O line, and an event counter, coupled to another digital I/O line. Additionally, the continuous timed loop component is coupled to an analog output and two analog inputs, as shown, as well as to a host interface. Thus, the programmable hardware element 106 is configured to implement a trigger, a control structure (the continuous timed loop), including a counter and PWM digital output, and a host interface, as well as analog I/O.

Figure 4:
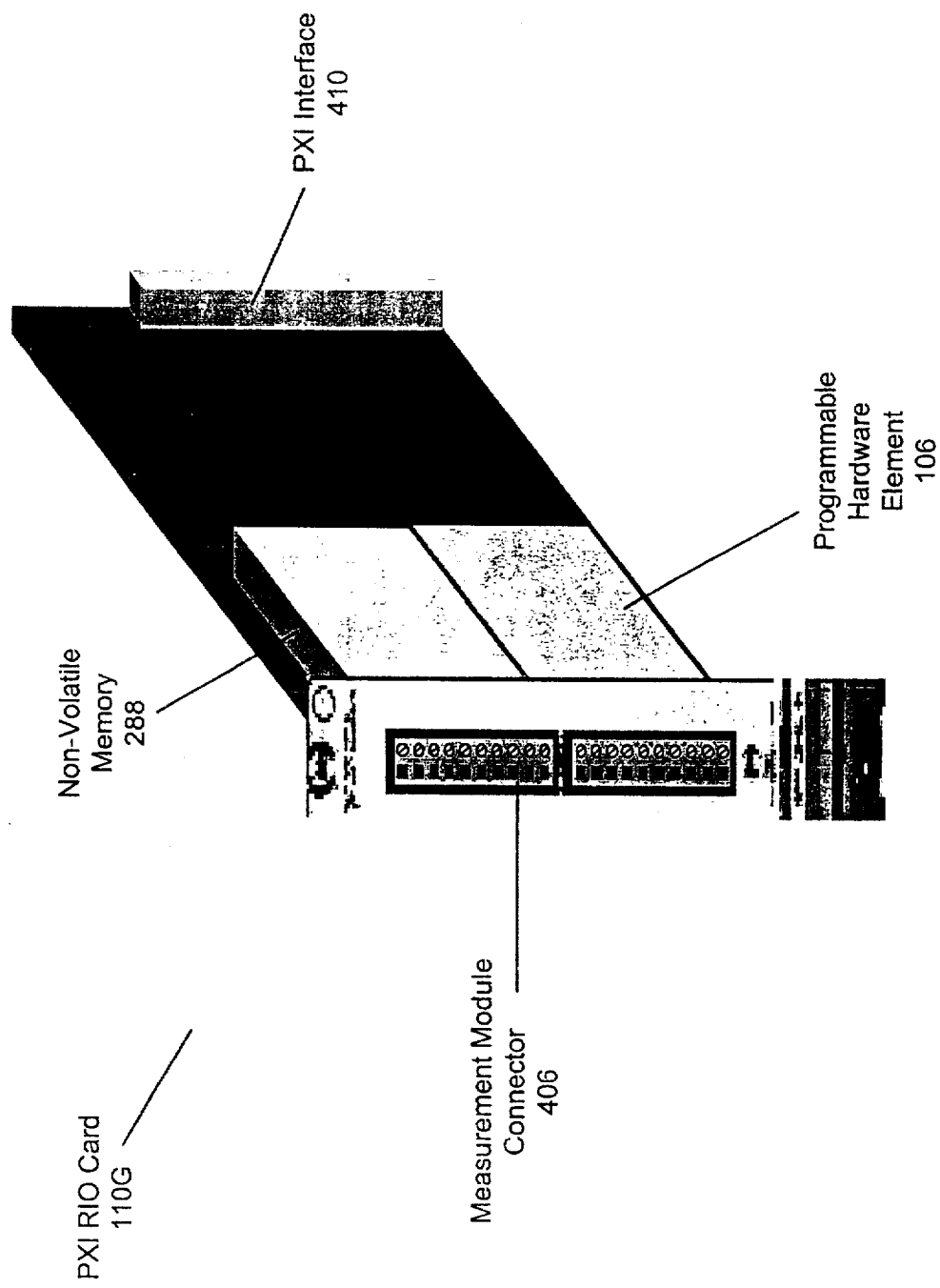
FIG. 4 illustrates a RIO card, according to one embodiment of the invention.

FIG. 4—A PXI RIO Card

FIG. 4 illustrates a RIO card 110G, according to one embodiment of the invention. As described previously, the RIO card 110G includes a programmable hardware element 106 (e.g., an FPGA) which is operable to be programmed to perform various measurement and/or control functions, and/ or to implement an interface for communicating with a measurement module 108. The RIO card 110G may also include various fixed hardware resources 204.

In this embodiment, the RIO card 110G may also include non-volatile memory 288, usable to store FPGA state information, such as a hardware description and/or an EDS specifying a measurement module interface, or configuration information which implements one or more measurement and/or control functions.

In this embodiment, the RIO card 110G is a PXI card. In other words, the RIO card is operable to plug into a PXI slot, such as on a computer system 102, or a PXI chassis. As FIG. 4 also indicates, the RIO card 110G may include bus interface circuitry, such as a PXI interface 410, for coupling to a PXI controller. Of course, the use of other controllers and corresponding interface circuitry is also contemplated, including PCI, VXI, USB, InfiniBand, Ethernet, Wireless (e.g., IEEE 802.11 Wireless Ethernet or Bluetooth), and IEEE 1394 (FireWire), among others. Thus, in one embodiment, the RIO card may be inserted into an expansion slot of a system, such as computer system 102 or chassis.

In one embodiment, the RIO card 110G may also include one or more measurement module connectors 406, each of which may be operable to couple to a measurement module 108, and which may be further usable to receive interface protocol information from the measurement module 108. As described above, the RIO card 110G may then be programmed (such as by computer system 102) to implement the communicated interface. As mentioned above with reference to FIG. 3B, the RIO 110G may include other resources (fixed hardware resources 204) besides those shown in FIG. 4, such as signal conditioners and/or converters, analog filters, AO and AI ports, and so forth, as desired. Additionally, as also mentioned above, the FPGA 106 may be coupled to various analog components as well, allowing a broad range of functionality to be configured on the RIO card 110G for a given application. Finally, the FPGA 106 may include low-level analog rudiments, thus allowing the configuration of an even greater number and type of measurement and/or control circuitry.

In another embodiment, the RIO card 110G may comprise a control board. As one example, the RIO control board 110G may be a PXI board running LabVIEW RT. The RIO control board 110G may also include a programmable hardware element 106. The RIO control board 110G may also include various fixed hardware resources. For example, the RIO control board 110G may include analog I/O comprising 8 analog inputs (AI) and 8 analog outputs (AO) operating at a certain frequency, e.g., between 1 kHz and 1 GHz (e.g., ~100 kHz), and capable of being simultaneously sampled and/or updated. In this embodiment, the RIO control board also includes 96 digital I/O lines which are synchronous to the AI and AO. Some or all of the digital lines may be consumed by counters and triggers. Exemplary configurations for this board include a continuous timed loop, different counter options, and single point architecture with no buffers. Additionally, the RIO control board may include a flash memory for storing the configuration for the board's programmable hardware element. Finally, for connectivity, the board may use three mini 68 pin connectors, or three 50 pin ribbon headers (which may reduce the DIO count to 48).

In yet another embodiment, the RIO card 110G may comprise a digital board having a processor and memory running LabVIEW RT, a programmable hardware element 106, and fixed hardware resources 204 comprising 160 digital I/O lines, various counters and triggers which may consume some or all of the digital lines, flash memory for storing the configuration for the board, and four mini 68 pin connectors for connectivity. Exemplary configurations include continuous timed loop, static input/output, different counter options, and single point architecture with no buffers.

Thus, in one embodiment, the RIO device 110G may be in the form of an adaptive interface card, such as a RIO PXI interface card, which includes a programmable hardware element 106 which is programmable to implement one or both of measurement and/or control functions and a measurement module interface.

Figure 5A:
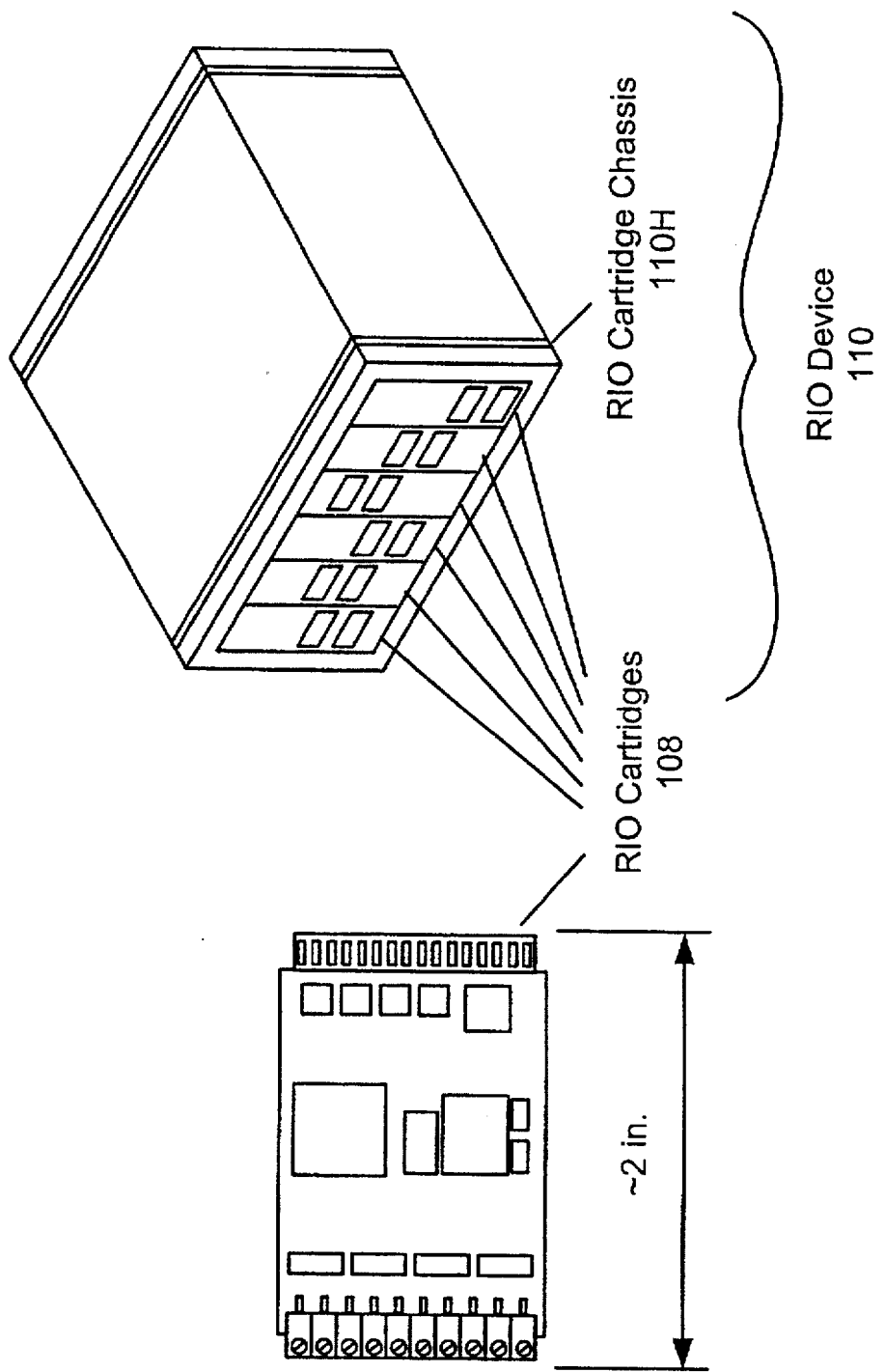
FIG. 5A illustrates a cartridge RIO with measurement cartridges, according to one embodiment of the invention.

FIG. 5A—RIO Cartridge Carrier with Measurement Cartridges

FIG. 5A illustrates an embodiment of the invention where the RIO device 110 is in the form of a RIO cartridge chassis or carrier 110H, and one or more measurement cartridges (modules) 108. The RIO cartridge carrier 110H may comprise one or more slots which are operable to receive the one or more measurement cartridges 108, described in more detail below.

In one embodiment, the RIO chassis 110H may comprise a chassis, a backplane comprised in the chassis providing for electrical communication, and the one or more slots comprised in the chassis, in addition to the programmable hardware element 106 described above. Each of the one or more slots may include a connector that is coupled to the backplane, where each of the one or more slots may be adapted for receiving one of the measurement modules 108. Thus, the RIO chassis 110H may host a plurality of measurement cartridges 108, each of which may provide measurement and/or control functionality for a measurement or control operation or task. Each measurement module 108 may include fixed hardware resources 204 or a programmable hardware element 106, or both. The RIO chassis 110 may also be operable to communicate with each measurement cartridge (i.e., module) 108 and be programmed or configured (e.g., by a computer system 102) to implement the respective interface of each measurement cartridge 108. In this manner a suite of sensors 112 may be fielded, each of which feeds signals to a respective measurement cartridge 108 which in turn communicates through a respective interface (protocol) with the RIO device 110. Thus, the RIO device 110 may support a heterogeneous plurality of interfaces without having to include a heterogeneous set of interface hardware components.

In one embodiment, each measurement module or cartridge 108 may be operable to communicate with the RIO carrier 110H via SPI (Serial Peripheral Interface) 316, as described with reference to FIG. 5B below, although other interface protocols are also contemplated.

Additionally, in various embodiments, the RIO cartridge carrier 110H may be operable to provide communications between the measurement modules 108 and external systems. For example, the RIO cartridge carrier 110H may include logic to convert proprietary measurement module signal data into a standard format suitable for transmission to computer system 102. For another example, in one embodiment, the RIO cartridge carrier 110H may include an IP address and web server capabilities, and thus may be able to publish received signals or measurement data over the Internet. The RIO cartridge carrier 110H may similarly be operable to receive signal data over the Internet for processing. In another embodiment, one or more measurement cartridges 108 may also have an IP address and web server capabilities, and thus may be able to communicate with remote systems over the Internet, for example, to stream sensor data (e.g., numerical data or images) to a website for access by other systems or users.

In a preferred embodiment, the measurement modules 108 (or cartridges) may be easily removed, added, and replaced. In other words, measurement modules may be exchanged to change the configuration or capabilities of the measurement system. In one embodiment, the measurement module 108 may be replaced without powering down the measurement system, i.e., the measurement module 108 may be "hot-plugged" into the RIO 110. During operation of the measurement system, the measurement module 108 may communicate the interface protocol information to the RIO 110 upon attachment, and the RIO 110 is programmed in response, as described above. In another embodiment, the measurement module 108 and/or RIO 110 may require a reboot or reset after attachment to perform the described initialization.

For example, during operation of the measurement system, a new measurement module 108 (or cartridge) may be added (i.e., inserted or attached) to the RIO 110. The measurement system may automatically perform the initialization described above with respect to the added measurement module 108. In other words, during operation of the measurement system, the newly coupled measurement module 108 may communicate respective interface information to the RIO 110, which may then be programmed (e.g., by the computer system 102) to implement the respective interface, thereby enabling operations with the new measurement module 108. In one embodiment, the new measurement module 108 may replace another measurement module which was removed during operation of the measurement system.

Thus, the interface circuitry (i.e., the measurement module 108) may be operable to communicate the interface protocol to the RIO device 110 upon one or more of attachment of the measurement module 108 to the RIO device 110, reset of the measurement module 108, reset of the RIO device 110, reboot of the measurement module 108, and reboot of the RIO device 110.

As FIG. 5A shows, in a preferred embodiment, the measurement module or cartridge 108 may have a small form factor. For example, in one embodiment, the measurement module 108 may have dimensions less than or equal to approximately 1 inch by 2 inches by 3 inches. In one embodiment, the measurement module 108 may have dimensions of approximately 0.2 inches by 1 inch by 1 inch or more. An example form factor for the module 108 is shown in FIG. 5A as having a major dimension of 2 inches. Thus, in a preferred embodiment, the measurement module 108 has a compact form factor which may enable deployment in a variety of devices or carriers with minimal space requirements.

Thus, in one embodiment, each measurement cartridge 108 may include signal conditioning, ADC, microprocessor, and optional isolation, for sensor to digital operations. Additionally, each cartridge 108 may provide an SPI digital interface with simple protocol, and EDS/calibration history on board. In a preferred embodiment, the cartridges may have low channel counts, e.g., 4-channel analog, 8-channel digital.

The RIO cartridge carrier 110H is preferably able to convert SPI to standard bus/network signals, and implement power-on states, plug and play, and watchdogs. Additionally, the modules/cartridges 108 and/or the cartridge carrier may be provided with application-specific form factors and functionality. In other words, the cartridges and/or the cartridge carrier may be developed specifically to match the customers space and function needs. Example RIO carriers 110 may include, but are not limited to, a 4-slot Ethernet carrier (including IEEE 802.11 Wireless Ethernet), a 4-slot and 1-slot USB carrier, a multi-slot RIO carrier, a 1-slot wireless carrier, such as Bluetooth, and a CAN carrier, among others.

Figure 5B:
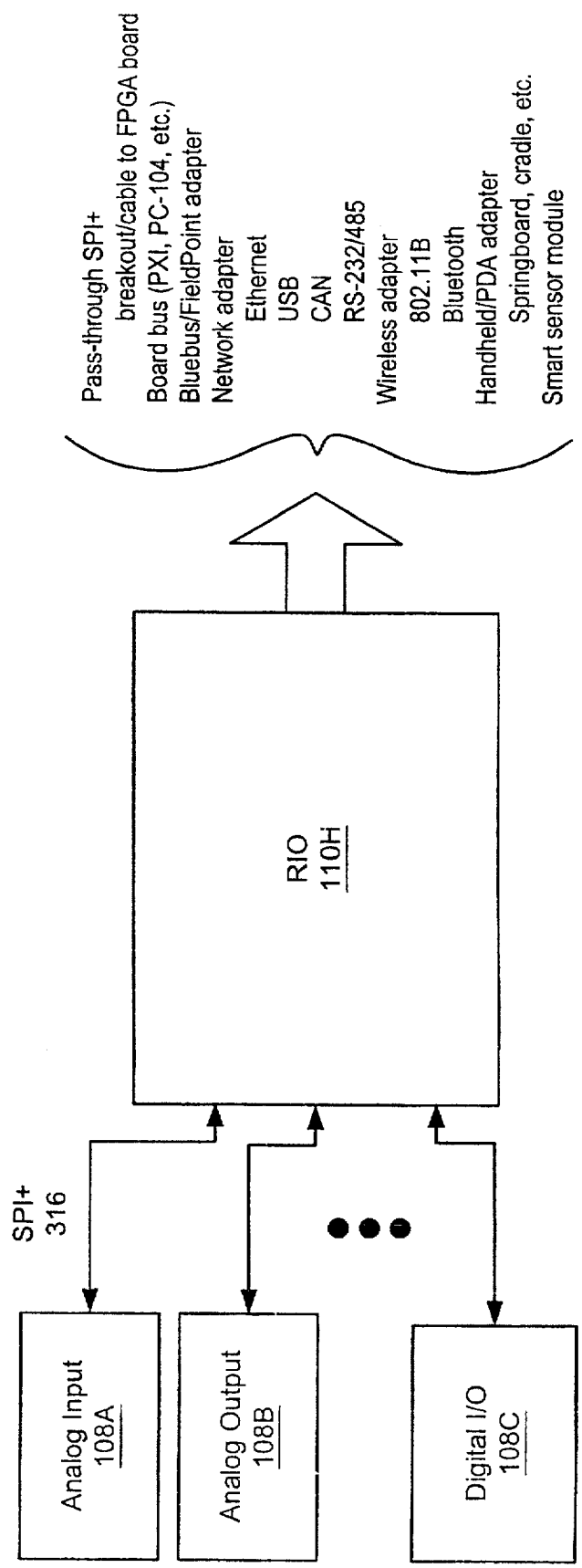
FIG. 5B is a block diagram of a RIO with multiple measurement modules, according to one embodiment of the invention.

FIG. 5B—RIO Device with Multiple Measurement Modules

FIG. 5B is a block diagram,n of the RIO measurement system 110 of FIG. 5A above, comprising a RIO cartridge chassis or carrier 110H and a plurality of measurement modules 108, according to one embodiment. As FIG. 5B shows, the plurality of measurement modules 108 may include analog input module 108A, analog output module 108B, and digital I/O module 108C, as well as other measurement modules 108 not shown. Thus, the RIO cartridge chassis 110H may be operable to communicate with each measurement module 108 and be programmed or configured (e.g., by a computer system 102) to implement the respective interface of each measurement module 108. In this manner a suite of sensors 112 may be fielded, each of which feeds signals to a respective measurement module 108 which in turn may communicate through a respective interface (protocol) with the RIO 110, such as through SPI+ 316 or any other interface protocol or interface. Thus, the RIO 110 may support a heterogeneous plurality of interfaces without having to include a heterogeneous set of interface hardware components.

It should be noted that in various embodiments, the RIO 110 may be operable to perform other functions in addition to the adaptive interface functionality described above. For example, in one embodiment, the RIO 110 may include network control circuitry (or have a programmable hardware element configured to perform network control functions), and thus may comprise a networked measurement and control device, or a networked data acquisition device. In other words, the RIO unit 110 may comprise one or more of an Ethernet carrier, a USB carrier, and a wireless carrier (such as IEEE 802.11 Wireless Ethernet or Bluetooth), among others, to facilitate transmission of data over a network to external systems, e.g., the computer system 102.

As FIG. 5B shows, the RIO cartridge carrier 110H may also be operable to communicate with and through any of a variety of external systems and protocols, including, but not limited to, pass-through SPI+ (breakout/cable to FPGA board); board bus (PXI, PC-104, InfiniBand, etc.); Bluebus/FieldPoint adapter; network adaptors such as Ethernet, USB, CAN, and RS-232/485; wireless adapters such as 802.11B (Wireless Ethernet) and Bluetooth; handheld/PDA adapters such as Springboard, cradle, etc., and smart sensor modules, among others.

Figure 6:
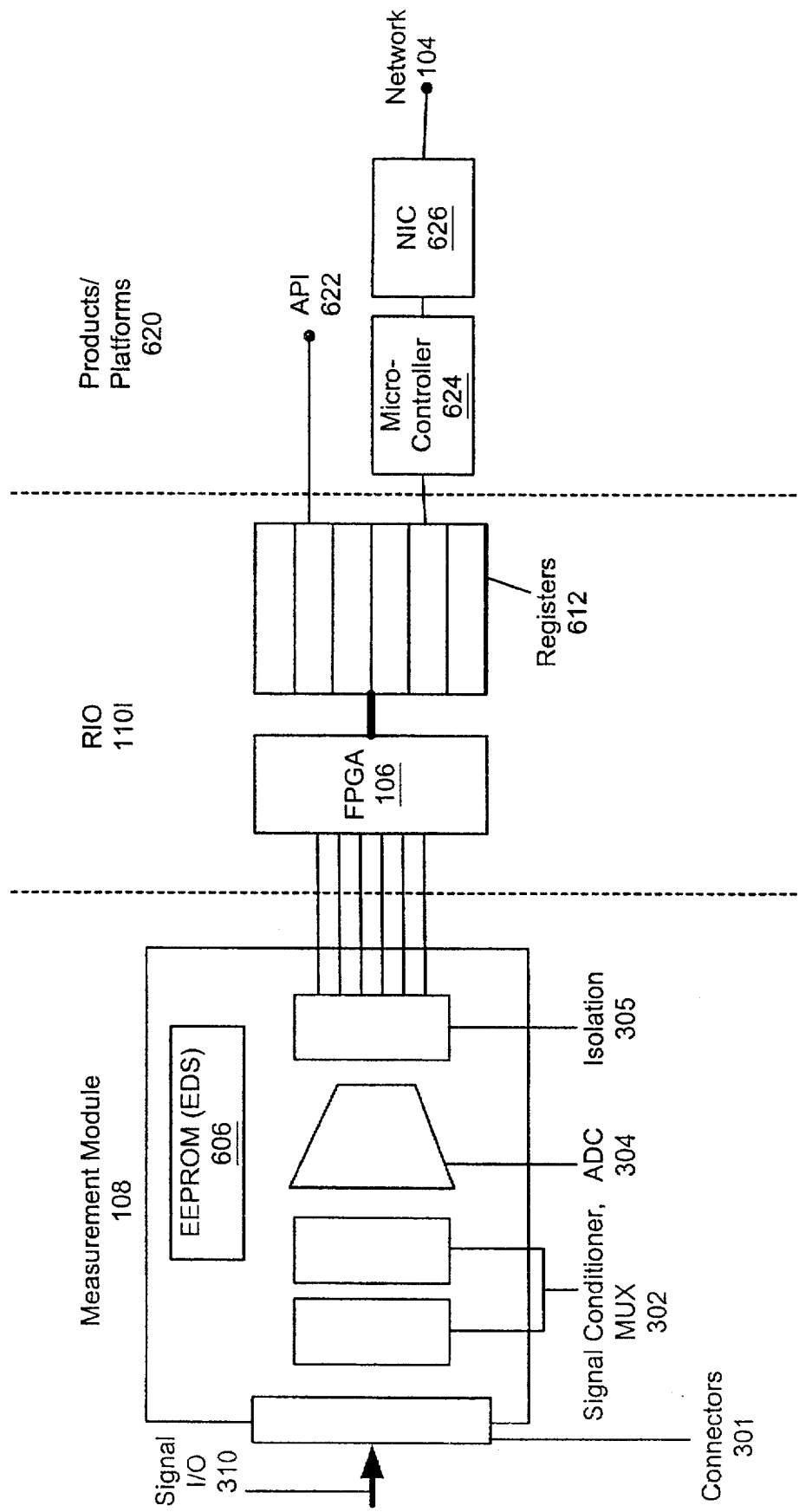
FIG. 6 is a block diagram of a RIO measurement system with a measurement module, according to one embodiment of the invention.

FIG. 6—Measurement Module and RIO Architecture

FIG. 6 is a block diagram of an architecture for a RIO system 110 which includes a measurement module 108 and a RIO carrier 110I. In this embodiment, the RIO carrier 110I includes not only the adaptive interface functionality described above, but also includes capabilities for performing one or more measurement and/or control functions.

As FIG. 6 shows, the measurement system may include measurement module 108, which may couple to the RIO carrier 110I through one or more communication lines or terminals, as shown. The RIO carrier 110I may in turn be operable to couple to any of various products or platforms 620, as indicated.

In one embodiment, the measurement module 108 may include connectors 301 for (analog) signal I/O, i.e., for communicating with a sensor or actuator 112. As shown, the connectors 301 may couple to signal conditioning circuitry 302, which in this embodiment includes a signal conditioner and a MUX. The signal conditioning circuitry 302 may couple to signal conversion circuitry, such as the ADC 304 shown, which may in turn couple to isolation circuitry 305, which may protect the module components from spurious voltage or current surges and mismatched impedances. In this embodiment, the measurement module 108 also includes an EEPROM 606 containing an EDS which may be operable to communicate the interface protocol information to the RIO carrier 110I, as described above. Thus, the measurement module 108 may provide a physical connection between the sensor or actuator 112 and the RIO carrier 110I, as well as signal conditioning, digitization, and isolation functions for the measurement system. In addition, in one embodiment, the measurement module 108 may provide identification (for Plug-and-Play (PnP)) and/or digital I/O (parallel and/or serialized) functionality.

As indicated in FIG. 6, the RIO carrier 110I may include programmable hardware element 106, e.g., FPGA, which may be programmable to implement the interface specified by the measurement module 108, as described in detail above. In this embodiment, the RIO carrier 110I may also include a register set 612, through which communication with the products/platforms may be effected. In various embodiments, the RIO carrier 1101 may provide additional functions which may include I/O scanning, timing and triggering, power-on states, logic, digital I/O timing/counting, data transfer and support for parallel and scanned backplanes, among others.

Thus, in the RIO system, the FPGA 106 may be configurable with measurement and/or control functions. Thus the FPGA 106 may perform measurement/control functions instead of, or in addition to, the computer system 102.

The products and platforms 620 indicated in FIG. 6 may provide means for the RIO carrier 1101 to communicate with external systems. For example, an Application Programming Interface (API) 622 may allow external systems to read and/or write to the registers in the register set 612 to communicate and/or control the measurement system. For another example, a processor, e.g., a micro-controller 624, and a network interface card 626 may couple the registers to a network 104, through which communications with external systems may be facilitated. In one embodiment, the products and platforms 620 may be comprised in the RIO 110, while in other embodiments the products and platforms 620 may be external to the RIO 110, e.g., may be comprised in computer system 102.

In one embodiment, the RIO 110 may comprise or be coupled to a Personal Digital Assistant (PDA). Thus the PDA may comprise the RIO 110 and may include one or more slots for measurement modules 108. In other words, the PDA may itself be the RIO carrier. Alternatively, the RIO device 110 may be in the form of an optionally detachable RIO module, which may in turn couple to a measurement module 108. The measurement module 108 may in turn be operable to couple to a sensor or actuator, as described above. In one embodiment, the PDA may be operable to program the RIO 110 (i.e., the RIO's programmable hardware element 106) with the interface protocol information provided by the measurement module 108, as described in detail above. Alternatively, the PDA may be programmed as the RIO carrier 110. In one embodiment, the PDA may be further operable to provide functionality related to a measurement and/or control task or operation. In another embodiment, the PDA may be used as an interface to another computer system 102. For example, a suitably equipped PDA may provide wireless communication for the RIO 110/measurement module 108.

Figure 7:
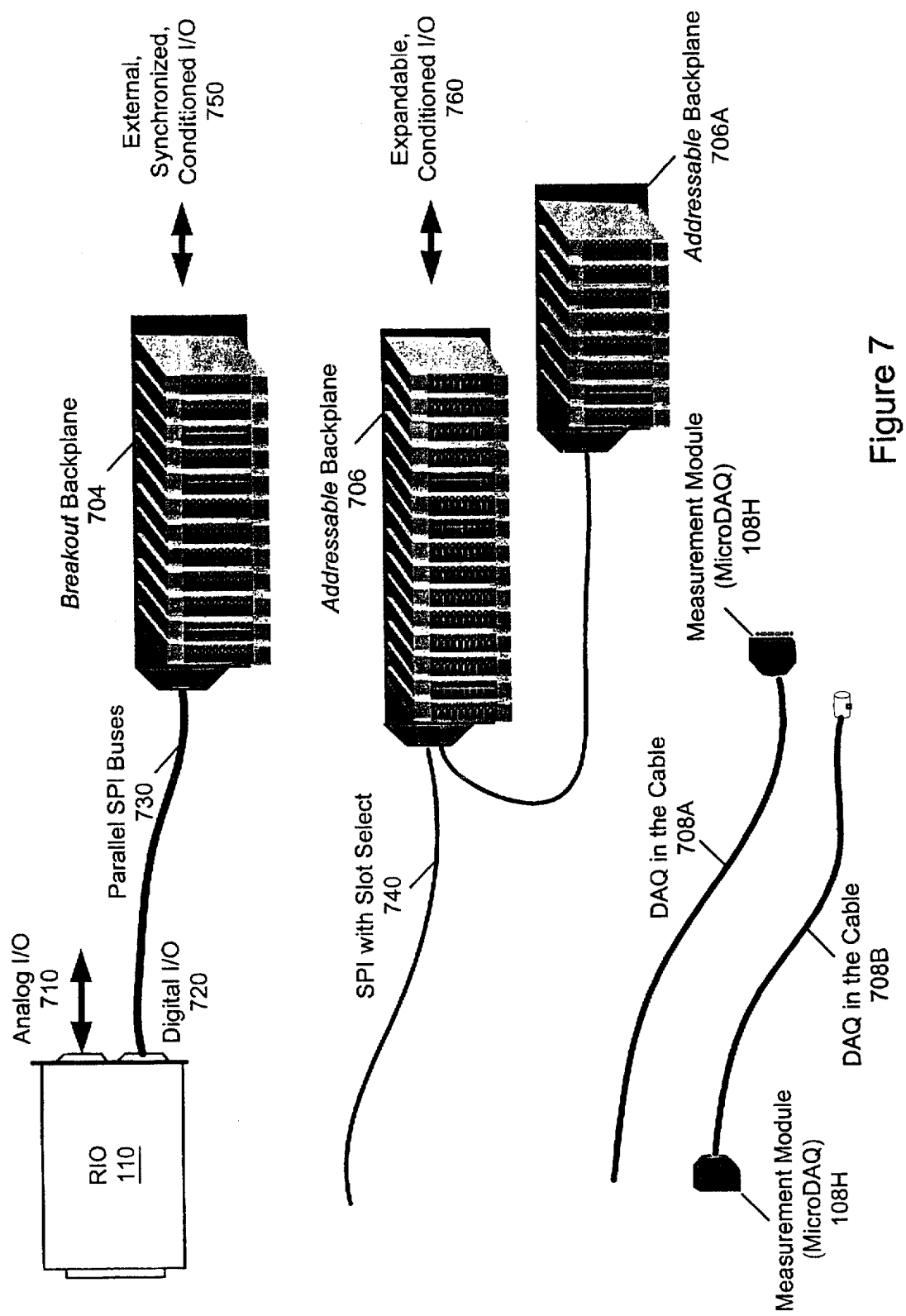
FIG. 7 illustrates various embodiments of a RIO system with I/O expansion.

FIG. 7—RIO System with External I/O Expansion

FIG. 7 illustrates several embodiments of the invention using a RIO card 110 with external I/O expansion, i.e., with additional I/O connections for coupling to a plurality of measurement modules 108. As FIG. 7 shows, a RIO cartridge or card 110 may provide connectors for analog I/O 710 and/or digital I/O 720. As may be seen, without the use of expansion I/O devices, the number of measurement modules 108 which may be coupled to the RIO card 110 may be limited, e.g., to one.

In one embodiment, the digital I/O 720 may couple to a breakout backplane 704, for example, via parallel SPI buses 730, as shown, although other buses for coupling the I/O expansion devices to the RIO 110 are also contemplated. The breakout blackplane 704 may provide connectivity for a plurality of measurement module cards or cartridges 108, and may thereby be operable to facilitate external, synchronized, and conditioned I/O 750 for the measurement system. For example, each measurement module or cartridge 108 comprised in or on the breakout backplane 704 may be operable to couple to a sensor or actuator 112. Each measurement module 108 may also couple to the backplane 704. The breakout backplane 704 may then facilitate synchronization between the various measurement modules 108. Additionally, as described above, the measurement modules 108 may provide any of a variety of DAQ, measurement, and control functions, including signal conditioning and conversion, and thus external, synchronized, and conditioned I/O 750 capabilities may be included in this embodiment of the invention.

In another embodiment, the RIO card or device 110 may couple to an addressable backplane 706, for example, through an SPI with slot select capabilities 740. In other words, the addressable backplane 706 may provide a plurality of individually addressable slots for a plurality of measurement modules or cartridges 108, described above, which may each be individually targeted for communication by the RIO 110. Additionally, the addressable backplane 706 may be expandable, i.e., additional addressable backplanes 706A may be coupled to the addressable backplane 706 to provide additional slots for additional measurement modules 108. Thus, in this embodiment, expandable, conditioned I/O capabilities 760 may be provided by the system.

In yet another embodiment, the RIO card or device 110 may couple to a "DAQ in the cable" 708, where a measurement module 108 may be comprised in a cable connector. In other words, the features of a measurement module 108, as described above, may be included in one or both connectors of a cable, as shown. For example, in the example of DAQ in cable 708A, one end of the cable may be coupled to the RIO device 110, and the measurement module/connector 108 may be operable to couple to a sensor or actuator 112. In another example, the DAQ in cable 708B may comprise measurement module 108 which may be operable to couple to the RIO card 110, and another cable connector (without a measurement module 108) for coupling to a sensor/actuator 112.

Thus, in various embodiments, the functionality of one or more measurement modules 108 may be provided through the use of I/O expansion devices (e.g., devices 704, 706, and 708) which may extend the I/O capabilities of the RIO device 110. Furthermore, in some embodiments, additional functionality may be provided by the expansion device, such as the ability to synchronize the I/O.

Figure 8:
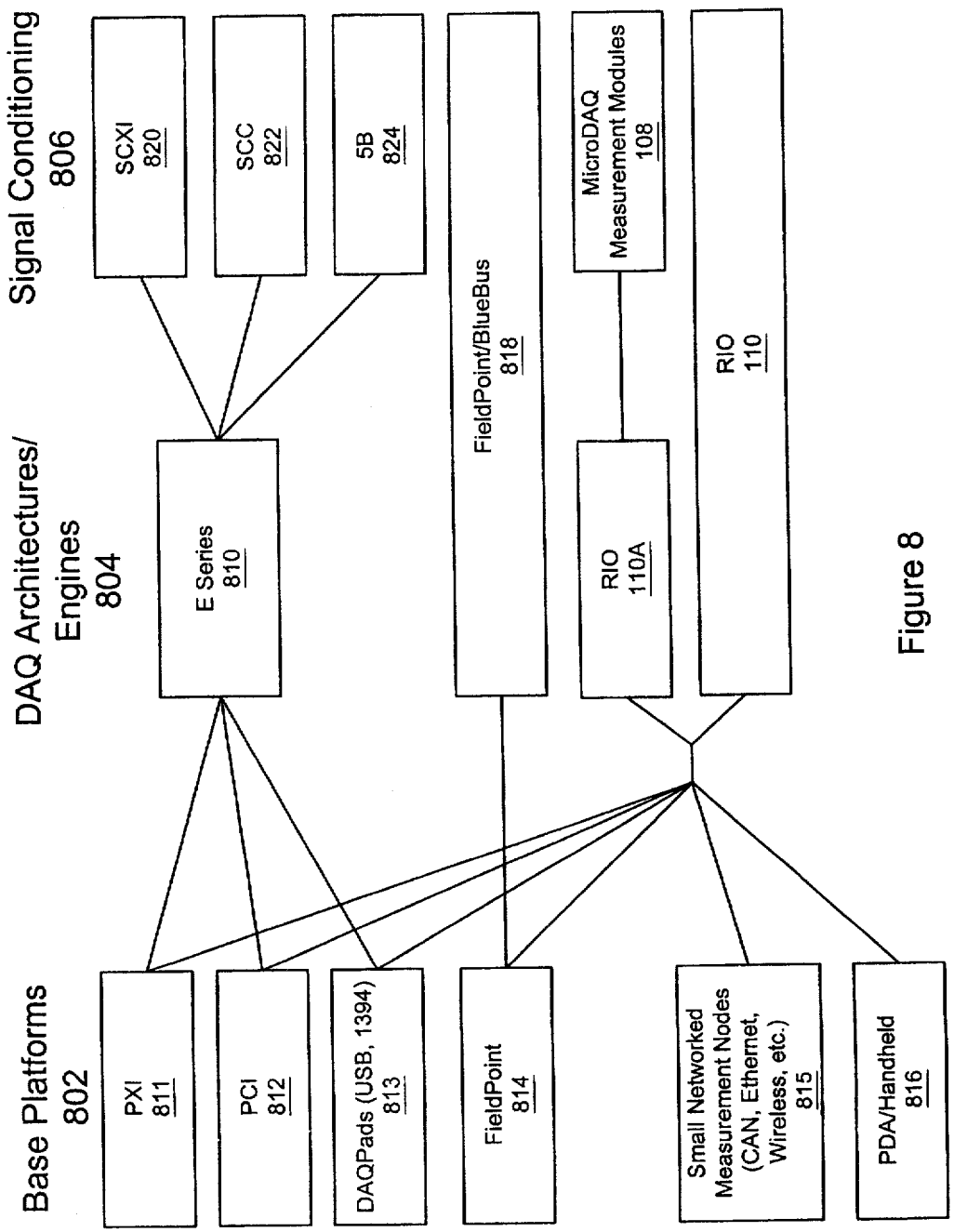
FIG. 8 illustrates RIO in the context of current measurement systems.

FIG. 8—Platforms and Technology

FIG. 8 illustrates embodiments of the present invention in the context of current art with respect to platforms, DAQ architectures/engines, and signal conditioning. As FIG. 8 shows, a plethora of different measurement and/or control systems may be developed using various combinations of base platforms 802, DAQ architectures/engines 804, and signal conditioning devices or systems 806. In particular the broad application of RIO technology is illustrated.

For example, any of a number of base platforms 802 may be used to provide a connectivity infrastructure for the system, including, but not limited to, PXI 811, PCI 812, DAQPads 813 (from National Instruments) which may utilize USB, 1394, etc., FieldPoint 814, small networked measurement nodes 815, and PDAs/handheld computers 816.

DAQ architectures/engines 804 which may be selected include, but are not limited to, the National Instruments E Series of DAQ devices 810, FieldPoint/BlueBus 818, and RIO devices 110 and 110A (or other RIO embodiments).

Signal conditioning technologies 806 which may be used in such systems include (but are not limited to) National Instruments SCXI 820, SCC 822, and 5B 824 signal conditioners, as well as FieldPoint/BlueBus compliant signal conditioners, and measurement modules 108, such as National Instruments measurement modules.

As FIG. 8 indicates, components or standards may be selected from each class of component (platforms 802, engines 804, signal conditioners 806), and, depending on compatibility, combined to develop a wide variety of measurement systems. For example, E Series engines 810 may be combined with a PXI platform 803, a PCI platform 805, and/or a DAQPads platform 807, and may further be combined with SCXI 820, SCC 822, and 5B 824 signal conditioners, while the FieldPoint/BlueBus engine 812 (which also provides signal conditioning functionality) may only be combinable with the FieldPoint platform 808.

In contrast, it is contemplated that the RIO engine/architecture may be combined with all of the listed platforms 802, i.e., PXI platform 811, PCI platform 812, DAQPads platform 813, FieldPoint platform 814, small networked measurement nodes 815, and PDA/handhelds 816), as well as other platforms not shown, e.g., InfiniBand, USB, 1394/FireWire, etc. Note that use of the RIO engine/architecture facilitates combinations with RIO signal conditioning devices 110 and measurement modules 108, respectively, for signal conditioning functions 806, as shown. The RIO engine/architecture may also be used with any of the signal conditioning options 806 shown in FIG. 8, including SCXI, SCC, 5B, Fieldpoint/Bluebus, and other types of signal conditioning or measurement modules.

In one embodiment, the combination of a RIO device 110 with measurement modules 108 is generally capable of providing any of various desired capabilities.

The RIO technology may be implemented or comprised in any of various platforms. For example, a RIO device 110 may be included in a smart sensor. In another embodiment, the RIO device 110 may include wireless logic for wireless communication with external systems, including sensors 112 and/or computer systems 102. In another embodiment, the RIO device 110 may include an interface for industrial automation, i.e., an industrial automation interface bus, such as CAN, Devicenet, and Fieldbus, among others.

Thus, the use of measurement modules 108 and various RIO units 110 may provide complementary and overlapping functionality as compared to current approaches to development of measurement systems, and may also provide substantial cost, efficiency, and flexibility benefits. In particular, the use of RIO devices 110 and/or measurement modules 108 leverages semiconductor technology to deliver highly modular measurement, control, and signal conditioning/conversion functionality which may be reusable in many platforms, e.g., USB, Ethernet, FieldPoint, RIO, PDAs, etc., and which may lower risk and effort in supporting new platforms, such as wireless, CAN, etc.

Figure 9:
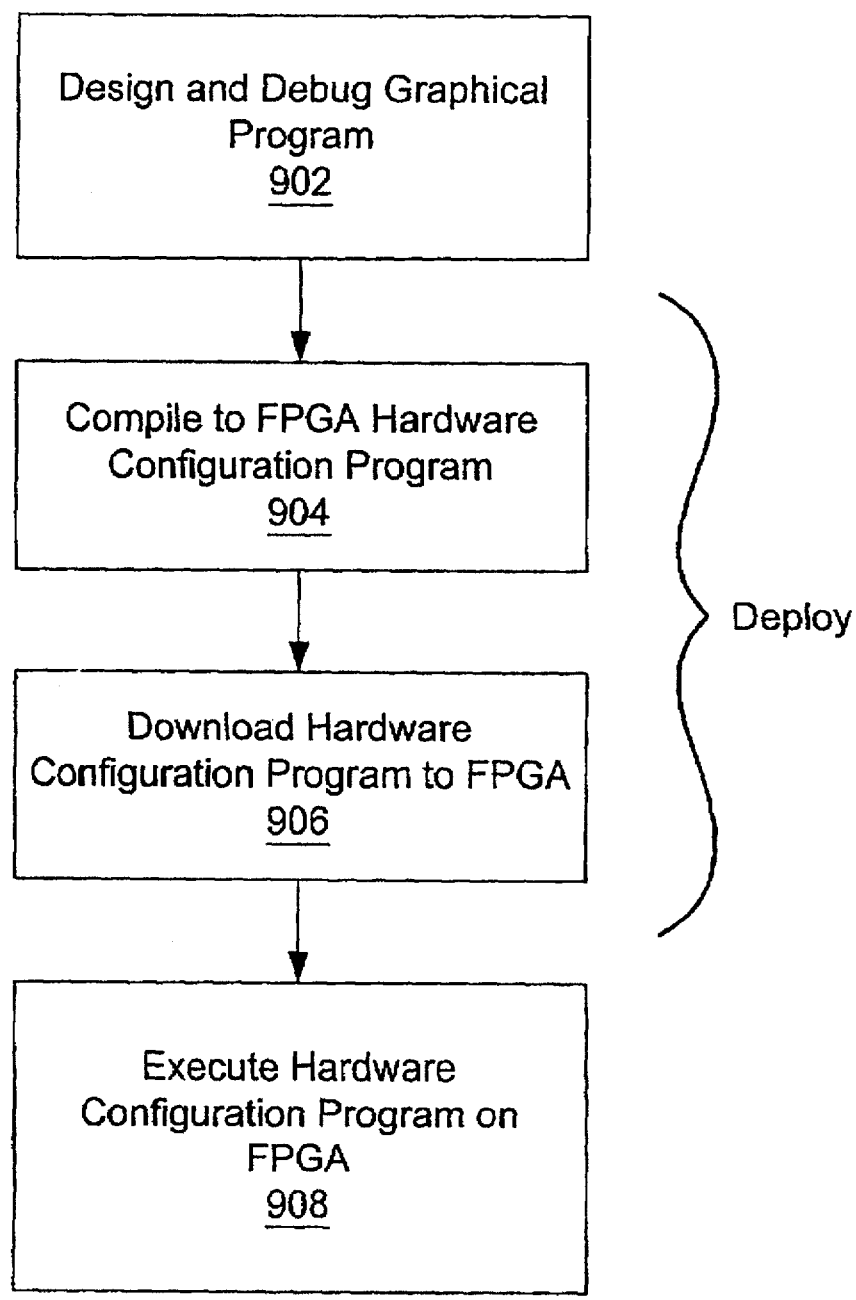
FIG. 9 illustrates design flow of a RIO system, according to one embodiment.

FIG. 9—RIO Design Flow

FIG. 9 illustrates design flow of a RIO system 110, according to one embodiment. As FIG. 9 shows, in one embodiment in 902 a program may be designed and debugged, such as on computer system 102. The program may specify or describe a measurement function. As mentioned above, a measurement function may include any measurement (including data acquisition) or control task or function. The program created in 902 may itself be executable, as opposed to being merely a specification. For example, the program may be compilable or interpretable to implement the measurement function on a computer system. In the preferred embodiment, the program may comprise a graphical program, i.e., the program may comprise a plurality of interconnected nodes which visually indicate functionality of the graphical program, such as a LabVIEW VI (Virtual Instrument). In another embodiment of step 902, the user may create a program in a text-based programming language such as C, C++, Java, VisualBasic, Pascal, Fortran, etc.

In another embodiment of step 902, the user may specify functionality of a measurement function using a high level wizard, as described herein, wherein a hardware configuration program may be created directly (or indirectly) from this user input. An example of a high level wizard for specifying tasks is IMAQ VisionBuilder from National Instruments Corp. As an example of indirect creation of a hardware configuration program from wizard-based user input, a program may first be created based on the user input, and the hardware configuration program may then be created from this program. For example, in one embodiment a program may be programmatically created in response to user input received to a wizard-like interface, as described in U.S. patent application Ser. No. 09/886,455 titled "System and Method for Programmatically Generating a Graphical Program in Response to User Input", which was incorporated by reference above. The hardware configuration program may then be programmatically created from this program. Further embodiments of a configuration wizard are described below with reference to FIGS. 18–21.

The host computer system may execute an application development environment (ADE) for creating the program to be deployed onto the RIO device 110. Input to the ADE may be textual, graphical, a hardware description language, may be through a configuration environment (e.g., a wizard) or an API structural description, among others.

In the embodiment described in FIG. 9, the user specifies the measurement function by creating a graphical program. In one embodiment, the graphical program may be designed in a graphical development environment, such as LabVIEW or LabVIEW FPGA. In the preferred embodiment, the graphical program may be developed in the G graphical programming language in the form of a graphical block diagram. The graphical program may then be converted to a hardware configuration program. In one embodiment, the graphical program may first be converted to source code in a text-based programming language, followed by conversion of the text-based source code to a hardware configuration program. The graphical program may be debugged in a simulation mode, as described below with reference to FIGS. 14 and 15.

Creation of a graphical program may comprise the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may assemble the user interface on the display. As one example, the user may use the LabVEEW graphical programming development environment to create the graphical program.

In an alternate embodiment, the graphical program may be created by the user creating or specifying a prototype using a prototyping environment, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, or a combination thereof, as desired. The graphical program may implement a measurement function that is desired to be performed by the instrument.

In 904, the program (e.g., the graphical program), or a portion of the program, may be compiled to a hardware configuration program (e.g., for an FPGA). In other words, the program (or a portion thereof) may be compiled on the host computer system 102, targeting the FPGA hardware 106. In one embodiment, the measurement function specified by the program or user input in 902 may be designed to be deployed among multiple distributed devices, such as multiple programmable hardware elements 106 (and optionally processors and/or fixed hardware resources) on a single RIO unit 110, one or more programmable hardware elements 106 (and optionally processors and/or fixed hardware resources) on each of a plurality of distributed RIO units 110, or combinations of the above with smart sensors, measurement modules, instruments and/or computer systems 102. Thus different portions of the program or user input specifying the measurement function may be deployed for implementation on various distributed devices, including one or more RIO units 110, smart sensors, measurement modules, instruments, and computer systems 102, among other devices. Within each RIO unit 110, different portions of the measurement function may be deployed to one or more programmable hardware elements 106, one or more processors and memory (software execution), and/or various fixed hardware resources.

In one embodiment, in 902 the user may be able to specify which distributed devices will execute which portions of a measurement function. For more information on a method for creating, deploying, and/or executing programs in a distributed system, please see U.S. patent application Ser. No. 06/312,242 titled "System and Method for Graphically Creating, Deploying and Executing Programs in a Distributed System" filed on Aug. 14, 2001, whose inventors are Jeffrey L. Kodosky, Darshan Shah, and Steven W. Rogers, which was incorporated by reference above. In an alternate embodiment, a deployment program (also called an optimization program) may examine user input to a wizard or a program created by the user in 902 and may automatically or programmatically specify which distributed devices will execute which portions of a measurement function. The deployment program may then automatically deploy the program accordingly.

In one embodiment where different graphical programs are deployed among multiple distributed devices, the graphical programs may be configured to communicate and interoperate with each other to perform the measurement function. For example, a block diagram executing on the host computer may be configured to communicate with a block diagram executing on a programmable hardware element of a RIO unit. As one example, a block diagram executing on a programmable hardware element may be a subprogram of the block diagram executing on the host computer. Where a measurement function is distributed among a plurality of devices, a plurality of block diagrams may be distributed among the various devices. The block diagram executing on the host computer system may operate to control the various block diagrams distributed among the various devices. The block diagram executing on the host computer may include one or more nodes which are configured to communicate with one or more nodes executing in a block diagram on the programmable hardware element. More generally, the block diagram executing on the host computer may include one or more nodes which are configured to communicate with one or more nodes executing in various block diagrams distributed on various different devices.

In one embodiment, the compilation of a program into a hardware configuration program may be performed on a client/server system or architecture due to long compile times (e.g., minutes to hours) typical for hardware implementations. Said another way, because of long compile times, the compiling may be performed on a different (server) computer (different from the host computer used to specify the measurement function in 902) which is coupled to the host computer system 102 (client), to avoid having to use the CPU resources of the host computer system 102. Compiling the program preferably produces an FPGA hardware configuration program which is operable to be deployed on the targeted FPGA 106. As noted above, portions of the program may optionally be deployed to various devices, as desired.

In one embodiment, the host 102 and/or development environment may maintain a cache for storing one or more pre-compiled portions of the program, so that successive compiles may be performed more quickly than the original compilation. In other words, in one embodiment, incremental compilation may be supported. In another embodiment, the host 102 and/or development environment may support a graphical program differencing or "diff" method for detecting changes in graphical programs. An example of a graphical program "diff" application is described in U.S. Pat. Nos. 5,974,254 and 6,138,270, which are incorporated herein by reference as though fully and completely set forth herein. The graphical program diff method may detect differences in two graphical programs (e.g., successive versions of the same graphical program), and only the differences may need to be compiled.

Then, in 906, the hardware configuration program may be downloaded or deployed onto the FPGA 106. In one embodiment, downloading the hardware configuration program onto the FPGA 106 may also include storing the hardware configuration program in a non-volatile memory coupled to the FPGA 106.

In one embodiment, the hardware configuration program may be downloaded or deployed onto the FPGA 106 using graphical or iconic techniques. For example, a hardware configuration program icon may represent the hardware configuration program, and a device icon may represent the RIO device or the RIO FPGA. The user may associate, e.g., drag and drop, the hardware configuration program icon with the device icon to deploy the hardware configuration program onto the device. For example, the user may drag and drop the hardware configuration program icon onto the device icon to effect the deployment. In another embodiment, the graphical program created in 902 may be represented by a program icon. The user may associate, e.g., drag and drop the program icon representing the graphical program with the deice icon representing the programmable hardware element 106. This association or drag and drop of a graphical program icon onto a device icon may initiate the appropriate compile process to occur (possibly on a separate computer), followed by the deployment. In another embodiment, the processor, FPGA and/or fixed hardware resources of a RIO device may each be represented as separate icons.

The user may drag and drop different portions of the graphical program onto each of the processor, FPGA, and fixed hardware device icons to deploy different portions of the graphical program to these different resources.

In another embodiment, a distributed system may include a plurality of devices, such as a plurality of programmable hardware elements on a single RIO device, one or more programmable hardware elements on a plurality of RIO devices, as well as other devices, such as computer systems, etc. A computer system may display a configuration diagram that includes RIO device icons and other device icons for the various devices in the distributed system. The user may use iconic association drag and drop techniques (or use other graphical techniques, such as menus, speech recognition, etc.) to graphically move graphical program icons or hardware configuration program icons onto various device icons, thereby deploying graphical programs or compiled hardware configuration programs (or portions thereof) onto different devices.

Thus, the (graphical) program may be deployed on the programmable hardware element 106 of the RIO measurement device 110, as described in steps 904 and 906. After the deployment of the program the programmable hardware element 106 implements the measurement function of the program. In other words, the programmable hardware element 106 is operable to perform the measurement function represented by the program. As mentioned above, the measurement function may include measurement (including data acquisition) and/or control functions, as desired.

In an embodiment where the programmable hardware element is an FPGA, deploying the program on the programmable hardware element of the device may include converting the program into a hardware description, such as a VHDL file, which may be compiled and used to program the FPGA to perform the measurement function. For example, the hardware description may be converted into an FPGA-specific netlist which describes the components required to be present in the hardware as well as their interconnections. Conversion of the hardware description into the FPGA-specific netlist may be performed by any of various types of commercially available synthesis tools, such as those available from Xilinx, Altera, etc. The netlist may be compiled into an FPGA program file, also referred to as a software bit stream, which can be readily downloaded to program the FPGA. After the netlist has been compiled into an FPGA program file the FPGA program file may be transferred to the FPGA, thereby producing a programmed hardware equivalent to the program. Further details of the deployment of the program on the programmable hardware element 106 are presented below with reference to FIGS. 12 and 13.

After the hardware configuration program has been deployed on the FPGA 106 of the RIO unit, the RIO unit 110 may optionally be disconnected from the computer system (or from a network) and may be operated in a stand-alone mode. For example, the RIO device 110 may be a card comprised in a chassis. The RIO card 110 may be removed from the chassis and operated in a stand-alone fashion to perform the measurement function. The RIO device 110 may alternatively be a small form factor device which includes a small housing, wherein the programmable hardware element and the fixed hardware resources are comprised in the housing. This device may be disconnected from the computer system (or from a network) and may be operated in a stand-alone mode. In one embodiment, the target device for the hardware configuration program is a stand-alone FPGA, e.g., an FPGA on a customer's board.

Finally, in 908, the deployed hardware configuration program may be executed on the FPGA 106 to perform the functionality of the application, e.g., the measurement function. Said another way, the RIO measurement system may perform the measurement function via execution of the program by the programmable hardware element on the device, i.e., the RIO 110. During execution of the FPGA 106, the FPGA 106 may invoke functionality of one or more fixed hardware resources comprised on the RIO 110 or external to the RIO 110. It is noted that in various embodiments, the FPGA 106 may perform the functionality of the application in conjunction with one or more of the host computer system 102, one or more sensors and/or one or more measurement modules 108.

In one embodiment, he block diagram may be converted to VHDL and then maybe executed using a VHDL simulator. This allows execution of the block diagram in the host computer without requiring a lengthy compile time.

Figure 10:
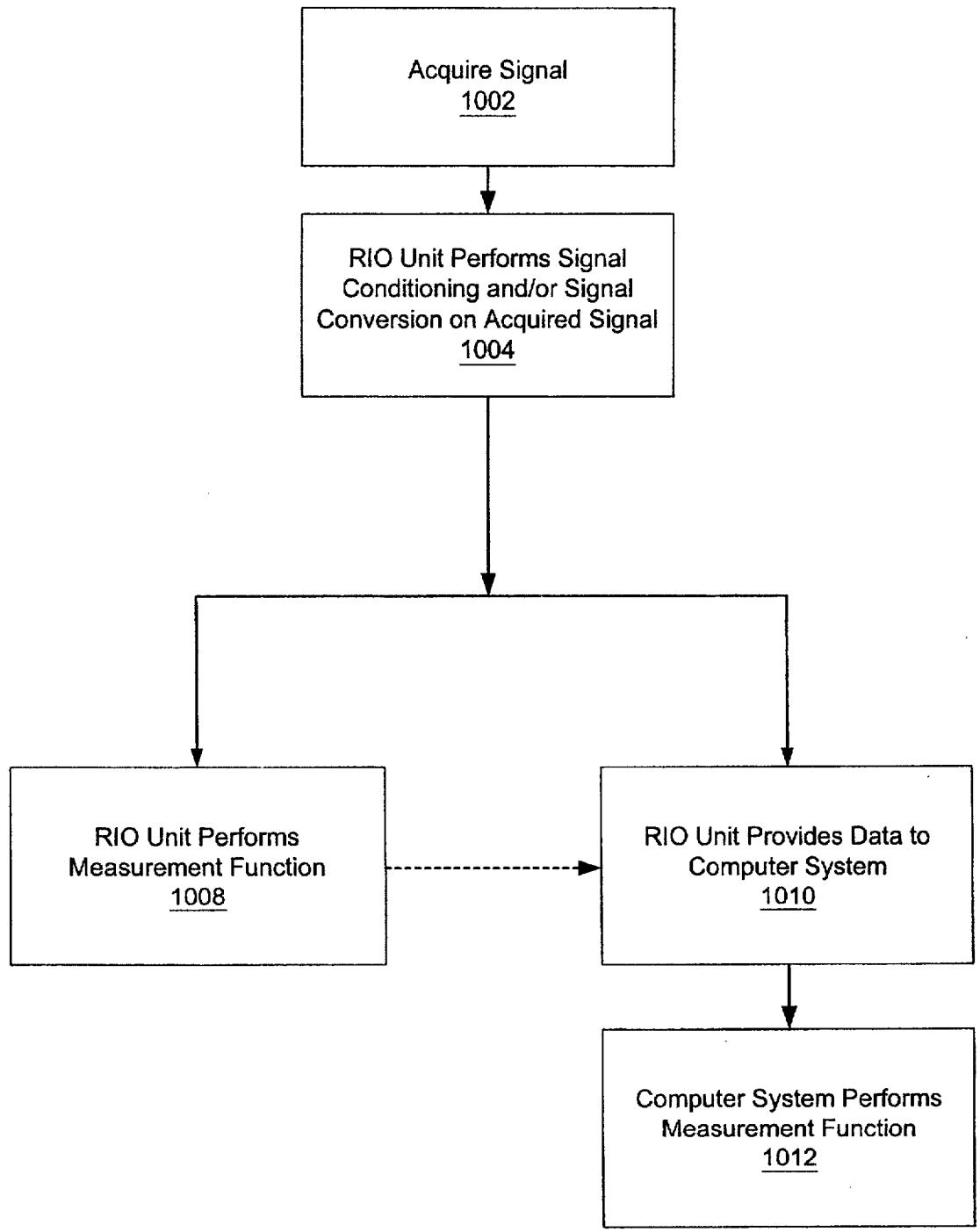
FIG. 10 is a flowchart of a method for performing a measurement function, according to one embodiment.

FIG. 10—A Method for Performing a Measurement Function

FIG. 10 is a flowchart of a method for performing a measurement function, according to one embodiment of the present invention. As noted above, in some embodiments, various of the steps may occur concurrently, in a different order than shown, or may be omitted. Furthermore, one or more additional steps may be performed as desired.

In 1002, a signal may be acquired. For example, a sensor coupled to or comprised in a RIO unit may acquire the signal. The signal may originate from a sensor 112, or may be transmitted from an external system.

In 1004, the RIO unit 110 may perform one or more of signal conditioning and signal conversion on the acquired signal. In performing the signal conditioning and/or signal conversion on the acquired signal, the RIO unit 110 may generate data, e.g., results data, which may include one or more of the original signal, the conditioned and/or converted signal, or information derived from or generated in response to the signal.

In one embodiment, the signal conditioning and/or signal conversion may be performed by one or more fixed hardware resources 204 comprised on the RIO unit, as described above. In another embodiment, the signal conditioning and/or signal conversion may be performed by a measurement module, as described below in 1114 of FIG. 11B. In yet another embodiment, the signal conditioning and/or signal conversion may be performed by the programmable hardware element 106 on the RIO unit 110. In other words, the programmable hardware element 106 may be programmed or configured to perform the signal conditioning and/or signal conversion, utilizing the programmable digital and/or analog aspects of the programmable hardware element 106 (e.g., the FPGA).

Then, in an embodiment where a programmable hardware element on the RIO 110 has been programmed or configured appropriately, in 1008, the RIO 110 (i.e., the programmable hardware element on the RIO 110) may perform a measurement function, e.g., on the signal or data. In other words, the RIO 110 may perform a measurement function which was programmed into the programmable hardware element. For example, the RIO 110 (i.e., the programmable hardware element on the RIO 110) may perform any of various data processing operations on the data, such as filtering, pattern recognition, or other analysis. For another example, the RIO may generate control signals in response to an analysis of the data, such as to control one or more plant operations. It should be noted that in performing the measurement function, the RIO 110 may utilize some or all of the fixed hardware resources 204 to perform portions of the function.

In another embodiment in which the computer system 102 comprises measurement software for performing a measurement function, in response to 1004 above, the RIO unit 110 may provide the data to the computer system 102, as indicated in 1010. Then, in 1012, the computer system 102 may perform the measurement function, e.g., on the signal, where the measurement function may include, measurement (including data acquisition) and/or control functions, as described above.

In yet another embodiment, the RIO unit 110 may perform a substantial portion of the measurement function, as indicated in 1008, then pass the results to the computer system 102, as shown in 1010, after which the computer system 102 may perform the remainder of the measurement function. For example, after a first pass measurement analysis by the RIO unit 110, the computer system may perform further analysis on the signals and perform control decisions, and/or generate control signals, and/or log or store results to file.

Figure 11A:
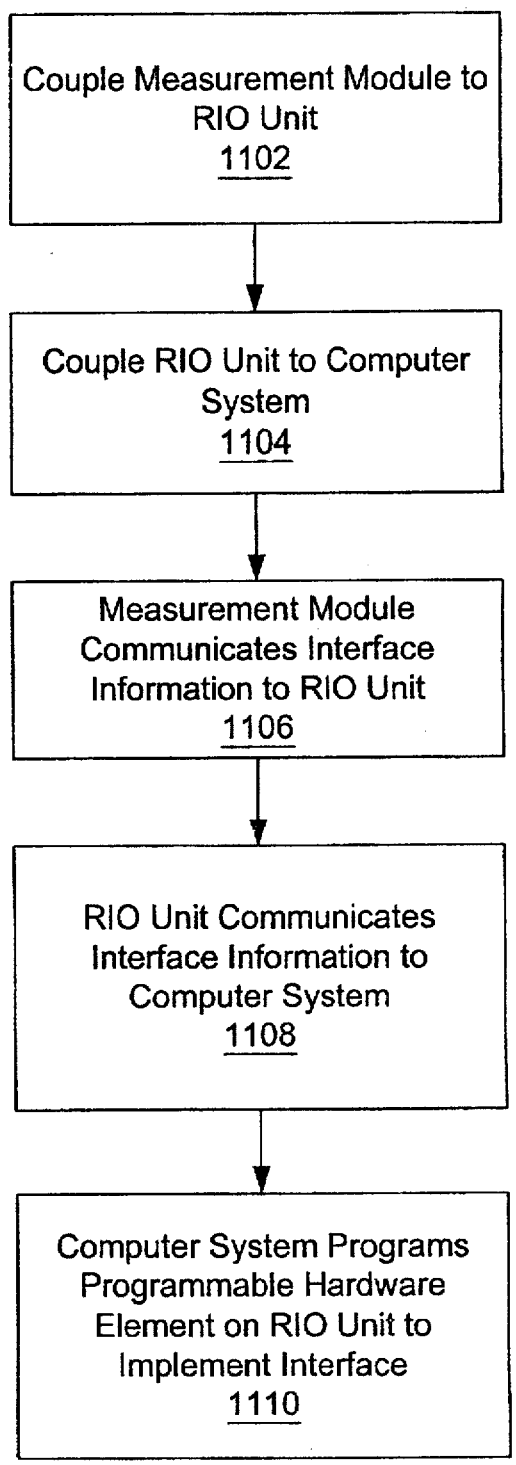
FIG. 11A is a flowchart of a method for configuring a measurement system, according to one embodiment.

FIG. 11A—Method for Configuring a Measurement System

FIG. 11A is a flowchart of a method for configuring a measurement system, according to an embodiment where the RIO device or unit 110 couples to a measurement module. This embodiment corresponds to the embodiments shown in FIGS. 5A, 5B, 6 and 7. It should be noted that in some embodiments, various of the steps may occur concurrently, in a different order than shown, or may be omitted. Furthermore, one or more additional steps may be performed as desired.

As FIG. 11A shows, in 1102 a measurement module 108 may be coupled to a RIO unit 110. For example, the measurement module 108 may be coupled to the RIO unit 110 via a serial bus, a parallel bus, wireless transmission medium, a network, edge connector, or any other communication medium. In a typical embodiment, the measurement module 108 is a card or cartridge that can be inserted into a slot of the RIO unit 110. In this embodiment, the RIO unit 110 may comprise a chassis having a plurality of slots adapted to receive different measurement modules 108.

In 1104, the RIO unit 110 may be coupled to a computer system 102. In one embodiment, the RIO unit 110 may be coupled to the computer system 102 via a serial bus such as an SPI cable. In other embodiments, the RIO unit 110 may be coupled to the computer system 102 through various communication media, including, but not limited to, a serial bus, a parallel bus, wireless transmission medium, a network, edge connector, or any other communication medium. In another embodiment, the RIO unit 110 may include computer system functionality, e.g., the RIO unit 110 may include a functional unit that performs a desired processing function. Similarly, in another embodiment, another of the measurement modules 108C inserted into the RIO unit 110 may include computer system functionality, i.e., the measurement module 108C may itself be a "computer on a card" or a "computer on a chip", and thus may comprise the computer system 102. In these embodiments, step 1104 may be unnecessary.

In 1106 the measurement module 108 may communicate interface information to the RIO unit 110, where the interface information specifies an interface for operating with the measurement module 108. For example, as noted above, the interface information may be in the form of an EDS (Electronic Data Sheet) structure.

In 1108, the RIO unit 110 may communicate the interface information to the computer system 102. Alternatively, the measurement module 108 may communicate the interface information directly to the computer system 102, thus steps 906 and 908 may occur as a single step, where the communication bypasses the RIO unit 110. Note that in the embodiment mentioned above where the module 108C comprises the computer system 102, the interface information may be communicated from the measurement S module 108 to the module 108C (the computer system 102) either directly, or through the RIO unit 110.

Finally, in 1110, the computer system 102 may program a programmable hardware element 106 on the RIO unit 110, thereby implementing the specified interface in the RIO unit 110. After the RIO unit 110 has been programmed, the RIO unit 110 and the measurement module 108 (and optionally the computer system 102) may be together operable to perform a measurement and/or control task or function.

In one embodiment, the method may further include the RIO unit 110 and the measurement module 108 together performing the task or function.

Figure 11B:
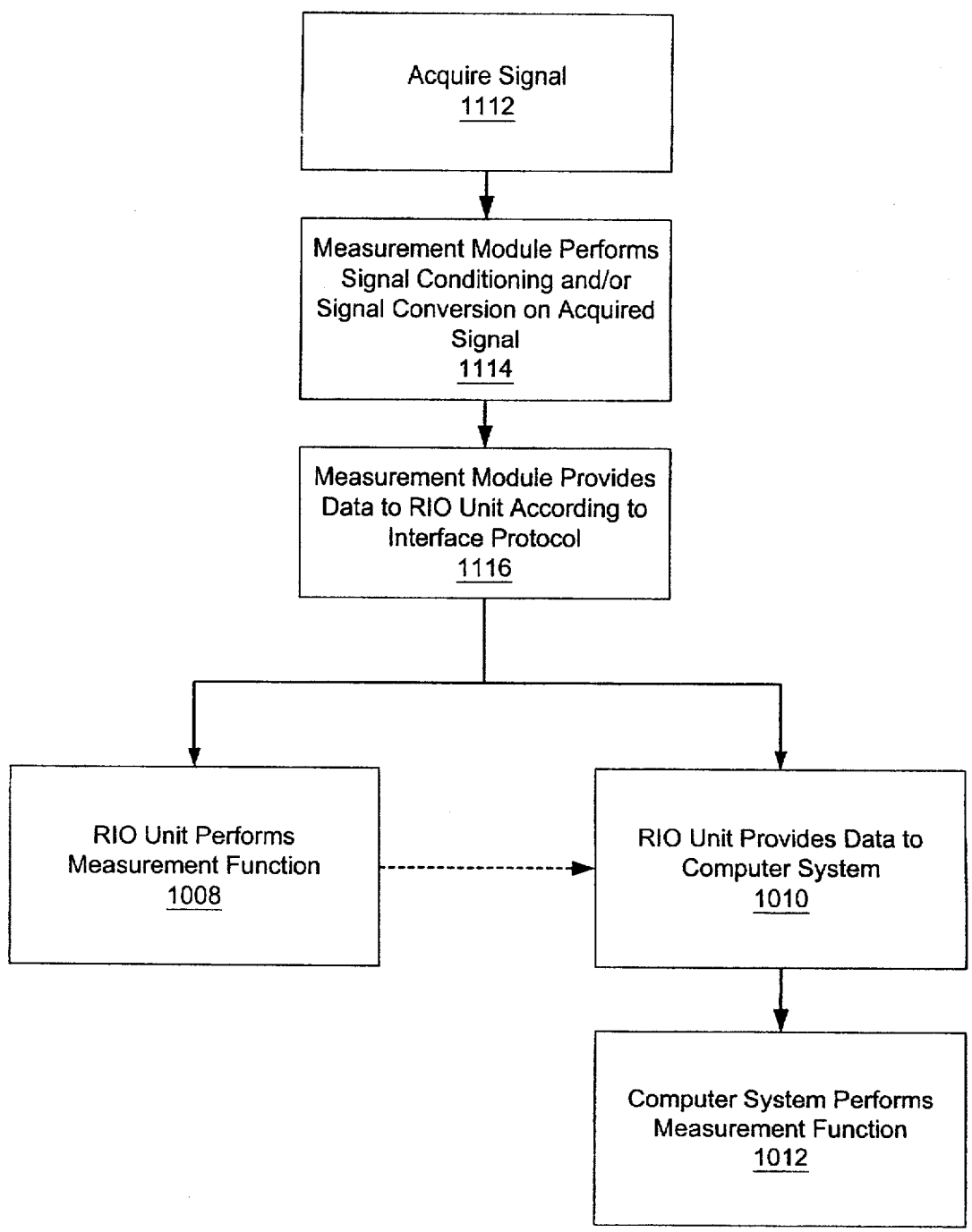
FIG. 11B is a flowchart of embodiments of a method for performing a measurement function, according to one embodiment.

FIG. 11B—Another Method for Performing a Measurement Function

FIG. 11B is a flowchart of a method for performing a measurement function, according to one embodiment of the present invention. FIG. 11B illustrates an embodiment where the RIO unit 110 has been programmed with interface information as described in FIG. 11A. As noted above, in some embodiments, various of the steps may occur concurrently, in a different order than shown, or may be omitted. Furthermore, one or more additional steps may be performed as desired.

In 1112, a signal may be acquired. For example, a measurement module 108 coupled to or comprised in a RIO unit may acquire the signal. The signal may originate from a sensor or actuator 112, or may be transmitted from an external system.

In 1114, the measurement module 108 may perform one or more of signal conditioning and signal conversion on the acquired signal, as described in more detail above. In performing the signal conditioning and/or signal conversion on the acquired signal, the measurement module 108 may generate data, e.g., results data, which may include one or more of the original signal, the conditioned and/or converted signal, or information derived from or generated in response to the signal.

In 1116, the measurement module 108 may provide the data to the RIO unit 110 according to an interface protocol, as described above.

Then, in an embodiment where a programmable hardware element on the RIO 110 has been programmed or configured appropriately, in 1008, the programmable hardware element on the RIO 110 may perform a measurement function, e.g., on the signal or data. In other words, the RIO 110 may perform a measurement function which was programmed into the programmable hardware element. For example, the RIO 110 (i.e., the programmable hardware element on the RIO 110) may perform any of various data processing operations on the data, such as filtering, pattern recognition, or other analysis. For another example, the RIO may generate control signals in response to an analysis of the data, such as to control one or more plant operations.

In another embodiment in which the computer system 102 comprises measurement software for performing a measurement function, in response to 1116 above, the RIO unit 110 may provide the data to the computer system 102, as indicated in 1010. Then, in 1012, the computer system 102 may perform the measurement function, e.g., on the signal, where the measurement function may include, measurement (including data acquisition) and/or control functions, as described above.

In yet another embodiment, the RIO unit 110 may perform a substantial portion of the measurement function, as indicated in 1008, then pass the results to the computer system 102, as shown in 1010, after which the computer system 102 may perform the remainder of the measurement function. For example, after a first pass measurement analysis by the RIO unit 110, the computer system may perform further analysis on the signals and perform control decisions, and/or generate control signals, and/or log or store results to file.

Figure 12:
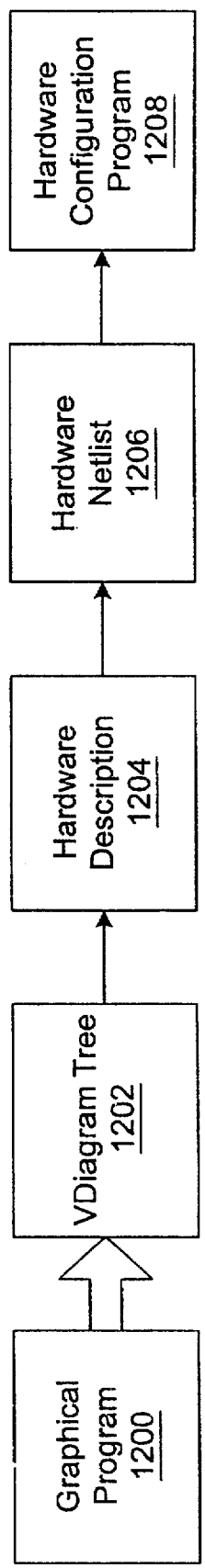
FIG. 12 illustrates the conversion of a graphical program to a hardware implementation.

FIG. 12—Conversion of a Graphical Program into a Hardware Configuration Program

FIG. 12 is a block diagram illustrating the conversion of a graphical program, such as a graphical image processing or machine vision program, into hardware and software descriptions, i.e., the deployment of the program, as mentioned above in step 1014 of FIG. 10B. The conversion may be performed by one or more deployment or conversion programs, preferably executing on the computer system 102. The graphical program 1200 may comprise graphical code, such as interconnected function nodes or icons. The graphical code in the graphical program may use graphical data flow, graphical control flow and/or graphical execution flow constructs, as noted above. On a display, the graphical program may be represented as interconnected icons or function nodes. In the memory of the computer system, the graphical program 1200 may comprise data structures (or scripts or code) representing functional operations, data flow, control flow, and/or execution order. As the user assembles the graphical program on the display, e.g., by selecting, arranging, and connecting various icons or function nodes on the display, the data structures (or scripts or code) may be automatically created and stored in memory. It should be noted that although a conversion of a graphical program into hardware and software descriptions is described, a text based program may similarly be converted into hardware and software descriptions.

The graphical program 1200 may be created with various development tools. For example, the graphical program may be created using the following development systems: LabVIEW, BridgeVIEW, DASYLab, Visual Designer, HP VEE (Visual Engineering Environment), Snap-Master, GFS DiaDem, ObjectBench, Simulink, WiT, Vision Program Manager, Hypersignal, VisiDAQ, VisSim, Truly Visual, and Khoros, among others. In the preferred embodiment, graphical program 1200 is a LabVIEW graphical program or virtual instrument (VI).

In one embodiment, programs of the present invention may create a VDiagram tree 1202 from the data structures of the graphical program 1200. The VDiagram tree 1202 is an abstract hardware graph which represents at least a portion of the graphical program 1200. The graph may be organized in a way that facilitates the generation of specific types of descriptions by back end programs of the present invention. In one embodiment, the graphical programming system automatically creates and stores a VDiagram tree 1202 (abstract hardware graph) in response to a user's creation of a graphical program. In this instance, conversion from graphical program data structures to a VDiagram tree is not necessary.

A hardware description 1204 may be generated from the abstract hardware graph 1202 by a back end program. The hardware description 1204 may be in any of various hardware description languages such as VHDL, EDIF, and Verilog. In the preferred embodiment, the hardware description 1204 comprises one or more VHDL files. A hardware netlist 1206 may be generated from the hardware description using various synthesis tools. As noted above, the term "netlist" comprises various intermediate hardware-specific description formats comprising information regarding the particular hardware elements required to implement a hardware design and the relationship among those elements. In the preferred embodiment, the hardware netlist 1206 is an FPGA-specific netlist. The hardware netlist 1206 is used to create a hardware configuration program 1208. The hardware configuration program 1208 may be used to configure one or more functional hardware devices or hardware elements which are configured to execute the portion of the graphical program 1200 that is represented by the abstract hardware graph 1202.

The hardware element configured with the hardware configuration program may comprise any of various devices. For example, the hardware may comprise a programmable logic device (PLD) such as an FPGA or CPLD. However, in other embodiments, the hardware may comprise other types of hardware devices, such as a traditional circuit board which is created using the hardware netlist (i.e., in accordance with the netlist). In the preferred embodiment, the hardware is an interface card comprising an FPGA, where the interface card is comprised in the computer system where the graphical program 1200 is created. The hardware may also be comprised in an external device connected to the computer system where the graphical program 1200 is created. The hardware may be connected to the computer over an external serial or parallel bus, or over a network, such as the Internet.

Figure 13:
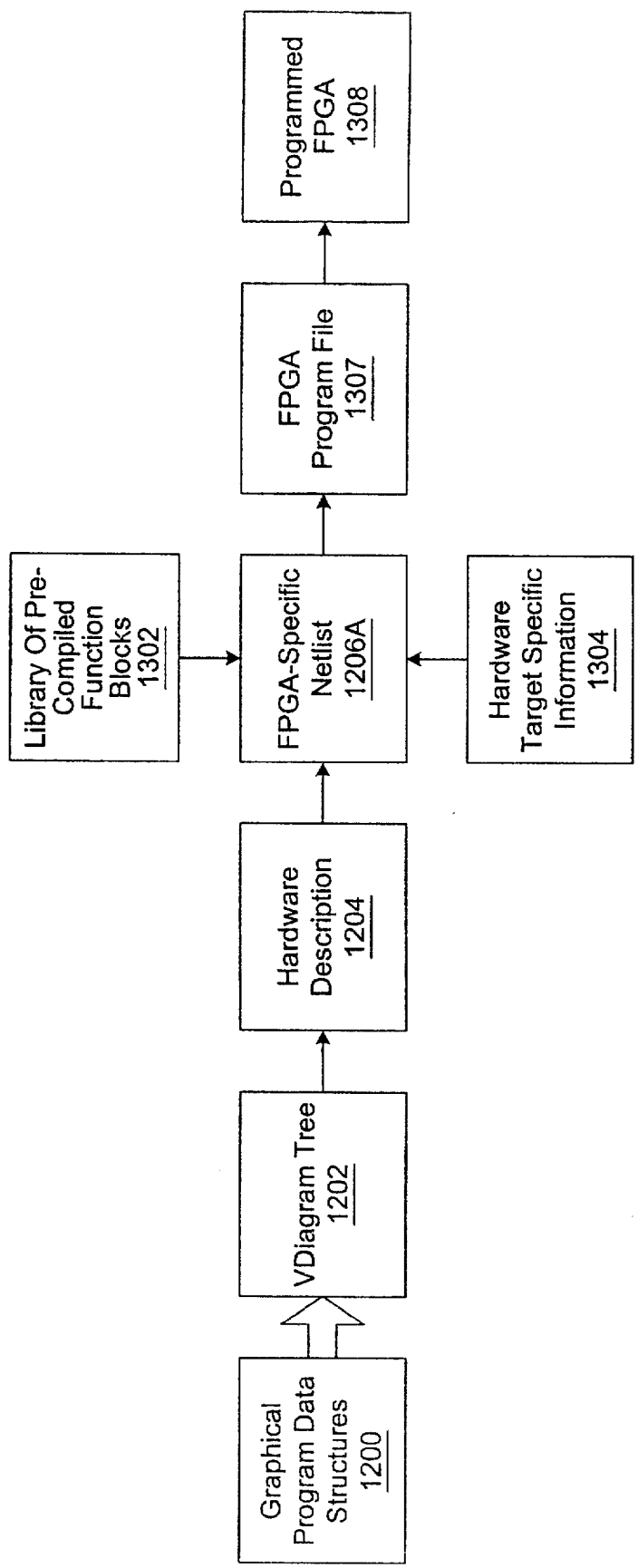
FIG. 13 illustrates the conversion of a graphical program into a hardware description and the use of the hardware description to program an FPGA.

FIG. 13—Block Diagram of Conversion of a Graphical Program into a Hardware Description for an FPGA FIG. 13 illustrates the exportation of at least a portion of a graphical program 1200 into a hardware description and the use of the hardware description to program an FPGA, i.e., the deployment of the program, as mentioned above in steps 904 and 906 of FIG. 9. As mentioned above with reference to FIG. 12, the exportation may be performed by one or more deployment or conversion programs, preferably executing on the computer system 102. As also described above with reference to FIG. 12, the VDiagram tree 1202 shown in FIG. 13 comprises information representing the graphical program 1200, including the functional operations of the program. As described in detail below, the VDiagram tree comprises VDiagrams, each of which may maintain a list of components. This list of components may include components which represent functional operations.

A back end program converts the VDiagram tree 1202 to a hardware description 1204. Back end programs may implement the functionality of the components in the VDiagram component lists using constructs of their respective description languages. For example, a VHDL back end may create VHDL code to implement a component that performs a particular mathematical algorithm such as an exponential calculation. However, in one embodiment, such functional components are simply referenced as library components.

FIG. 13 illustrates one embodiment in which the VDiagram tree references one or more library components. One embodiment of the present invention comprises pre-compiled function blocks 1302 which implement these library components for particular hardware devices such as FPGAs. Various FPGA netlist synthesis tools may be called or used to generate an FPGA netlist 1206A from the hardware description 1204. These synthesis tools may incorporate the pre-compiled function blocks 1302 into the FPGA netlist 1206A. Also, as shown, the synthesis tools may utilize hardware target-specific information 1304 in creating the netlist. For example, the exact form that the FPGA netlist takes may depend on the particular type of FPGA that will use the netlist, since FPGAs differ in their available resources.

An FPGA bit stream program file (hardware configuration program) 1307 may be generated from the FPGA netlist 1206A using readily available synthesis tools. This FPGA program file 1307 may be uploaded to an FPGA 1308. The FPGA 1308 may be comprised in a hardware device such as an interface board. After being programmed with the program file 1307, the FPGA is able to execute the portion of the graphical program 1200 that is exported to the hardware description 1204. If the entire graphical program is not exported to the hardware description, then a portion of the program may execute on the general purpose CPU of the computer system. This portion preferably comprises the supervisory control and display portion of the program.

Figure 14:
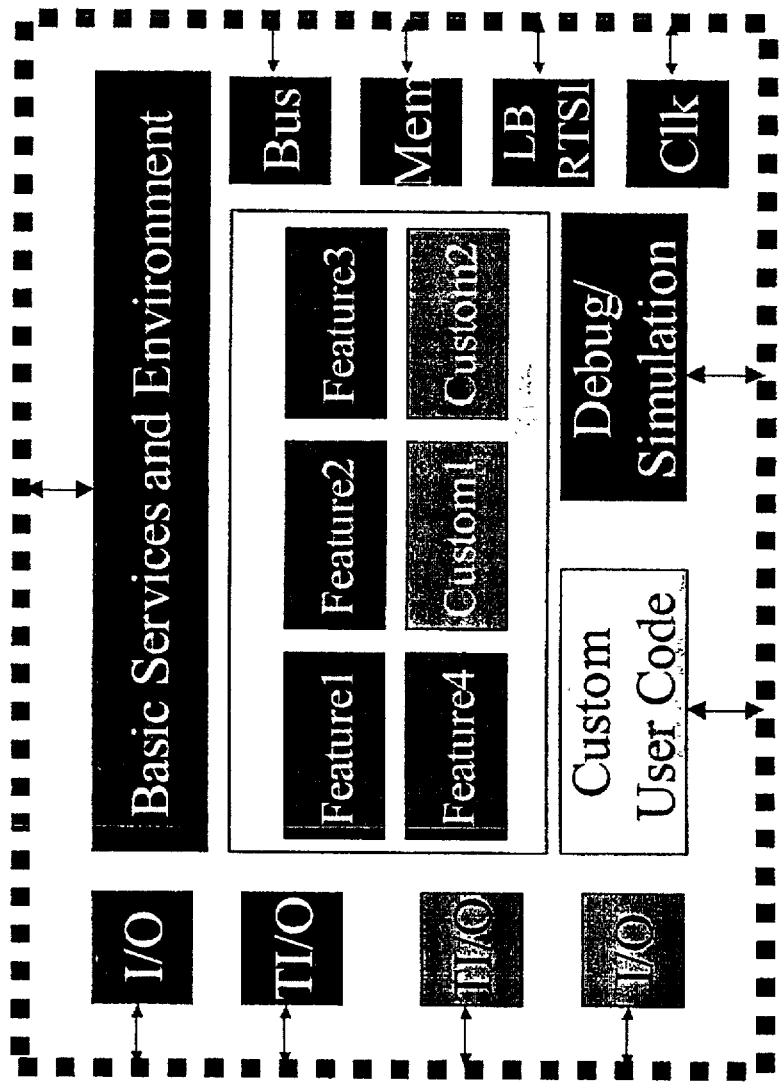
FIG. 14 is a block diagram of a RIO FPGA layout, according to one embodiment.

FIG. 14—Block Diagram of a RIO FPGA Layout

FIG. 14 is a block diagram of a RIO FPGA layout, according to one embodiment of the invention. As FIG. 14 shows, the FPGA 106 may be configured to include a number of I/O and timed I/O elements for sending and receiving signals. The FPGA 106 may also be configured to include one or more of a bus, memory, such as a FIFO, a RTSI real time triggering bus, as is well known in the art, and a clock, as FIG. 14 shows. Furthermore, the FPGA 106 may include various configured features or components (Feature1-Feature4) which may be provided by the vendor, e.g., from a library of pre-defined functions, described below. As FIG. 14 also shows, the FPGA 106 may be configured with basic services and environment functionality which may be operable to perform various basic, infrastructure, or support services to the FPGA to aid in the performance of the user's application.

The FPGA 106 may further include one or more custom functions (Custom1 and Custom2) defined by the customer or user to perform one or more functions specific or unique to the user's application, as well as custom user code for providing custom interface functionality, such as between the custom functions on the FPGA and external system, or between the FPGA and custom software and/or hardware specific to the user's system or application.

Finally, as indicated in FIG. 14, the FPGA may include debug/simulation functionality which may facilitate design and debugging operations in a simulation environment on the host computer system 102, as described below with reference to FIGS. 15 and 16.

Note that the FPGA layout described above is meant to be illustrative only, and is not intended to limit or constrain actual FPGA implementations or layouts to any particular form or function.

Figure 15:
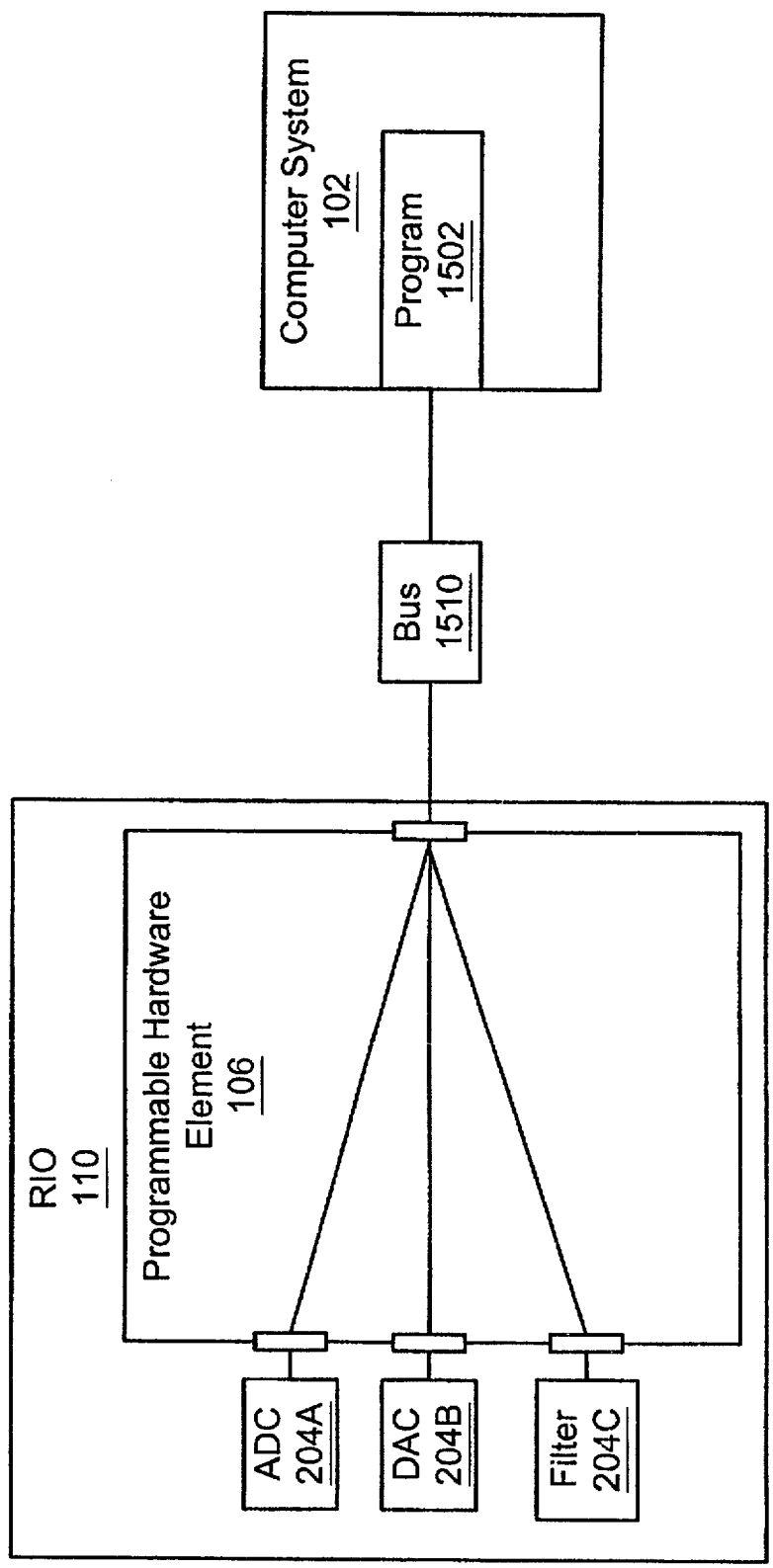
FIG. 15 is a block diagram of a system for debugging a reconfigurable system, according to one embodiment.

FIG. 15—Debugging a Programmable Hardware Based System

In computer software and hardware development, debugging is the process of locating, fixing, or bypassing "bugs" (errors) in computer program code or the engineering of a hardware device. Debugging a program or hardware device may involve identifying a problem, isolating the source of the problem, and then fixing it. A user of a program that does not know how to fix the problem may learn enough about the problem to be able to avoid it until it is permanently fixed.

Debugging is a necessary process in almost any software or hardware development process, whether a commercial product or an enterprise or personal application program. For complex products, debugging may be performed for the smallest unit of a system, again at component test when parts are brought together, again at system test when the product is used with other existing products, and again during customer beta test, when users try the product out in a real world situation. Because most computer programs and many programmed hardware devices contain thousands of lines of code, almost any new product is likely to contain "bugs".

The general approach to developing a programmable hardware element based system with fixed hardware resources (such as a RIO system) is to develop a program for performing a function in a development environment, such as National Instruments LabVIEW graphical development environment, convert the program into a form suitable for loading onto the programmable hardware element 106, e.g., an FPGA program file (hardware configuration program), load the converted program onto the programmable hardware element 106, test the system by performing the function, observe the results, and iterate the above process until the performance of the function is correct and complete.

For example, National Instruments LabVIEW FPGA is a technology that creates a hardware implementation of a diagram created using the LabVIEW development environment. This allows the user to create a program, i.e., a graphical program or diagram, using the standard LabVIEW primitives for algorithms, looping, timing, triggering, etc., coupled with new I/O primitives to define the behavior of the target hardware. The typical approach used by LabVIEW users is to iterate on the design using a fast failure approach: Implement a basic design and try it. If it doesn't work make a small change and try it again. Continue with this process until the desired results are achieved.

The difficulty with this approach when targeting hardware is due to compile times. Typical compile times for creating software in LabVIEW are measured in seconds, or milliseconds, whereas typical compile times for programming hardware in LabVIEW range from minutes to hours. Thus, it is not efficient or feasible for many users to make a small change and wait hours to see the results. The system presented below, referred to as the "Ghost" system, is a mechanism to provide the compile time advantage of a software target with the real world connectivity of the hardware environment. It is noted that although the system and method are described primarily in terms of a measurement system, the approach is broadly applicable to any system which uses a programmable hardware element in conjunction with one or more fixed hardware resources, including, but not limited to measurement (including data and image acquisition), control (including automation), and simulation, among others.

In one embodiment, there are two main components to the solution. The first is a test feed-through configuration that is precompiled for the hardware target, and provides low level access to the fixed hardware resources on the RIO device (e.g., reconfigurable board). In other words, when deployed on the programmable hardware element, the test feed-through configuration provides for communication between the program and the fixed hardware resources on the reconfigurable board. This is a general configuration and preferably does not vary based on user application. The second component is a set of I/O primitives, such as a set of standard LabVIEW I/O primitives, for the fixed hardware resources. When targeting the hardware these I/O primitives and the standard LabVIEW primitives may be converted into a hardware representation, such as an FPGA program file (hardware configuration program), as described above with reference to FIGS. 12 and 13, and may take considerable time to compile. When targeting the test or simulation environment, also referred to as the Ghost environment, the standard LabVIEW primitives may remain in software and run on the host computer, and thus compile very quickly. The I/O primitives may also remain in software, but redirect their functionality to the precompiled test feed-through configuration in hardware.

During execution in software, the I/O primitives may communicate through the FPGA 106 to the various fixed hardware resources 204. Thus the fixed hardware resources 204 are actually invoked and used during the simulation. As an example, assume a first portion of a function is executed directly on an FPGA 106, and a second portion of the function is implemented by fixed hardware resources 204 under control of the FPGA 106. The simulation method described herein executes the first portion in software on the host computer system 102, and the software invokes the fixed hardware resources 204 to implement the second portion of the function. Thus the fixed hardware resources 204 are invoked just as if they were being invoked directly by the FPGA 106.

For example, consider a typical PID loop using an analog input and an analog output. This is commonly constructed as a while loop containing an I/O primitive for reading the analog input, the PID algorithm itself, and an I/O primitive for writing the analog output. When targeting hardware, all of these constructs may be converted to hardware and downloaded to the RIO device 110. When targeting the "Ghost" (simulation) environment, the precompiled test feed-through configuration may be quickly downloaded to the board, and the while loop and PID algorithm may remain in software. As the diagram or program executes in software on the host, whenever an I/O primitive s called it communicates with the RIO device 110 to interface to the actual hardware I/O.

A key advantage to this solution is that software based debugging methodologies may be used for debugging the diagram (program) while retaining connectivity to real world signals that the hardware targeted application would provide. This functionality may be provided without any changes to the user's application and may be completely transparent. Therefore, the user may debug most functional issues related to the application or system, and so may concentrate primarily on timing issues after performing a full compilation.

In one embodiment, the test feed-through configuration may be extended to utilize a micro-controller implemented or configured in the FPGA 106. In other words, a processor (e.g., a micro-controller) may be implemented on the FPGA 106, then the program may be compiled for the FPGA-implemented processor. Compilation for the FPGA-implemented processor is similar to compilation for software executing on the host computer. The program may then be executed on the FPGA-implemented processor (while maintaining the original I/O capabilities of ghost), and so any timing issues arising from sharing the processor of the host computer system may be avoided.

FIG. 15 is a block diagram of one embodiment a system for debugging a programmable hardware element based measurement and/or control system, such as a RIO system 110, where the system includes a programmable hardware element 106 and one or more fixed hardware resources 204, as described above.

As FIG. 15 shows, the system includes a programmable hardware element 106, as described above. The programmable hardware element 106 includes one or more fixed hardware resources 204, here shown as an ADC 204A, a DAC 204B, and a filter 204C. The programmable hardware element 106 may be coupled to a host computer system 102 via a bus 1510, as shown. The computer system 102 preferably stores a measurement/control program 1502 which specifies or represents a measurement and/or control function, as described above.

As indicated by FIG. 15, the programmable hardware element 106 may be configured or programmed with the test feed-through configuration which provides connectivity between the program 1502 executing on the computer system 102 and the fixed hardware resources 204. It should be noted that the configuration denoted by the connections in the FPGA 106 are illustrative only, and is not meant to be an actual configuration.

Figure 16:
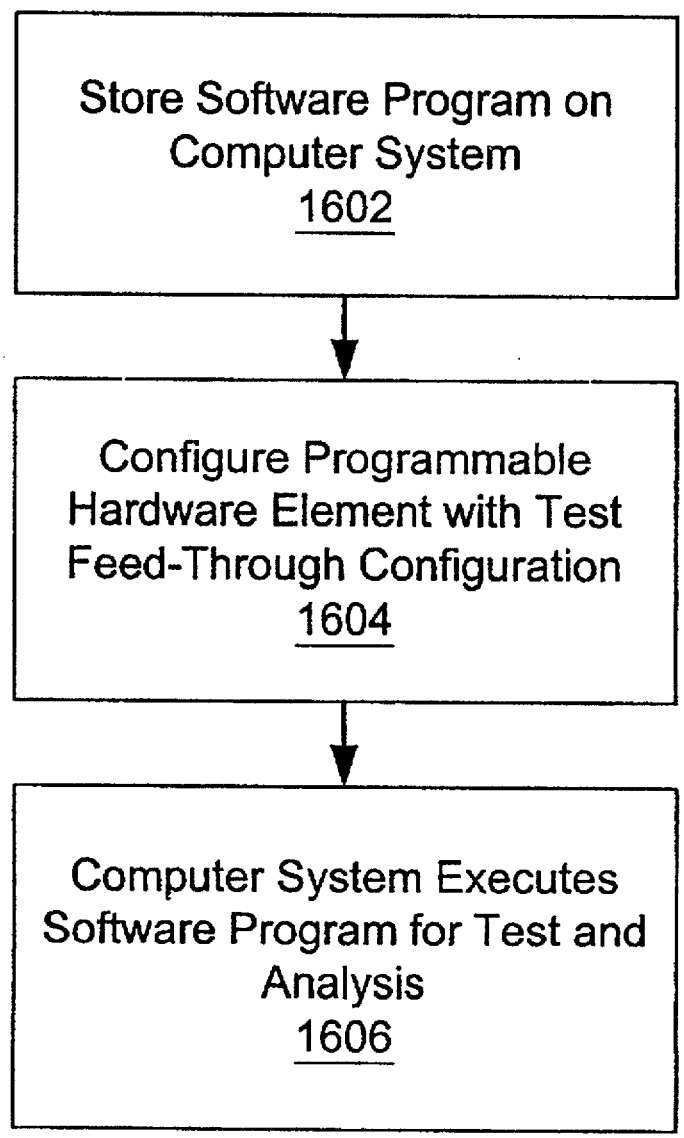
FIG. 16 is a flowchart of a method for debugging a reconfigurable system, according to one embodiment.

FIG. 16—A Method for Debugging a Reconfigurable System

FIG. 16 is a flowchart of one embodiment of a method for debugging a reconfigurable system. The system includes a programmable hardware element 106 coupled to one or more fixed hardware resources, and a computer system 102 coupled to the programmable hardware element 106. As noted above, in some embodiments, various of the steps may occur concurrently, in a different order than shown, or may be omitted. Furthermore, one or more additional steps may be performed as desired.

In 1602, a program 1502 may be stored on a memory of the computer system 102. The program 1502 preferably specifies a function, where the program is operable to be converted into a hardware configuration program and deployed on the programmable hardware element 106 to perform the function. In other words, as in the systems described above, the program 1502 is meant to be deployed on the programmable hardware element, after which the programmable hardware element may be operable to perform the function in conjunction with one or more fixed hardware resources, as described above. As mentioned above, deploying the program 1502 may comprise converting the program 1502 into a hardware configuration program. It is again noted that the hardware configuration program specifies usage of the one or more fixed hardware resources by the programmable hardware element (in performing the function). It should also be noted that the hardware configuration program may be a bit file, an FPGA program file, a netlist, or any other type of hardware configuration program or file.

In 1604, the programmable hardware element 106 may be configured with a test feed-through configuration. The test feed-through configuration may be stored in host computer memory in a pre-compiled format, and thus may be quickly downloaded to the programmable hardware element 106. After configuration with the test feed-through configuration, the programmable hardware element 106 is operable to provide for communication between the program and the one or more fixed hardware resources 204.

In one embodiment a "simulation" bus (not shown) located on the RIO device 110 and external to the program hardware element 106 may be selectively coupled between the bus 1510 and the fixed hardware resources 204. Thus, instead of configuring the programmable hardware element 106 with a test feed-through configuration, the "simulation" bus may be switched or multiphased in to provide the desired connectivity.

Finally, in 1606, the computer system may execute the program for test and analysis, where executing the program includes the program communicating with the one or more fixed hardware resources through the programmable hardware element 106. In other words, the computer system 102 may execute the program 1502 while maintaining connectivity with the one or more fixed hardware resources 204 via the test feed-through configured programmable hardware element 106, and thus interacting with the "real world" signals and behavior of the hardware resources 204.

In the preferred embodiment, the test feed-through configuration is pre-compiled, so that the programmable hardware element may be configured without having to perform a lengthy compilation. It should be noted that the debugging system and method described herein is applicable to any reconfigurable system using a programmable hardware element (or any other type of functional unit, including a processor/memory unit, FPGA, or any other configurable/ programmable hardware). For example, the program may be any of a measurement program which is executable to perform a measurement function, an automation program which is executable to perform an automation function, a control program which is executable to perform a control function, and a simulation program which is executable to perform a simulation function, among others.

Figure 17:
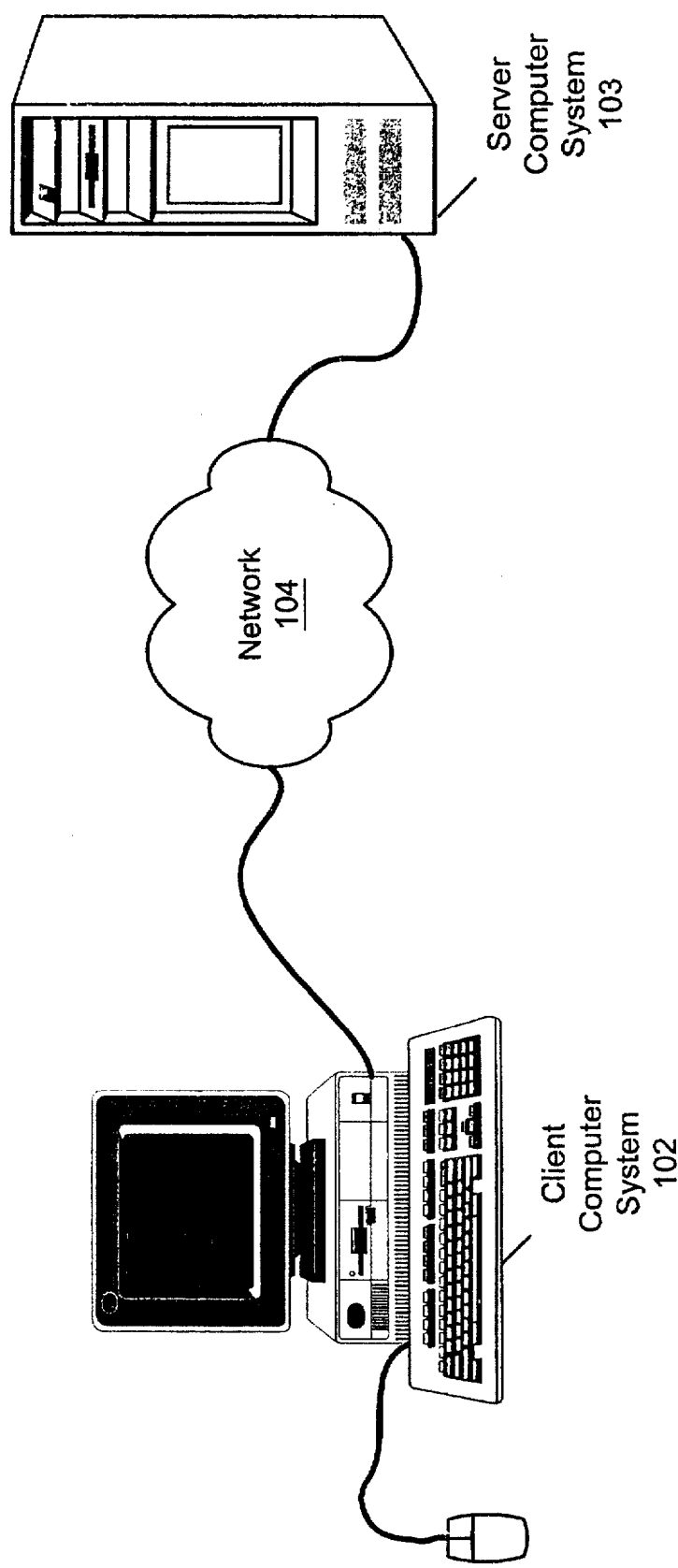
FIG. 17 illustrates a client/server system, according to one embodiment.

FIG. 17—A Configuration Tool for User Configuration of a RIO System

In one embodiment of the present invention, a configuration tool may be used to configure the RIO system 110. For example, the configuration tool may comprise one or more programs implementing a configuration wizard. The wizard may be operable to lead a user through the configuration process, receiving user input specifying the user requirements for the system, and generating a hardware configuration program for deployment on the RIO device 110. In one embodiment, the configuration tool (e.g., the wizard) may also be operable to deploy the hardware configuration program onto the RIO device 110. After development and/or deployment of a hardware configuration program, the user may return to the configuration wizard to make modifications or adjustments.

The configuration wizard program may thus operate to receive user input specifying or characterizing the RIO system configuration. The wizard may then generate the hardware configuration program and deploy the hardware configuration program onto the RIO device 110. The configuration wizard program may take various forms and may be operable to receive various types of user input.

In one embodiment, the configuration wizard program may present one or more graphical user interfaces (GUIs) for receiving user input specifying or characterizing the RIO system configuration. This user input may then be used in creating the desired hardware configuration program. The configuration wizard program may take various forms, and one exemplary embodiment is described herein. As another example, the configuration wizard program may be similar to the IMAQ VisionBuilder program available from National Instruments Corporation.

In one embodiment, the hardware configuration program may be created directly from the configuration wizard program user input. In another embodiment, a source code program may first be created by the configuration wizard program based on the user input received to the wizard. The source code program may either be graphical program source code or textual source code. This source code program may be an intermediate form used in creating the hardware configuration program. In one embodiment, the user may be able to modify or edit this source code program to further specify desired operation of the RIO device. After any desired editing of the source code program, the hardware configuration program may be created based on the modified source code program. Thus the user may be able to specify general desired operation of the RIO system using a high level GUI-based wizard, and then may be able to further specify details of the desired RIO operation by modifying source code created based on the input to the high level GUI-based wizard.

As another example, the configuration wizard program may be a graphical programming development environment wherein the user creates a graphical program to specify or characterize the RIO system configuration. Exemplary graphical programming development environments include LabVIEW, Simulink, Agilent VEE, SoftWIRE, VisSim, etc. As another example, the configuration wizard program may be a text-based programming environment, wherein the user creates textual source code to specify or characterize the RIO system configuration. Exemplary text-based programming environments include VisualBasic, Visual C++, Delphi, and Measurement Studio from National Instruments.

As another example, the configuration wizard program may be a development environment that utilizes conventional hardware synthesis, selection from a library of pre-generated files, and/or direct implementation in an FPGA, or combinations thereof, etc. For example, the configuration wizard program may be a synthesis tool.

The configuration wizard program may thus be any of various types and may be operable to directly create a hardware configuration program through a variety of user input. The user input may include high level "wizard-like" GUI input, source code input (graphical or textual source code), a synthesis tool, a HDL tool, or combinations thereof.

In one embodiment, the configuration wizard program may be operable to receive user input of various types. For example, the configuration wizard program may first provide various GUI panels which receive input from the user specifying a high level configuration of the desired RIO system. The configuration wizard program may then programmatically generate program source code (graphical or textual source code), or a graphical representation that is similar to program source code, based on the user input to the GUI panels. The user may then provide further user input modifying the program source code, wherein these source code modifications further specify the desired RIO configuration. The configuration wizard program may then programmatically generate a hardware description based on the program source code. The user may then provide further user input to the hardware description, e.g., by using a synthesis tool.

In one embodiment, operations for creation and deployment of the hardware configuration program may occur on the customer or client computer system 102, as shown in FIG. 1A. The client computer system 102, shown coupled to the RIO device 110, may store and execute a configuration wizard program to receive user input specifying or characterizing the system configuration. The wizard may then generate the hardware configuration program and deploy the hardware configuration program onto the RIO device 110 (i.e., the FPGA 106 in the RIO device 110). The advantage to this approach is that the customer does not need to be connected to a vendor server. However, if software updates are required, for example, for backend tools or third party tools used in the process, it may be necessary to request the customer to perform the updates.

In another embodiment, a vendor may operate or host the configuration wizard on a server computer system, such as an e-commerce server, which may be accessible to users (i.e., customers) over a network, e.g., the Internet, as shown in FIG. 17. As indicated in FIG. 17, client computer system 102 may be coupled to a server computer system 103 over a network 104, such as the Internet. The configuration wizard program may be stored and executed on the server computer 103. Software executing on the client computer system 102 (e.g., a browser program) may be used to access the server 103 (i.e., the configuration wizard). The user may thereby engage the configuration wizard remotely to specify a configuration of the RIO system, and to download or deploy the resulting hardware configuration program generated by the configuration wizard onto the RIO device 110. In one embodiment, the vendor server may provide sales and purchasing services to the customer in addition to system configuration.

In one embodiment, the server program (configuration wizard) may present a graphical user interface (GUI) to the user on the client computer system 102 and receive input therefrom specifying user requirements for the system to be configured. Further description of the configuration wizard GUI is provided below with reference to FIGS. 18–21.

In one embodiment, the user, or software executing on the user (customer) computer 102, may generate a description file indicating resources and features the user requires or has selected, and may submit the description file (possibly through an Internet interface) to the server 103, i.e., the vendor server 103. Then, another computer program, e.g., executing on the server 103 or on a different computer system coupled to the server 103, may analyze the description file and return a hardware configuration file, (and optionally documentation in the form of a G program) to the customer. One advantage to this approach is that the amount of software required on the customer computer is relatively small, and control of updates and run-time issues may be maintained by the vendor.

As described above, the RIO architecture provides a reconfigurable solution for adapting or customizing a measurement product to application requirements. There are several different approaches or support levels for performing the customization, each targeting a different class of users. For example, a basic support level may include providing precompiled hardware configurations from which the user may select a solution. This approach offers the least flexibility, but simplifies the choices that the user may consider. This approach may in many ways be considered a parameterized solution, in that the pre-defined nature of the hardware resources is very structured, with well defined acquisition modes and functionality. In other words, what the user does with the data (e.g., in LabVIEW) is very flexible, but the interface (e.g., the wizard) essentially accepts parameters to control its operation.

In contrast, another embodiment of the invention offers very little pre-defined structure. This embodiment mixes program primitives, e.g., LabVIEW primitives, with low level I/O, and allows for the construction of timing, triggering, inline processing, and more. These building blocks can be pieced together to create the same functionality as the existing solutions, as well as much more capable operations. These blocks can often be combined in different ways to provide similar solutions, but one may be preferable to the other in terms of extensibility, resource utilization, etc. Thus, in this embodiment, a development environment for configuring programmable hardware elements, e.g., LabVIEW FPGA, may be provided to the user, who may then create any arbitrary diagram or program as needed. This approach offers the greatest flexibility, but requires a more sophisticated user.

In one embodiment, as mentioned above, a configuration wizard may bridge the gap between flexibility and ease of use. For example, in one embodiment, the wizard may provide a drag and drop interface for creating the user defined RIO configuration. In another embodiment, the wizard may provide a menu and/or button based graphical interface for creating the user defined RIO configuration. In yet another embodiment, the wizard may provide a list or diagram of available resources, e.g., low level interface primitives such as AI, AO, and DIO, as well as a list or diagram of higher level functions that can be applied to these low-level primitives, including higher level interface functions such as counters built on top of DIO lines, or inline processing such as linearization or filtering for AI lines.

The user may select the resources required by an application, and configure any resources as necessary (for example, setting gain parameters on an analog input resource) using the configuration wizard. For another example, the user may be building a motion control application containing a main control loop (analog output for command, quadrature encoder for feedback) for a servo motor and a temperature monitoring loop (analog input for a thermocouple) for the power electronics. The user may first select low level resources, including, for example, two digital inputs, an analog output, and an analog input. In one embodiment, the selections may be hierarchical, and may allow the user to add the higher level interface or inline processing in the same window. The user may then identify the timing and triggering requirements of the application, selecting from the resources identified/created in the previous step.

As mention above there are a number of approaches for creating the appropriate configuration for the configurable core (i.e., the programmable hardware element 106) based on information provided from the wizard. The various approaches to generation of the FPGA hardware configuration program differ primarily in which parts execute on the user computer system 102. In each of these approaches a description file is preferably generated which uniquely identifies resources and features the user has selected. From this description file, G code (graphical code, i.e., National Instruments G graphical programming language) may be generated. HDL code may then be generated from the G code, or directly from the description file. A program binary file, i.e., a hardware configuration program, for the FPGA may then be generated from the HDL code. In these approaches, caching schemes are preferably used so that the number of compilations may be minimized.

In one embodiment, specific features (as opposed to complete configurations) may be pre-compiled in such a way that they may be assembled or composed quickly into an appropriate configuration at the customer site. The advantage of this approach is that most of the relative placement and routing has been done up front, and so only a "quick" replacement and rerouting is needed to put the configuration together. In another embodiment of this approach, a set or library of complete configurations may be maintained and made available to the customer for a wide variety of applications. The user may select a best solution (i.e., configuration), then make modifications as needed.

Thus, in a preferred embodiment, one or more configuration wizards may generate graphical programs, e.g., LabVIEW diagrams based on customer entered requirements that are architecturally more scaleable to allow for changing customer requirements.

For example, suppose a customer wants to create a basic post-triggered acquisition. This is a simple task that may be implemented in several ways. The customer chooses a for loop as the basic counting structure. Later, the customer decides to add pre-triggering, and further decides that a while loop with a small state machine in a shift register is a better approach and redraws the diagram. Finally, the customer decides that a minimum number of pre-trigger points is required, and redraws three loops: a for loop for the minimum number of points, a while loop to wait for the post-trigger, and another for loop for the post-trigger points. A common recommended diagram structure for these common or classic applications may greatly speed the customer's development task.

In one embodiment, typical applications may be grouped into a small number of classes. A wizard for each of these classes may be provided which queries the user about the application, then builds an appropriate LabVIEW diagram for the application. In one embodiment, there may be two aspects to this solution. The first is the definition of the classes and corresponding data structures. The second is the collection of wizards. In one embodiment, the wizards may use scripting, such as LabVIEW scripting, to generate the graphical programs or diagrams for each class of application.

Thus, representative diagrams of user applications, including timing, triggering, and data transfer to the host may be developed and grouped into classes. The different diagrams in a given class preferably have very similar structure. For example, a diagram for timed acquisition of analog input channels may look nearly identical to a diagram for timed acquisition of analog and digital input channels, even though it is possible to draw the diagrams very differently. A configuration wizard for each class may then be provided which may generate the appropriate graphical program in response to user input specifying a particular application or function.

EXAMPLE

A customer wishes to implement a control loop with National Instruments LabVIEW RT for an algorithm and LabVIEW FPGA for the timing and triggering. A control wizard may query the user about the I/O structure: How many synchronous analog inputs, analog outputs, digital inputs, digital outputs, and counters are in the system? How many asynchronous channels are in the system?

After receiving user input answering these queries, the control wizard may script a diagram with just the I/O the customer needs, as well as the required controls and indicators. The customer may then focus on the LabVIEW RT control algorithm instead of low level I/O details. If the customer discovers later that further customization of the timing and triggering is needed, the LabVIEW FPGA diagram may be modified directly.

In one embodiment, wizards may only include support for rudimentary functionality. In other words, wizards for basic acquisition, control loops, hardware in the loop testing, etc., may be provided. In another embodiment, the wizards may provide broad functionality in their respective areas of application. For example, in one embodiment, an acquisition wizard may only support pre- and post-triggering. In another embodiment, the acquisition wizard may also support external conversion, hardware gating, and other more advanced functionality.

Thus, in one embodiment, configuration wizards may be provided for basic timing and triggering functionality, without a broad application focus. In another embodiment, application-specific wizards may be provided, possibly built on top of the timing and triggering wizards.

In one embodiment, a wizard may provide a palette of basic I/O components and allow the user to select a variety of components and configure them individually. In one embodiment, the wizard may provide substantially the same user experience for progressively more complex components. Thus, the available features selectable by the user include a combination of the simple I/O components and complex structures. In one embodiment, the wizard may be upgradeable with new features as they are developed. Thus, the wizard may allow the user to collect various blocks into a configuration, and to configure these blocks and the resulting configuration to the user's specific requirements.

In one embodiment, the wizard may be based on a standard configuration framework, such as National Instruments Workshops framework, and may host a configuration VI (Virtual Instrument) or diagram provided for each selectable feature. The diagrams of each selected feature may be combined (by the wizard) into a single diagram. In one embodiment, after the final diagram has been constructed or assembled, the wizard may contact a compile server automatically, and a compiler program, such as LabVIEW FPGA, may be used to create a hardware configuration program, e.g., a bit file.

Thus, the use of one or more configuration wizards may provide an easy to use interface which allows the user or customer to configure or construct custom configurations for a reconfigurable system (i.e., the programmable hardware element in a RIO system 110). More specifically, a wizard may provide the user access to configurable RIO functionality without the user having to be familiar with a particular development environment, such as LabVIEW.

Figure 18:
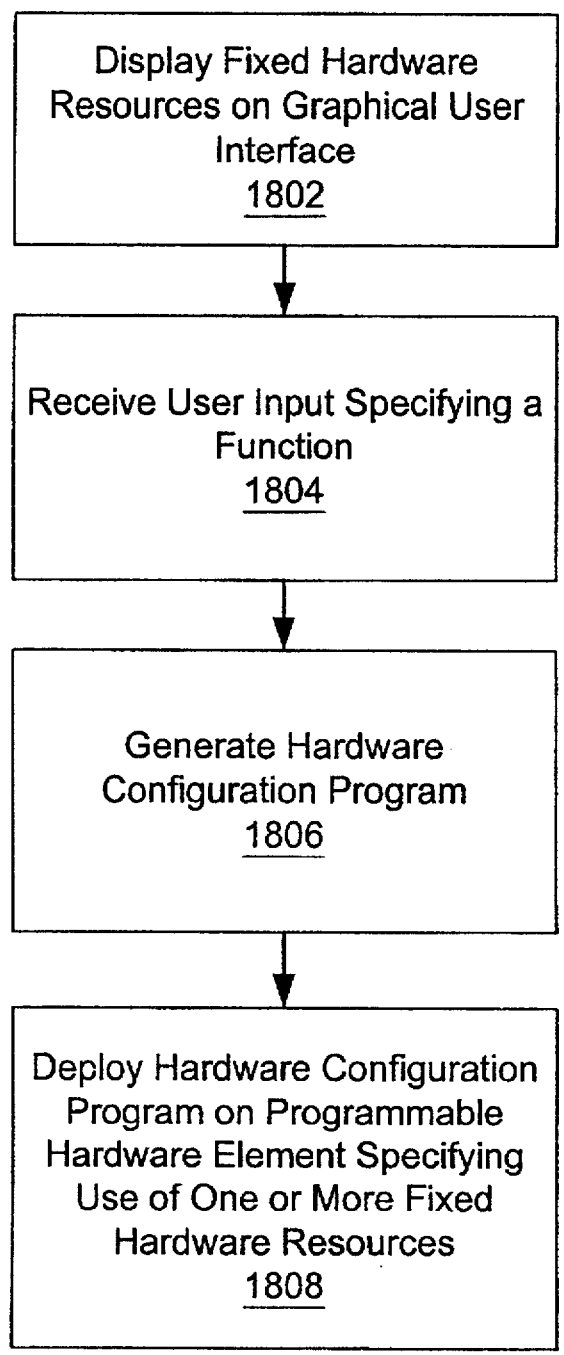
FIG. 18 is a flowchart of a method for configuring a RIO device using a configuration tool, according to one embodiment.

FIG. 18—A Method for Configuring a RIO System Using A Configuration Tool

FIG. 18 is a flowchart of a method for configuring a reconfigurable system (i.e., a RIO system), according to one embodiment. The reconfigurable system preferably comprises a programmable hardware element and one or more fixed hardware resources coupled to the programmable hardware element. As noted above, in some embodiments, various of the steps may occur concurrently, in a different order than shown, or may be omitted. Furthermore, one or more additional steps may be performed as desired.

As FIG. 18 shows, in 1802, a graphical user interface may be displayed on a display which is useable for configuring the reconfigurable system. The graphical user interface may display fixed hardware resource icons corresponding to each of at least a subset of the fixed hardware resources.

In 1804, user input to the graphical user interface may be received which specifies a function. For example, the reconfigurable system may be a reconfigurable measurement system, and the function may be a measurement function. In other embodiments, the reconfigurable system may be one or more of a reconfigurable control system, a reconfigurable automation system, and a reconfigurable simulation system, and the function may correspondingly be one or more of a control function, an automation function, and a simulation function.

As noted above, the user input to the graphical user interface may include text or numerical input, menu or button selections, iconic selection, drag and drop, or any other technique of entering data with a GUI. In one embodiment, the received user input may be regarding one or more of the fixed hardware resources required by an application to perform the function. The received user input may further specify timing and triggering requirements of the application with respect to the specified fixed hardware resources.

In one embodiment, an appearance of respective fixed hardware resource icons may be modified as the corresponding fixed hardware resources are allocated to perform functions in response to the user input. In other words, the modified appearance of the respective fixed hardware resource icons may visually indicate to the user that the corresponding fixed hardware resources have been allocated for use.

In another embodiment, an icon corresponding to the programmable hardware element may be displayed. Furthermore, proposed configurations of the programmable hardware element may be displayed interactively in response to receiving the user input. Thus, the user may be provided visual feedback regarding the configuration currently specified.

In 1806, a hardware configuration program may be generated based on the user input, where the hardware configuration program is deployable on the reconfigurable system. In other words, the hardware configuration program may be loadable onto the programmable hardware element of the RIO device 110, thereby configuring or programming the RIO device 110 to perform the specified function.

In one embodiment, generating the hardware configuration program may include generating a description file which identifies resources and features to perform the function indicated by the user, generating a program from the description file, generating hardware description language (HDL) code from the program, and generating the hardware configuration program from the HDL code. In one embodiment, the program is a graphical program.

Finally, in 1808, the hardware configuration program may be deployed on the programmable hardware element, where the hardware configuration program specifies use of one or more of the fixed hardware resources in performing the specified function. Said another way, after deploying the hardware configuration program onto the programmable hardware element, the reconfigurable system, including the one or more fixed hardware resources, is operable to perform the function.

In one embodiment, the programmable hardware element is a field programmable gate array (FPGA), and the hardware configuration program is a program binary file for the FPGA.

After the programmable hardware element has been configured with the hardware configuration program, the hardware configuration program may be executed on the programmable hardware element to perform the function. In one embodiment, the programmable hardware element may execute a first portion of the function, and the programmable hardware element may invoke operation of one or more of the fixed hardware resources to perform a second portion of the function.

FIGS. 19A–19E—Example Configuration Wizard Interface

FIGS. 19A–19E illustrate various example displays of a configuration wizard, according to one embodiment. It should be noted that these displays are meant to be illustrative only, and are not intended to limit the form or function of a configuration wizard to those shown.

Figure 19A:
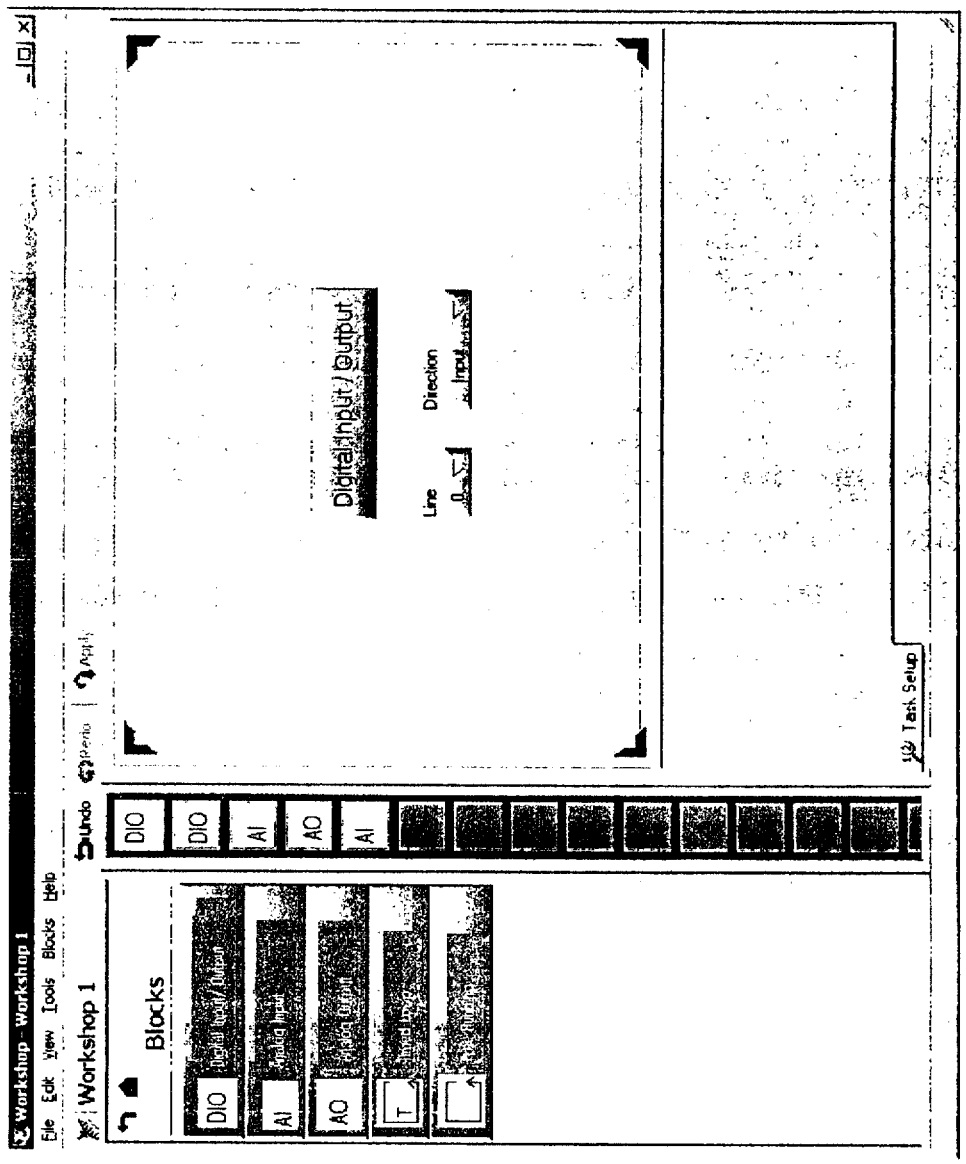
FIGS. 19A–19F illustrate a configuration wizard and its use, according to one embodiment.
Figure 19B:
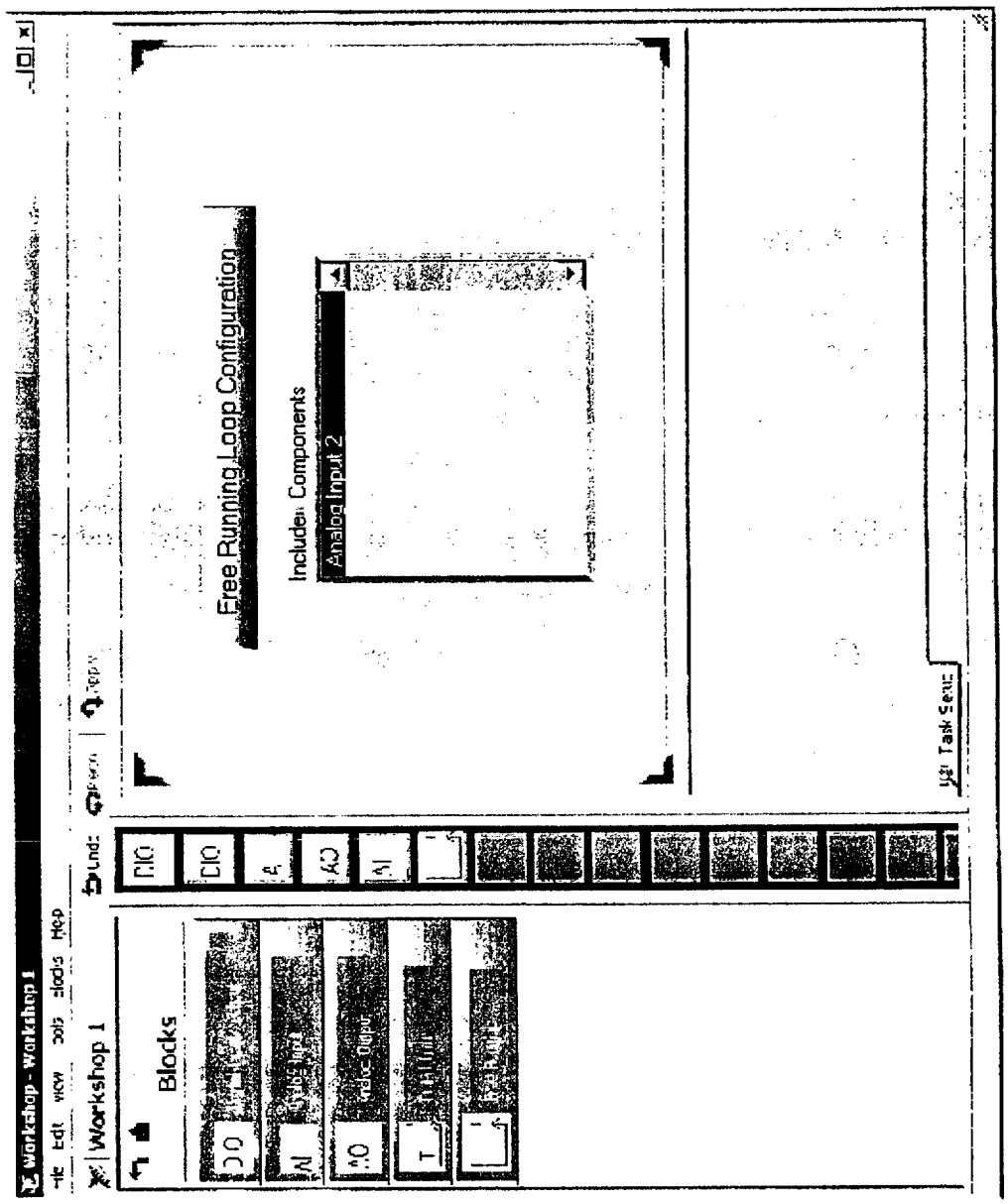

FIGS. 19A and 19B—Wizard User Interface

FIGS. 19A and 19B illustrate one embodiment of a user interface of a configuration wizard. As FIGS. 19A and 19B show, in one embodiment, the interface may include a blocks section or panel indicating the various components or control structure the user may configure, such as digital I/O, analog input, analog output, timed loop, and free running looping, among others. In one embodiment, the user may select or click a particular block to activate the configuration panels for that component or control structure.

In one embodiment, the interface may include an icon strip, shown between the blocks panel and a main panel. Each icon represents a configured component or control structure corresponding to one of the blocks in the block panel, a listed above. In another embodiment, each icon in the icon strip may represent a step or function of the function being created. Thus, as the user selects and configures functions, corresponding icons are added to the icon strip. It should be noted that each time a block is selected indicating a new function, an icon may be added to the icon strip. In one embodiment, when a user selects (clicks) an icon in the icon list, the configuration wizard may present one or more panels corresponding to that component or control structure, thereby allowing the user to quickly access any function specification for review, revision, replication, or deletion.

In the example shown in FIG. 19A, a digital I/O component has been selected, and so the main panel presents digital I/O configuration parameters which may be set by the user. In one embodiment, default values for each component may be provided by the wizard which may be over-ridden by user input.

FIG. 19B illustrates the use of the wizard to configure components in the free running loop. As FIG. 19B shows, analog input 2 has been selected for inclusion in the loop.

After the user has set the parameters for the selected components and/or control structures, the wizard may generate a diagram or VI, preferably via a scripting language. Example diagrams are described below with reference to FIGS. 19C–19E.

Figure 19C:
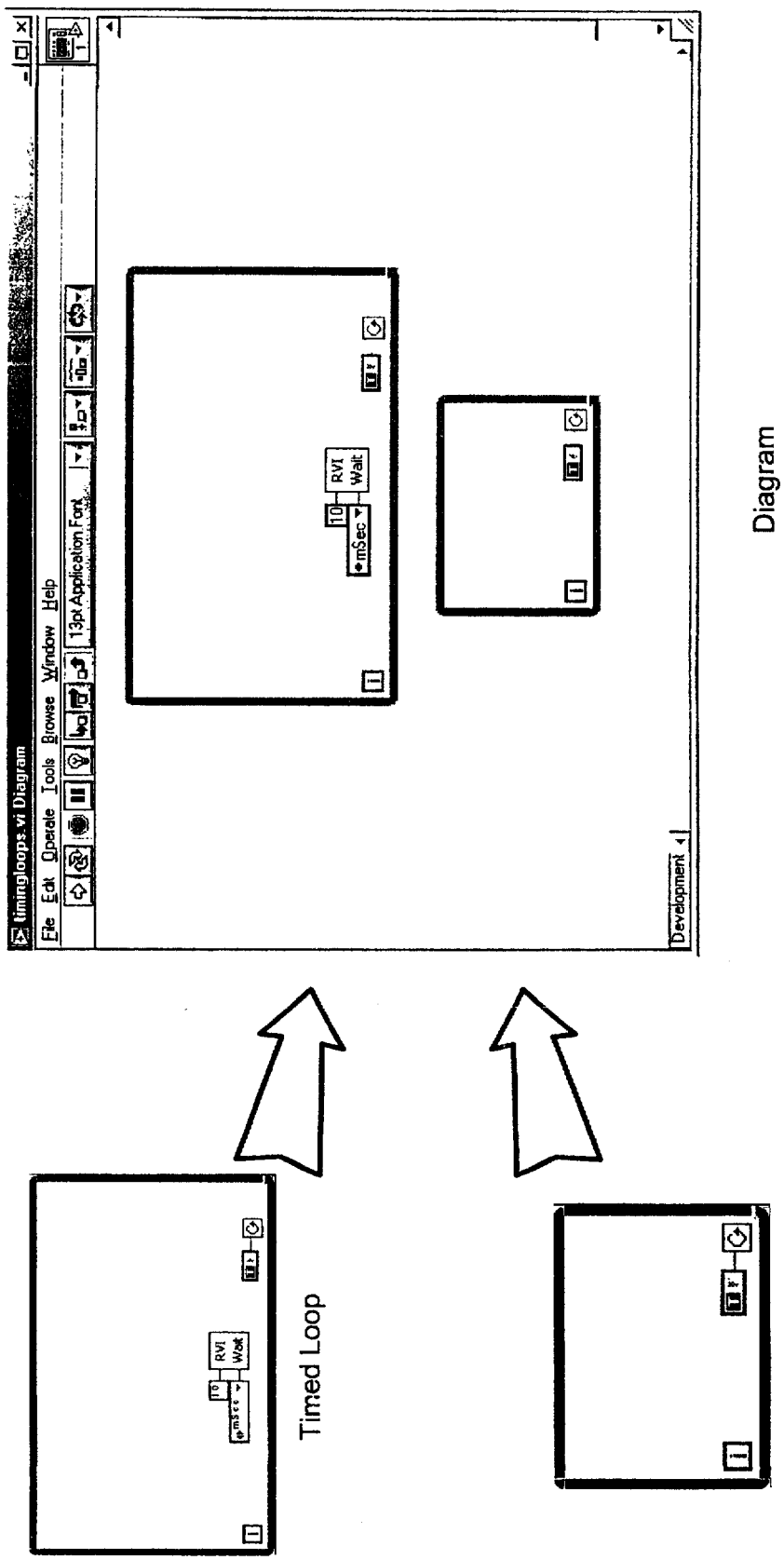
Figure 19D:
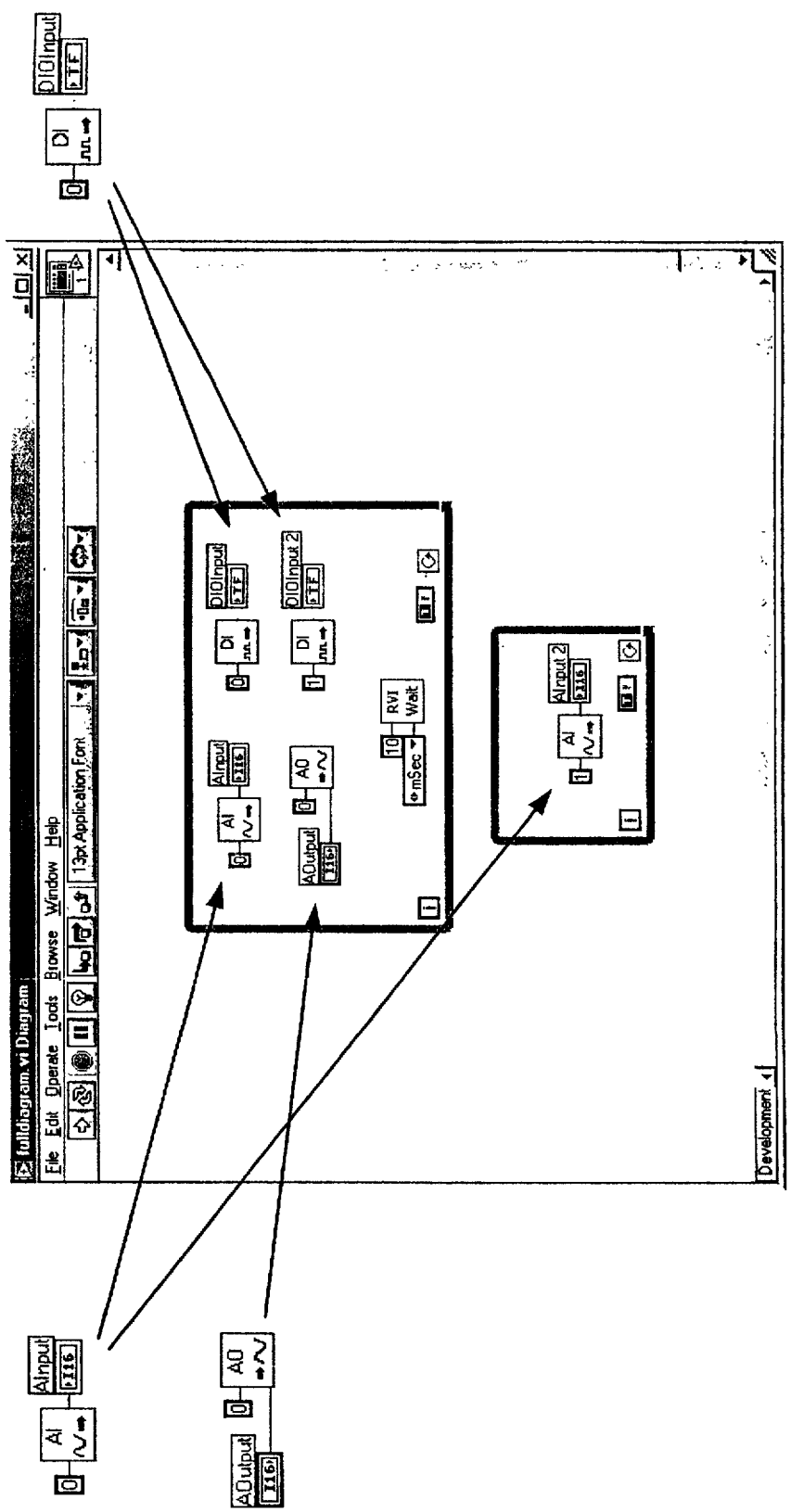
Figure 19E:
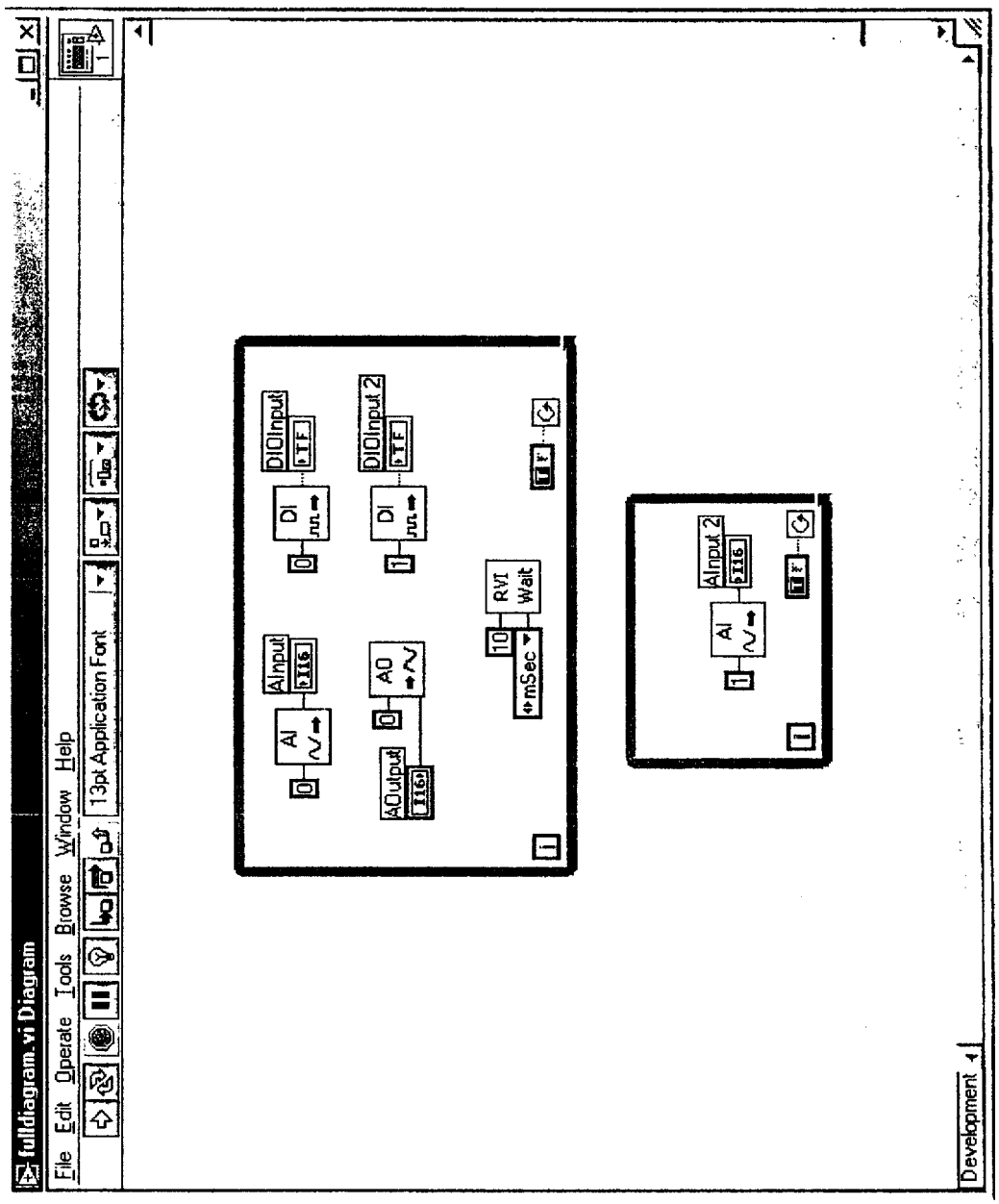

FIGS. 19C–19E—Wizard User Interface: Scripting Diagrams

FIGS. 19C–19E illustrate the process whereby the wizard generates a diagram or VI representing the specified functionality of an application. As noted above, the wizard preferably generates the diagram via a scripting process, although other means of generation are also contemplated, including compilation, look-up tables, etc.

FIG. 19C illustrates the placement of timing loops onto the diagram. Specifically, a timed loop and a free running loop are each added to the diagram. Note that in this case the loops are not nested.

FIG. 19D illustrates the placement of I/O components onto the diagram. As FIG. 19C shows, an analog input component is added to both the timed loop and the free running loop. Additionally, an analog input is added to the timed loop, along with two DIO inputs. Thus, based on the user input configuration information, the wizard may generate a diagram or VI which implements the functionality specified by the user. FIG. 19E shows the state of the diagram after the loops have been added and populated with the digital and analog I/O components. The addition of these structures and components to the diagram may result in a dynamically created front or main panel, as shown in FIG. 19F, described below.

Figure 19F:
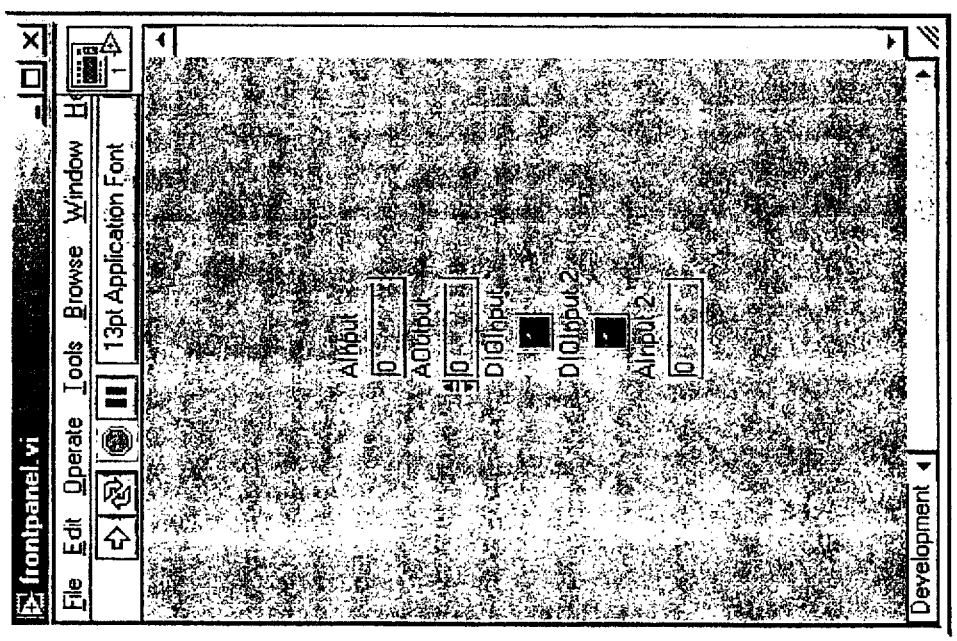

FIG. 19F illustrates a dynamically created front or main panel of the wizard graphical user interface. As shown in FIG. 19F, the main panel may include a configuration field for each of the added analog and digital I/O components whereby the user may view and modify the parameter values for each component.

After the diagram has been finalized (saved), the diagram may be converted or exported to a bit file, e.g., a hardware configuration program. In one embodiment, the diagram may be converted to a graphical program diagram in another development environment, such as LabVIEW. Thus, a wizard may be allow a user to specify a function or task and generate a graphical program implementing the function or task.

Where a reconfigurable system comprises a programmable hardware element coupled to one or more fixed hardware resources, as described above, the system may be configured by a wizard in the following manner:

Initially, the wizard may display a graphical user interface on a display (i.e., a computer display) which is useable for configuring the reconfigurable system, where the graphical user interface displays fixed hardware resource icons corresponding to each of at least a subset of the fixed hardware resources. In other words, the wizard may represent some or all of the fixed hardware resources by graphical icons, referred to as fixed hardware resource icons.

The wizard may then receive user input specifying a function, as described above. The user input may include selection of components and/or control structures, as well as selection or setting of component or control structure parameter values. In one embodiment, receiving user input may include receiving user input regarding one or more of the fixed hardware resources required by an application to perform the function, as well as receiving user input specifying timing and triggering requirements of the application with respect to the specified fixed hardware resources. Said another way, the wizard may receive user input specifying resources required by an application to perform a function, as well as user input specifying timing and triggering requirements of the application with respect to the specified resources. In one embodiment, specifying resources may comprise selecting one or more of hardware and software resources, and indicating configuration settings for the resources.

In one embodiment, receiving the user input specifying the function may be performed by a server computer system. Additionally, in one embodiment, prior to the server computer system receiving the user input, a user (client) computer system may access the server computer system over a network. In other words, the user may engage the configuration wizard over the Internet by using the client computer system to access a vendor's server computer system, and use the configuration wizard, as described above.

A hardware configuration program may then be generated which is deployable on the reconfigurable system, as described in detail above. For example, in one embodiment, generating a hardware configuration program may comprise generating a description file identifying resources and features to perform the function indicated by the user, generating a program from the description file, generating hardware description language (HDL) code from the program, and generating the hardware configuration program from the HDL code. As described above, the hardware configuration program is usable to configure the programmable hardware element comprised in the reconfigurable system to perform the function. In one embodiment, the program generated from the description file may be a graphical program, such as a LabVIEW graphical program.

Configuration Storage and Matching

In one embodiment, the host and/or development environment may maintain a cache for storing one or more pre-compiled hardware configuration programs (configurations). For example, a library of such pre-compiled configurations may be developed representing common measurement tasks. Additionally, new configurations developed in response to new user specified requirements may be stored, i.e., may be added to the original library. By storing such pre-compiled configurations, the number of configurations developed from scratch in response to new user requirements may be minimized.

In one embodiment, in response to user input specifying a measurement task, a pre-compiled configuration may be selected from the stored configurations in the following manner. First, a determination may be made as to whether there is a pre-compiled configuration that precisely matches the customer's requirements (task definition). If such a match is found, the configuration may be retrieved and provided to the user.

If a direct match is not found, then a search may be made for a configuration which provides a strict superset of the required functionality, i.e., one that has all the requirements and more. Although the superset configuration provides more functionality than the user requires, the configuration meets the requirements, and may not take much more time to compile. Therefore, (after confirmation by the user, if such an option is enabled), the superset configuration may be retrieved and provided to the user. It is noted that compilation of a configuration generally requires much more time than selection of a configuration, thus, because the more complex configuration is pre-compiled, the selection of a larger configuration may not require substantially more time than a smaller configuration. Having a larger configuration may make the interface more complex, but the user can easily ignore those functions not needed by the user.

In one embodiment, if a suitable superset configuration is not found, or if the user chooses not to use the superset configuration, a search may be made for a "closest" configuration, i.e., a configuration with similar, although not quite the same functionality specified by the user. For example, a "closest" match configuration may have the same number of digital I/O but may have one less analog channel. If this is acceptable to the user, then the configuration may be selected and provided to the user.

Alternatively, if an exact configuration is required by the user, the configuration may be developed as described above, and provided to the user.

After the hardware configuration program is generated (or selected), the hardware configuration program may be deployed on the programmable hardware element, where the hardware configuration program specifies use of one or more of the fixed hardware resources. In other words, the hardware configuration program may specify not only the behavior or the programmable hardware element, but may also specify how the one or more fixed hardware resources are to be used by the programmable hardware element in performing the specified function. After the hardware configuration program has been deployed, the reconfigurable system may be operable to perform the function.

In one embodiment, after the hardware configuration program has been deployed on the programmable hardware element, the hardware configuration program may be executed on the programmable hardware element to perform the function. Executing the hardware configuration program on the programmable hardware element may include the programmable hardware element executing a first portion of the function, and the programmable hardware element invoking operation of one or more of the fixed hardware resources to perform a second portion of the function. In other words, different portions of the hardware configuration program (and therefore, the function) may be directed respectively to performing operations directly on the programmable hardware element, and to operation of one or more of the fixed hardware resources coupled to the programmable hardware element.

In one embodiment, the wizard may modify an appearance of respective fixed hardware resource icons as the corresponding fixed hardware resources are allocated to perform functions in response to the user input, where the modified appearance of the respective fixed hardware resource icons visually indicates to the user that the corresponding fixed hardware resources have been allocated for use. For example, selected fixed hardware resource icons may be "grayed out" on the display, indicating that the corresponding fixed hardware resource is already being used, thus preventing the user from over tasking a given resource.

In one embodiment, the wizard may display an icon corresponding to the programmable hardware element, and interactively display proposed configurations of the programmable hardware element in response to receiving the user input. Said another way, the wizard may graphically illustrate the current configuration of the programmable hardware element as a result of the user specified parameters, components, resources, etc.

In one embodiment, the reconfigurable system may be a reconfigurable measurement system, and the function may be a measurement function. In other embodiments, the reconfigurable system may be one or more of a reconfigurable control system, a reconfigurable automation system, and a reconfigurable simulation system, and the function may be a corresponding one or more of a respective control function, an automation function, and a simulation function.

As noted above, in one embodiment, the programmable hardware element may be a field programmable gate array (FPGA), and the hardware configuration program may comprise a program binary file for the FPGA.

Thus, when the reconfigurable system comprises a reconfigurable measurement system, the method may include the wizard displaying a graphical user interface on a display which is useable for configuring the reconfigurable measurement system, where the graphical uses interface mail display icons corresponding to each of at least a subset of the fixed hardware resources. The wizard may then receive user input specifying a measurement function, and generate a hardware configuration program, where the hardware configuration program is deployable on the reconfigurable measurement system. Finally, the hardware configuration program may be deployed on the programmable hardware element, where the hardware configuration program specifies use of one or more of the fixed hardware resources. Additionally, receiving the user input may include receiving user input regarding one or more of the fixed hardware resources required by an application to perform the function, as well as timing and triggering requirements of the application with respect to the fixed hardware resources. As mentioned above, after deploying the hardware configuration program, the reconfigurable system may be operable to perform the measurement function.

Figure 20:
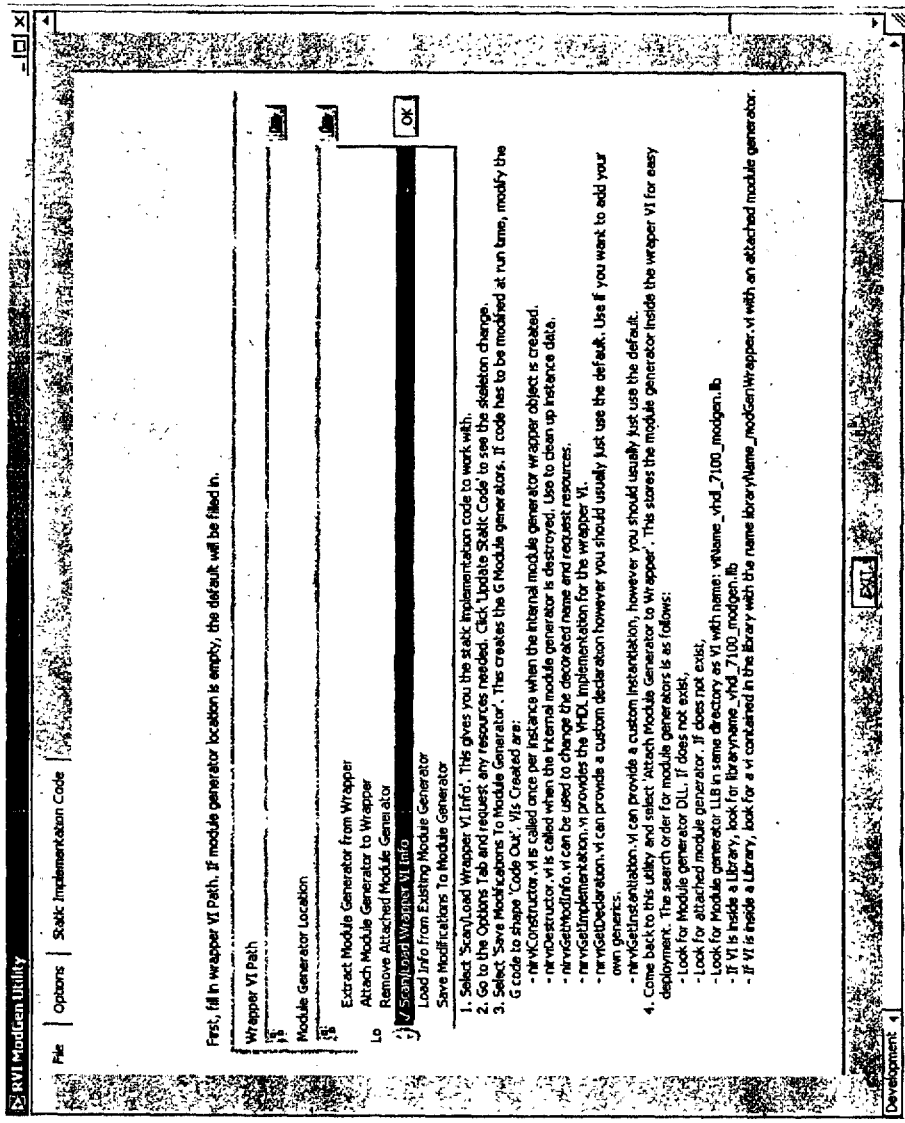
FIG. 20 illustrates one embodiment of a block module generator.

FIG. 20—A Hardware Block Module Generator

As described above, in the course of generating a hardware configuration program from user specifications, a graphical program, such as a LabVIEW diagram or VI, may be created, analyzed and converted into a form suitable for deployment on the programmable hardware element. As is well known in the art, many graphical programs may include nodes or elements which themselves represent other graphical programs or diagrams. In the context of LabVIEW, these sub-programs are referred to as sub VIs or blocks.

In such a conversion, when a sub VI is encountered on a LabVIEW diagram, one approach is to explore the sub VI and automatically generate a corresponding hardware configuration. Alternatively, custom logic that the user has developed may be used to convert the sub VI. In one embodiment, the user may create such custom logic through the use of module generators. To create a module generator, the user may start by using a configuration tool, such as the configuration wizard described above, to set up an API to the corresponding hardware component. A screen shot of one embodiment of this tool is shown in FIG. 20.

Referring to FIG 20, in the first field of the block generator tool, a "Wrapper VI Path" may define an API to a corresponding hardware component. After selecting a VI, "Static Implementation Code" may be started with a port list for the hardware component. If the hardware component is a purely static implementation, the user may simply type VHDL code into the "Static Implementation Code" tab and then hit "Save Modifications to Module Generator" and be done. The options tab may allow the user to request resources off the board to be used in the selected component. If the resource is used elsewhere, a backend program may automatically arbitrate between competing accessors, i.e., the components which are concurrently configured to use the selected component.

A powerful feature of module generators may become apparent when the code generated is not entirely static. In other words, the VHDL created may vary depending on inputs to the block or sub VI (whether the inputs are constant or not), the structure of the parent diagram, and/or information on the front panel of the sub VI that defines the class of the object (this may be useful for arbitration options or other options that apply to a component everywhere in a particular application). In one embodiment, the dynamic behavior of the hardware created may be controlled using the G language itself. The module generators may just be VIs which the user can access and modify at will. An example block diagram is illustrated in FIG. 21, described below.

Figure 21:
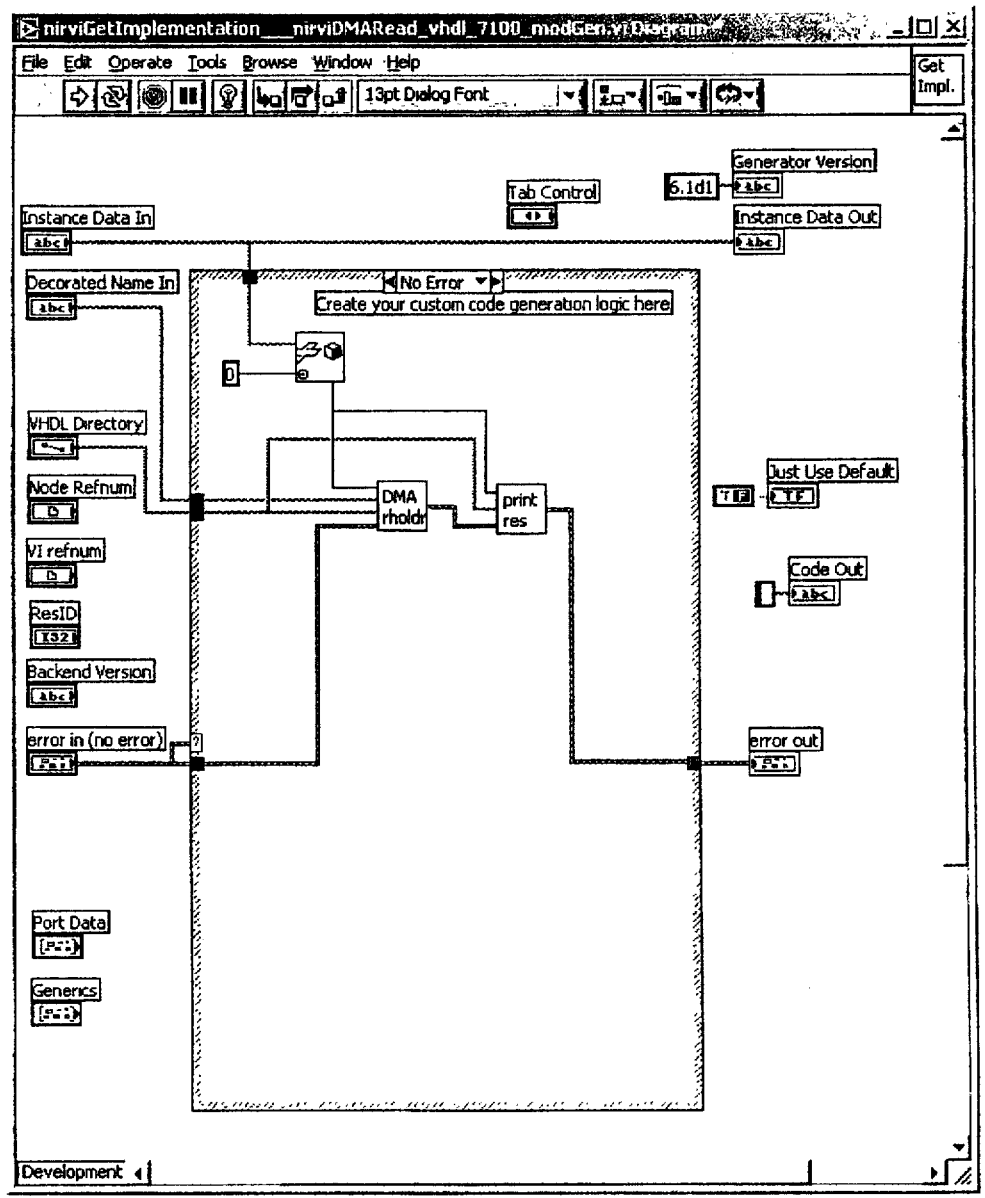
FIG. 21 is a graphical program diagram generated by a block module generator, according to one embodiment.

FIG. 21—Example Block Diagram

FIG. 21 illustrates a block diagram or VI generated by a module generator, as described above. In other words, the VI of FIG. 21 is the result of a dynamic code generation process. The interesting parameters for dynamic code creation are the Node Refnum (a reference to the node on the block diagram) and the VI Refnum (a reference to the VI that is being used as a sub VI).

In one embodiment, the module generator framework may be pseudo-object oriented. In one embodiment, a set of VIs may be automatically generated for a specified component, For example, in one embodiment, the module generator VIs automatically created may be as follows:

1. Constructor—Allows the user to initialize instance data that is passed between all the following VIs, and may also support the use of multiple languages, where the constructor specifies the possible languages and the Get Mod Info VI, described below, gets passed which language should be implemented, e.g., "VHDL".

2. Get Mod Info—Allows the user to request hardware resources (ADCs, DACs, DIO lines, etc). In one embodiment, this VI may also tell the backend how many cycles the block takes to execute and other information the backend may use to optimize surrounding logic.

3. Get Mod Implementation—Allows the user to specify the implementation for the hardware component.

4. Get Mod Declaration—Allows the user to specify a custom declaration for his component. In one embodiment, a default value may be provided by the backend.

5. Get Mod Instantiation—Allows the user to specify a custom instantiation for the selected component. In one embodiment, a default value may be provided by the backend.

6. Destructor—Allows the user to clean up any instance data passed between the above VIs.

These VIs may be called in sequence from the backend when a matching component is found on the users original diagram.

Communication

Communication is important for distributed applications. For RIO, the communication is between the board and the host, or between a measurement module 108 and RIO 110, or between hardware glue and a soft-core instantiated on the programmable hardware element 106, e.g., the FPGA.

Automatic API Generation

Many times an application (VI) developed using a hardware configuration development environment, e.g., LabVIEW FPGA, is part of a larger system. Therefore, in one embodiment, an API may be automatically generated for the user for accessing the hardware application from a host. This wizard application may list all resources used in a user's application (controls and indicators on the front panel, DMA channels, and interrupts) and give the user the option to not create an API entry for that particular channel. When the user is satisfied, he may simply hit a button and the wizard application may generate a palette of VIs for controlling and communicating with his application on our board. The user may then use these VIs in a larger system on the host.

The basic services offered by the automatically generated API may include:

1. Open—Reserve resources, open references, etc.
2. Close—Opposite of open.
3. Download—Deploy a configuration to the board.
4. Control—Control the execution of the deployed configuration (run, stop, halt, etc)
5. Access—Channels and ports that hide the implementation of registers, interrupts, and DMA. Automatic synchronization of data may be supported. Alternatively, the user may build synchronization into his application.

One problem which may arise with this automatic interface generation is that it may be strongly tied to the application created in hardware. In other words, if the application changes, the API may change, which means the host based application may require change as well. Therefore, in one embodiment, the user may be allowed to group particular resources into classes where all members of a class have exactly the same API. Subclasses may implement inheritance for extending the API.

The particular resources here may be communication channels and ports. These channels and ports may be uni- or bi-directional but are preferably always visible and locatable from both sides. The concept of channels and ports may hide the particular implementation of registers, interrupts, dma, and synchronization logic. The channel or port may be configured to take advantage of a particular communication method or synchronization method. For synchronization, channels/ports may be grouped together into one synchronized group. In a further embodiment, interface templates may be provided such that the user may just modify the template for a particular application but needn't modify the API. Then as long as the user's operations remain inside the framework, the same API will exist. These mechanisms may allow the policy of the implementation to change while keeping the same API.

In one embodiment, the 'calling of VIs' may be distributable between different machines and boards, thereby providing communication, synchronization, and system level design capabilities to the development environment, e.g., LabVIEW.

Embedded Microcontroller Interfacing

It is possible to implement microcontrollers inside FPGAs. These can be either hard or soft cores depending on whether they are implemented using custom silicon or not. The soft cores are reconfigurable but the performance is not as great. In one embodiment, interfacing to one of these microcontrollers may be performed in a similar way to interfacing to the host as described above under the section titled "Automatic API generation". Potentially, the same API generation mechanism could be used for hardware-hardware, software-software, and hardware-software interfaces.

Arbitration for Shared Resources

In one embodiment, resources may be used more than once in an application. Resources are usually hardware (ADCs, DACs, DIO lines, etc), but may also be processing elements or sub VIs. If resources are used more than once an arbiter may need to be placed between the users of the resource and the resource. The arbiter may be responsible for serializing access to the resource. In one embodiment, the arbiter may be implemented as a series of flip flops connected in a ring with enables to move from one accessor to the next. Each flip flop may take one cycle, so a worst case delay through an arbiter may be equal to the total number of possible accessors. Generally, just one accessor is active at a particular time, and so a small circuit may be included that determines whether there is only one accessor. If there is only one accessor, access may be granted and the flip flop state machine with its variable delay may be ignored. A simple diagram illustrating this approach is shown in FIG. 22, described below.

Figure 22:
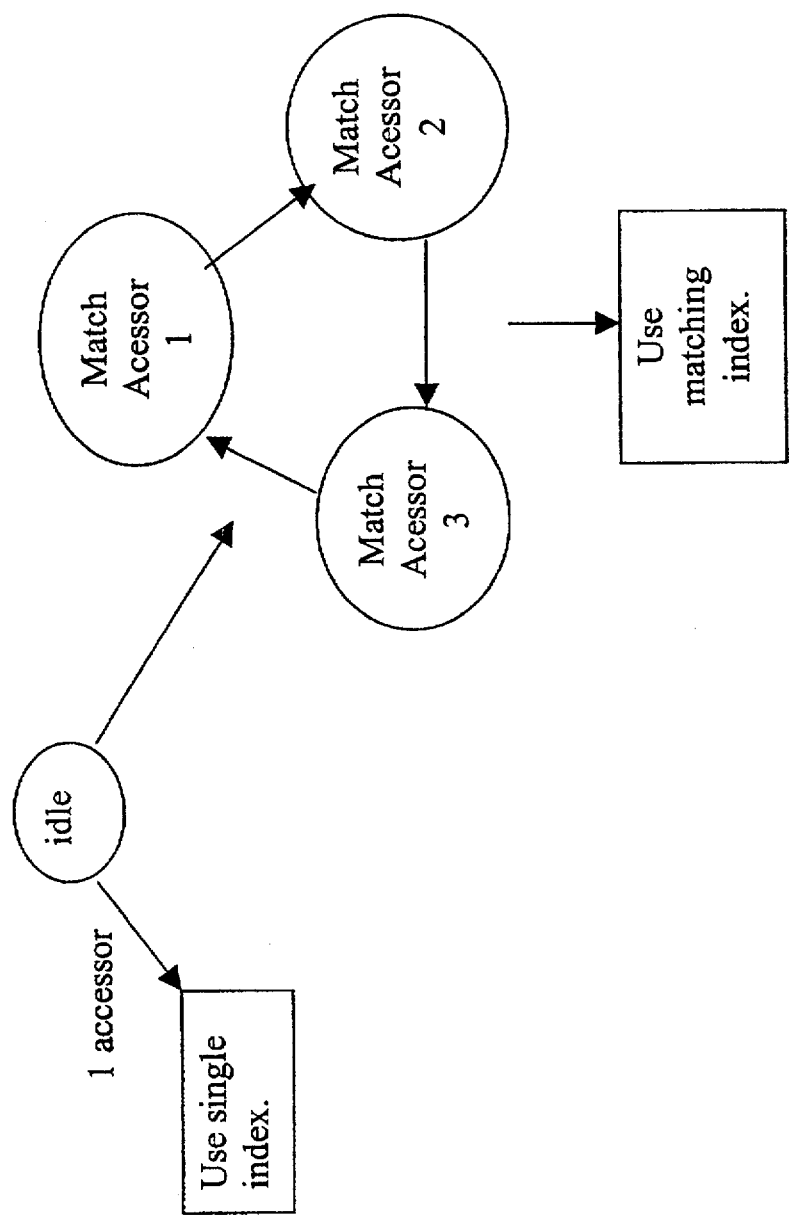
FIG. 22 illustrates a resource arbitration scheme for shared resource use, according to one embodiment of the invention.

FIG. 22—Arbitration of Access to a Component

FIG. 22 illustrates an approach for determining if there is only one accessor is general knowledge for figuring out if a number is a power of two:

If(requests && !(requests & (requests-1)))

Requests is a power of 2 and so there is a single accessor.

Else

There is more than one simultaneous access so use the round robin flip flop state machine.

This design has two useful aspects. For one, the round robin flip flop state machine is very simple and so is very likely to meet static timing requirements no matter how many possible accessors there are (within reason). Additionally, the single accessor check improves the performance for non simultaneous accesses at a minimal logic cost.

Hardware State and Logic Sharing

Logic takes up space on an FPGA. Multiple instances of much logic could possibly share the same logic for space savings assuming the timing requirements are not tight. In this case the logic may become similar to a hardware resource to which access may be arbitrated. In doing this, some parallelism available in hardware may be lost because access to a resource (logic) is being serialized but space may be saved. Sharing access to logic is similar to non reentrant sub VIs in LabVIEW.

One problem with shaking access to sub VIs is state must sometimes be saved from one execution of a sub VI to the next from the same instance on a parent block diagram. This may be done in LabVIEW using reentrant sub VIs with front panel controls and indicators that are unconnected and also uninitialized shift registers. One approach using LabVIEW FPGA is to use registers to hold state information. These are behind the scenes, in that the user still uses shift registers and front panel controls. A more efficient implementation for shared sub VIs may be to use block RAM inside or outside the FPGA to store the state information. A reference may then used for every instance of a sub VI to pull out the correct state information. In the first approach all the state information is in effect being passed in and out of the sub VI. With the second approach only the reference is passed. The second approach may be inefficient for non shared sub VIs, but for shared sub VIs may be an efficient solution.

Simulation Environment

Simulation environments are useful to figure out how a system will respond in certain situations before implementing them. This is particularly important in hardware configuration development environments, e.g., LabVIEW FPGA, because the compile times are typically very long.

System Level Simulation

If the user develops a hardware application for incorporation into a larger system, as mentioned above, it may be desirable to simulate the entire system before compiling the hardware application. If everything is written in a graphical programming language such as LabVIEW this may not be difficult. All API VIs just need to have special simulation logic that gets executed when in simulation mode. For front panel register access, the simulation target can just use VI server calls to set/get values from the front panel. For DMA, the API VIs can use LabVIEW Queues. For Interrupts, the API VIs can use LabVIEW occurrences.

Example RIO Configurations

The configurations for the RIO board are created from a collection of I/O components. These I/O components can be grouped in different ways to create configurations for focused applications. The I/O components may include typical DAQ like interfaces such as analog input, analog output, digital I/O, and timing I/O. The grouping provides the timing and triggering layer on top of these components, which may include free running resources, fully synchronous mixed I/O, hardware triggered operations, and more.

The configurations for the RIO board can be organized into a small number of classes, with minor permutations within each class. An example configuration class would be "post trigger", with permutations including SW triggered, HW triggered, etc.

Low Level Components

The primary I/O components are low level and directly access the hardware I/O. They are used for the basic analog input, analog output, and digital I/O interfaces.

1. Analog Input

This component initiates an analog to digital conversion from an ADC. It returns the result of the conversion. This component tends to exist in timed loops, but can also be used in free running applications.

2. Analog Output

This component writes a value to a DAC and initiates the digital to analog conversion. It returns no data. This component is commonly used for continuous and discrete output, existing in both timed and free running applications.

3. Digital Input/Output

This is really a collection of components that act on a single hardware resource. A given digital line can be used for input, output, or bidirectional applications. This component is more commonly used in static DIO applications or as a building block for higher level functionality, with some timed applications.

High Level Components

The DIO lines are the resources most commonly used to build higher level I/O components. These are components that interface to digital signals but need some amount of logic or processing to be meaningful, with the best example being counter applications. Note that it is possible to use the analog components for these applications, it is simply not as common. There are many more minor and major variations than listed below, but these are very common examples.

1. Event Counter

This high level component counts active edges on a digital input. It typically offers polarity control over the incoming signal, a means to control the start and stop of counting, and a readable register with the counter data. When used in a timed loop application, this counter typically returns the number of counts during the previous loop iteration.

2. Period Counter

This high level component counts the time between active edges on a digital input. It typically offers polarity control over the incoming signal, a means to control the start and stop of counting, and a readable register with the counter data. When used in a timed loop application, this counter typically returns data for the most recent measured period.

3. Semi Period Counter

This high level component counts the time between opposite edges on a digital input. It typically offers polarity control over the incoming signal, a means to control the start and stop of counting, and a readable register with the counter data. When used in a timed loop application, this counter typically returns data for the most recent measured period.

4. Quadrature Decoder

This high level component increments or decrements based on two digital inputs. It typically offers polarity control over the incoming signals, a means to control the start and stop of counting, and a readable register with the counter data. When used in a timed loop application, this counter typically returns the final counter value during the previous loop iteration.

5. PWM Input

This high level component counts the high and low times of a pulse train. It typically offers polarity control over the incoming signal, a means to control the start and stop of counting, and a readable register with the counter data. When used in a timed loop application, this counter typically returns data for the most recent measured high and low periods.

6. PWM Output

This high level component generates a pulse train with controllable high and low times. It typically offers polarity control over the generated signal, a means to control the start and stop of generation, and two writeable registers for period data. When used in a timed loop application, this counter is typically configured to run at a multiple of the loop rate for synchronous behavior.

Grouping of Components

The components by themselves do not provide much functionality. It is the grouping of the components in structured wrappers that define a particular configuration. These wrappers provide the timing and triggering of the components as well as the interface to the host diagram. These wrappers can be grouped into classes of functionality.

1. Free Running

This configuration resembles a PLC in that it continuously samples and updates it's I/O as fast as possible. The input registers always contain the most recent data, and can be read at any time. The output registers can be written at any time, and the outputs will be updated as soon as possible. It is the simplest of the configurations in that there is no real timing, triggering, or data transfer synchronization issues for the customer.

Recommended Permutations
 Different Counter I/O Combinations

2. Continuous Timed Loop

This configuration provides a single timed loop for all synchronous resources. This is well suited to control loops with fully correlated I/O. The host is notified when it is time to access the I/O resources.

Recommended Permutations
 SW & HW triggered
 Mixes of synch/asynch DIO
 Mixes of counter I/O
 Different transfer mechanisms (Poll, Interrupt, DMA)

3. Post Trigger Acquisition

This configuration provides the typical post triggered data acquisition functionality. A fixed number of points will be acquired when a SW or HW trigger is received. The same behavior is provided in different combinations for the other resources.

Recommended Permutations
 Single and independent loops per resource type
 SW & HW triggered
 Mixes of synch/asynch DIO
 Mixes of counter I/O
 Different transfer mechanisms (Poll, Interrupt, DMA)

4. Pre Trigger Acquisition

This configuration provides the typical pre triggered data acquisition functionality. A minimum number of pre trigger points will be acquired, and a post trigger will cause a fixed number of remaining samples to be taken. Note that there is not a comparable model for the output resources.

Recommended Permutations
 Single and independent loops per resource type
 SW & HW triggered
 Mixes of synch/asynch DIO
 Mixes of counter I/O
 Different transfer mechanisms (Poll, Interrupt, DMA)

It should be noted that the above are meant to be illustrative examples of RIO configurations, and are not meant to limit the scope or form of configurations usable in the RIO system. Other features which may be considered configuring the RIO system 110 include, but are not limited to, other I/O features such as the number of channels, resolution, rates, protection, range, simultaneity and/or synchronization, and enhanced I/O functionality; timing models, including continuous, post trigger, and independent loops; signal conditioning, e.g., sensor interface; form factor, e.g., PXI, PCI, standalone, etc.; and environmental conditions, such as vibration, temperature range, humidity, among others.

Figure 23A:
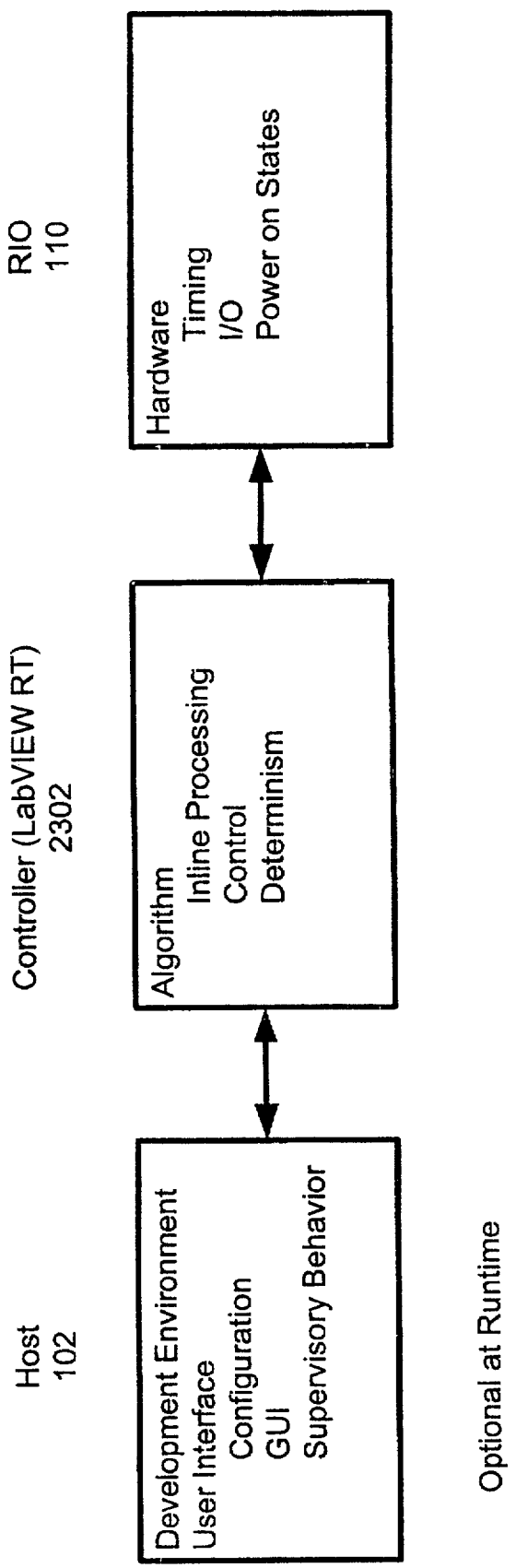
FIGS. 23A and 23B illustrate two embodiments of RIO system component responsibilities.
Figure 23B:
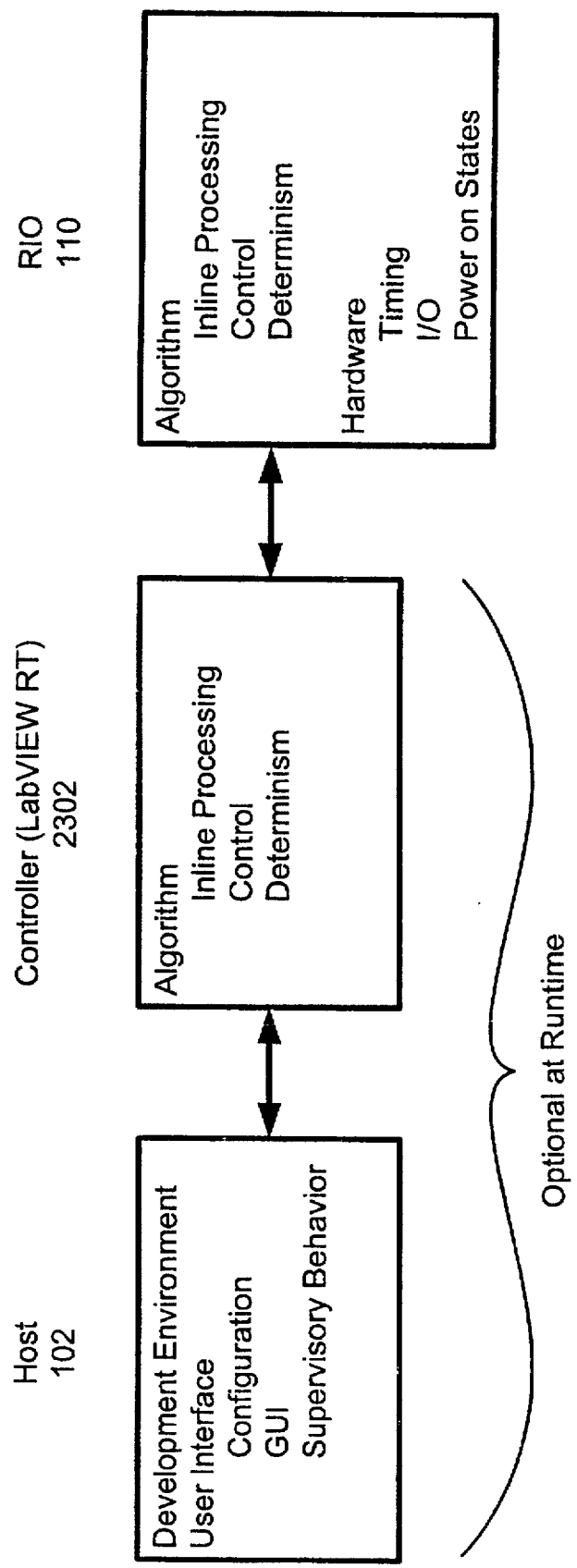

FIGS. 23A and 23B—Configuration Generation

There are a number of ways in which a configuration may be generated for a user. In one embodiment, the user may select from a set of pre-built configurations, for example, maintained by a vendor. In this embodiment, the user may select the configuration which most closely matches requirements for the desired task. For example, the set of pre-built configurations may focus on common configurations, including base I/O types such as AI, AO, DI, and DO, as well as derived I/O types including counters, timers, period measurement, and frequency measurement. In a preferred version of this embodiment, all of the I/O may be timed, and basic triggering is supported. A host interface may be memory mapped and exported as registers. For example, a set of registers may serve to show the state of the hardware, and allow the software to write new values or command actions by setting appropriate bits in the register set. A user may initiate a command action by setting one or more bits, and the system may responds by performing a specified action. In one embodiment, a host interface may be provided for each application development environment (ADE). Additionally, in one embodiment, each configuration may be defined by a G diagram, which may also serve as documentation for the configuration.

In another embodiment, the hardware software boundary may be viewed as an interface between two objects that exchange messages. These messages may be either method invocations or set/get of attribute values. A standard interface may be defined that permits generic software-hardware calls. In one embodiment, the register set may be organized such that a first read starts a call, and if completed, returns an error code or status; if not completed the call may return an ID of the buffer in which the rest of the transaction will take place. If the hardware allows multiple threads to access the object, then the ID may be returned in the first call as well. The caller may pass and receive data in the buffer. Finally, after a sequence of reads and writes, the status returned may be completed on the last read. The code for the host interface (proxy), as described above, may be generated by a host interface generator executing in the development environment. In this manner, synchronization functionality may be provided while minimizing overhead.

As described above, based on a LabVIEW FPGA diagram a host interface may be generated that provides access to some or all of the configurable aspects of a VI or object. In various embodiments, the generated host interface may be static or dynamic, i.e., it may be generated with specialized and optimized code to interface with one specific VI or object (static), or with multiple VIs or objects (dynamic). In the static case, communication and associated overhead between the host and the VI or object may be minimized. However, changes made to the VI or object may require corresponding changes to the application and/or the generated interface (register set). In one embodiment, an application target manager (as part of the ADE) may be used to help the user manage these target-related changes. For example, the target-specific host interface VIs (or text-based code) in the application may be marked with a special tag, allowing the application target manager to track such changes and update the application as necessary.

In one embodiment, tools may be provided to the user to configure the board. For example, tools may be provided to locate the board (such as in a network), to download a configuration to the board, or to determine and locate measurement resources, among others. Additionally, tools may be provided to program the board, including tools to access the interface (registers) on a board for a given configuration. In a further embodiment, the user may make modifications to the selected pre-built configuration to more closely match the requirements.

FIG. 23A illustrates one example of a breakout of the responsibilities of the main system components of a RIO based system using this approach. As FIG. 23A shows, in one embodiment, RIO hardware 110 may provide timing, I/O, power on states, etc., while a controller 2302, such as LabVIEW RT, may provide algorithmic functionality, such as inline processing, control, and determinism (prescribed functionality). At runtime a host 102, e.g., a Windows based host, may optionally be present. At runtime the host may provide a GUI (graphical user interface), and supervisory behavior, among other host functions. As shown, the host 102 is the highest-level component of these primary system components, and communicates with the controller 2302, which is the mid-level component. The controller 2302 in turn communicates with the RIO unit 110, which is the low level system component, i.e., is the closest to the phenomenon being measured, controlled, etc. The fact that the presence of the host 102 at runtime is optional means that after the hardware configuration program has been created and deployed on the RIO unit 110, the presence of the host (the computer system 102) may not be required for the system to perform the specified measurement and/or control function.

In another embodiment, the user may build a configuration from pre-defined blocks (configuration components), diagrams, or software modules using a configuration wizard, described above, to specify and assemble the configuration from the pre-defined blocks. In other words, the wizard may allow the user to select pre-defined blocks to build a custom configuration for the user's application. In one embodiment, the wizard may be used by the vendor to build the pre-built configurations mentioned. In one embodiment, a host interface may be generated to match the user-defined configuration. Similarly, host interfaces may be generated for each of the pre-built configurations mentioned above in the same manner.

In yet another embodiment, the user may build a configuration using a development environment and user defined blocks, diagrams, or software components. For example, the user may create the configuration using user defined blocks based on the G graphical programming language, from National Instruments. In other words, the user may create G diagrams to define blocks. In one embodiment, these user-defined blocks may then be used by the wizard mentioned above as pre-built blocks. Thus, in one embodiment, an entire configuration may be defined with a G diagram. As mentioned above, a host interface may be generated to match each configuration.

FIG. 23B illustrates another example of the breakout of the responsibilities of the main system components of a RIO based system using this approach (user-defined blocks). As FIG. 23B shows, in this embodiment, the RIO hardware 110 may provide timing, I/O, power on states, etc., as well as algorithmic functionality, such as inline processing, control, and determinism (prescribed functions). Optionally, at runtime, the controller 2302, (e.g., LabVIEW RT) may provide additional algorithmic functionality, as described above. Thus a first portion of a graphical program may be deployed on a processor and memory (e.g., LabVIEW RT), and a second portion of the graphical program may be deployed on a programmable hardware element (e.g., LabVIEW FPGA).

The host 102 may provide a development environment, a user interface which may provide configuration capabilities, a GUI (graphical user interface), and supervisory behavior, as also noted above. As indicated, when the RIO unit 110 is configured with algorithmic functionality, the host 102 and controller 2302 may not be required at runtime to perform the specified task, because the configured RIO unit 110 may be operable to perform the low-level basic hardware functions, as well as the algorithmic functionality required to perform the measurement task.

In one embodiment, the G defined blocks may comprise a subset of the G language (the LabVIEW environment) which may be used to synthesize a diagram into a hardware implementation, e.g., an FPGA hardware configuration program. The use of the G defined blocks may provide software developers the ability to develop their own hardware in a constrained environment. In other words, the pre-defined blocks provide a limited palette of functionality usable by software developers to specify and configure hardware. Additionally, this approach may provide for substantially identical semantics between the hardware and software (development).

Figure 24:
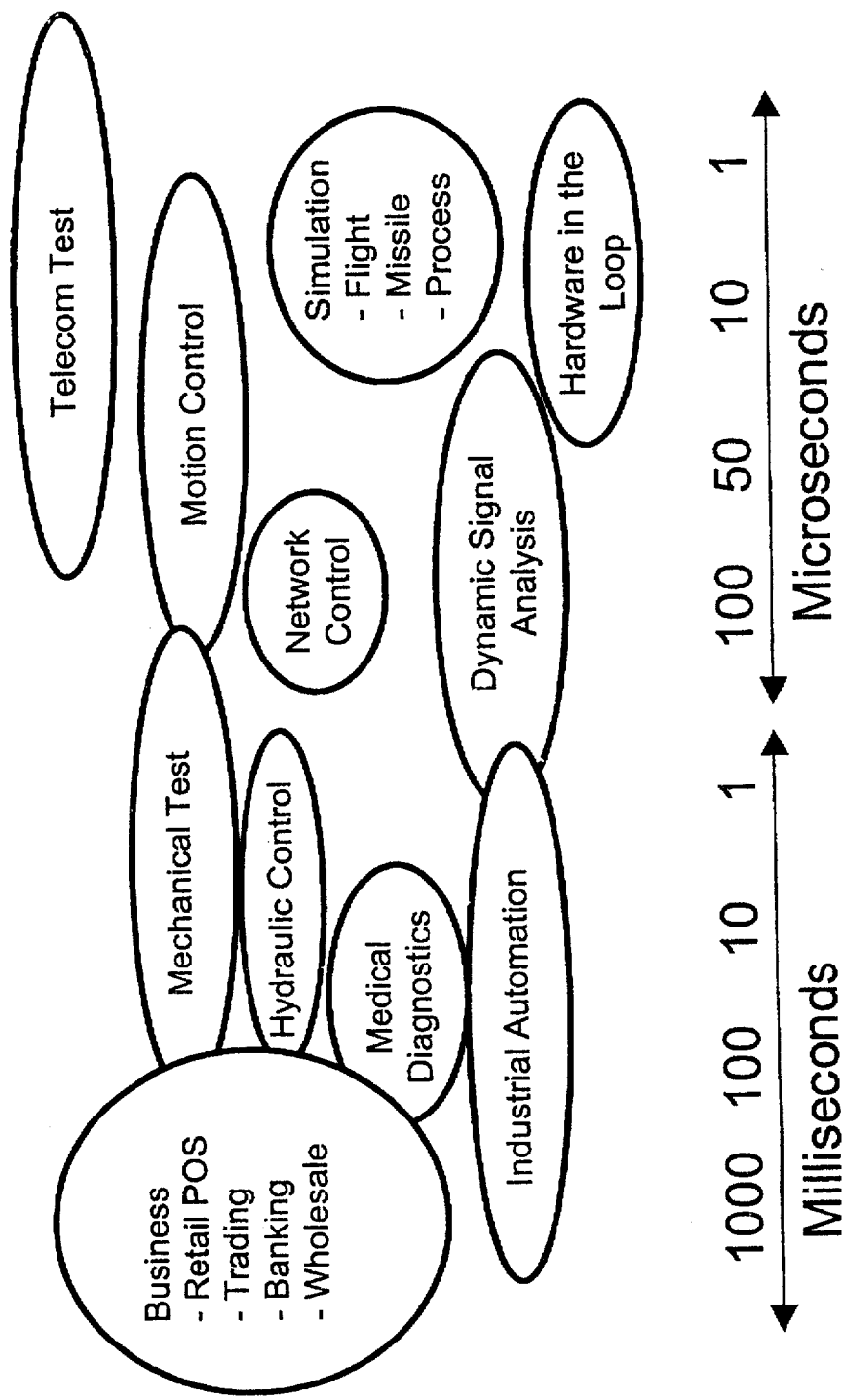
FIG. 24 illustrates example application domains for the present invention with characteristic times.

FIG. 24—RIO Application Domains

FIG. 24 illustrates a number of example application domains for RIO, with representative characteristic times for each domain. Although the times shown in FIG. 24 range from over a second down to roughly a microsecond, it is noted that as the performance of programmable hardware elements increases, the time resolution of possible applications may increase, perhaps dramatically, and so the domains shown in FIG. 24 are not meant to be limiting, but merely illustrative. As FIG. 24 shows, exemplary applications for RIO may range from relatively slow or low performance business applications, including retail point of sale (POS), trading, banking, and wholesale, where characteristic interaction times may be on the order of a second, to telecom testing, simulation, and hardware in the loop applications, where characteristic times approach 1 microsecond or less. Applications with characteristic times between these examples include (ordered approximately from slower to faster) industrial automation, medical diagnostics, mechanical test, hydraulic control, engine test, dynamic signal analysis, network control, and motion control. Thus, RIO technology is broadly applicable across a wide spectrum of application types and performance levels.

Thus, in various embodiments, a programmable hardware element in a RIO system may be programmed or configured to implement a variety of digital and/or analog components capable of performing measurement (including data acquisition) and/or control (including automation) functions. The systems and methods described herein are particularly suitable for developing simple hardware functionality which is difficult to express in fixed hardware resources, including complex triggering, quadrature encoding, simple bit transfers, and the like. Additionally, in various embodiments, the programmable hardware element in the RIO system may be programmed or configured to implement an interface for communicating with a measurement module, where the interface is defined by interface protocol information transmitted by the measurement module.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A system for debugging a program which is intended to execute on a reconfigurable device, the system comprising:
   a reconfigurable device, comprising:
   a programmable hardware element; and
   one or more fixed hardware resources coupled to the programmable hardware element; and
   a computer system comprising a processor and a memory;
   wherein the computer system is coupled to the reconfigurable device;
   wherein the memory stores the program specifying a function, wherein the program is convertible into a hardware configuration program which specifies a configuration for the programmable hardware element that implements the function, and wherein the hardware configuration program further specifies usage of the one or more fixed hardware resources by the programmable hardware element in performing the function;
   wherein the programmable hardware element is further configurable with a test feed-through configuration, wherein, after configuration with the test feed-through configuration, the programmable hardware element provides for communication between the program and the one or more fixed hardware resources; and
   wherein, for debugging purposes, the program is further executable by the processor of the computer system to test performance of the function including the usage of the one or more fixed hardware resources.

2. The system of claim 1, wherein during execution of the program in the computer system, the program is operable to communicate through the programmable hardware element configured with the test feed-through configuration to invoke the one or more fixed hardware resources.

3. The system of claim 1, wherein execution of the program on the computer system simulates execution of the hardware configuration program on the programmable hardware element.

4. The system of claim 1, wherein the computer system includes a display for displaying one or more panels, wherein the one or more panels display information specifying the functionality of the program.

5. The system of claim 1, wherein the program is a measurement program which is executable to perform a measurement function.

6. The system of claim 1, wherein the program is an automation program which is executable to perform an automation function.

7. The system of claim 1, wherein the program is a simulation program which is executable to perform a simulation function.

8. The system of claim 1, wherein the program is a control program which is executable to perform a control function.

9. The system of claim 1, wherein the memory stores the test feed-through configuration in a pre-compiled format.

10. The system of claim 1, wherein the program is a graphical program.

11. The system of claim 1, wherein the program includes one or more I/O primitives, wherein the one or more I/O primitives are convertible into a portion of a hardware configuration program to invoke the one or more fixed hardware resources, and wherein the one or more I/O primitives are executable in the program on the computer system to communicate through the programmable hardware element to the fixed hardware resources.

12. The system of claim 1, wherein the programmable hardware element comprises a field programmable gate array (FPGA).

13. The system of claim 1,
   wherein the programmable hardware element is configured to implement a processor, wherein the device further comprises a memory, and wherein a portion of the program is stored in the memory;
   wherein the program is compiled for the implemented processor; and
   wherein, for debugging purposes, the compiled program is executable on the implemented processor to test performance of the function including the usage of the one or more fixed hardware resources.

14. The system of claim 1,
   wherein the one or more fixed hardware resources are operable to provide one or more of:
   a control and data path to the computer system;
   I/O interfacing to an external system;
   optimized hardware elements; and
   basic operating services.

15. The system of claim 1,
   wherein the one or more fixed hardware resources comprise fixed hardware including one or more of:
   analog to digital converters (ADCs), digital to analog converters (DACs), and digital lines.

16. A system for debugging a measurement program which is usable to configure a reconfigurable measurement device, the system comprising:
   the reconfigurable measurement device comprising:
   a programmable hardware element;
   one or more fixed hardware resources coupled to the programmable hardware element; and
   a computer system comprising a processor and a memory;
   wherein the computer system is coupled to the reconfigurable measurement device;
   wherein the memory stores the measurement program specifying a measurement function;
   wherein the programmable hardware element is further configurable with a test feed-through configuration, wherein, after configuration with the test feed-through configuration, the programmable hardware element provides for communication between the one or more fixed hardware resources and the measurement program; and
   wherein, for debugging purposes, the measurement program is further executable by the processor of the computer system to test performance of the measurement function including the usage of the one or more fixed hardware resources.

17. The system of claim 16,
   wherein the measurement program is convertible into a hardware configuration program which specifies a configuration for the programmable hardware element that implements the measurement function, and wherein the hardware configuration program further specifies usage of the one or more fixed hardware resources by the programmable hardware element in performing the measurement function.

18. The system of claim 16, wherein the memory stores the test feed-through configuration in a pre-compiled format.

19. The system of claim 16, wherein the programmable hardware element comprises a field programmable gate array (FPGA).

20. The system of claim 16, wherein during execution of the program in the computer system, the program is operable to communicate through the programmable hardware element configured with the test feed-through configuration to invoke the one or more fixed hardware resources.

21. The system of claim 16, wherein execution of the program on the computer system simulates execution of the hardware configuration program on the programmable hardware element.

22. The system of claim 16, wherein the computer system includes a display for displaying one or more panels, wherein the one or more panels display information specifying the functionality of the program.

23. A system for debugging a reconfigurable measurement system, the system comprising:

a programmable hardware element;

one or more fixed hardware resources coupled to the programmable hardware element; and a computer system comprising a processor and a memory;
wherein the computer system is coupled to the programmable hardware element;
wherein the memory stores a measurement program specifying a measurement function, wherein the measurement program is convertible into a hardware configuration program which specifies a configuration for the programmable hardware element that implements the measurement function, and wherein the hardware configuration program further specifies usage of the one or more fixed hardware resources by the programmable hardware element in performing the measurement function;

wherein the programmable hardware element is further configurable with a test feed-through configuration, wherein, after configuration with the test feed-through configuration, the programmable hardware element provides for communication between the one or more fixed hardware resources and the program; and wherein, for debugging purposes, the measurement program is further executable by the processor of the computer system to test performance of the measurement function including the usage of the one or more fixed hardware resources.

24. The system of claim 23, wherein during execution of the program in the computer system, the measurement program is operable to communicate through the programmable hardware element configured with the test feed-through configuration to invoke the one or more fixed hardware resources.

25. The system of claim 23, wherein the test feed-through configuration is pre-compiled.

26. The system of claim 23, wherein the computer system includes a display for displaying one or more panels, wherein the one or more panels display information specifying the functionality of the program.

27. The system of claim 23, wherein the programmable hardware element comprises a field programmable gate array (FPGA).

28. The system of claim 23, wherein execution of the program on the computer system simulates execution of the hardware configuration program on the programmable hardware element.

29. A method for debugging a program which is usable to configure a reconfigurable system, wherein the reconfigurable system includes a programmable hardware element coupled to one or more fixed hardware resources, the method comprising:

storing a program on a memory of a computer system, wherein the program specifies a function, and wherein the program is operable to be converted into a hardware configuration program and deployed on the programmable hardware element;

wherein the program is operable to be converted into a hardware configuration program that uses the one or more fixed hardware resources when executed on the programmable hardware element;

configuring the programmable hardware element with a test feed-through configuration, wherein, after configuration with the test feed-through configuration, the programmable hardware element provides for communication between the program and the one or more fixed hardware resources; and for debugging purposes, the computer system executing the program to test performance of the function including the usage of the one or more fixed hardware resources, wherein said executing includes the program communicating with the one or more fixed hardware resources through the programmable hardware element.

30. The method of claim 29, wherein said executing the program includes the program invoking the one or more fixed hardware resources through the programmable hardware element configured with the test feed-through configuration.

31. The method of claim 29, wherein said executing the program simulates execution of the hardware configuration program on the programmable hardware element.

32. The method of claim 29, further comprising:
displaying information on a display regarding said executing the program.

33. The method of claim 32, wherein the information is useable in debugging the program.

34. The method of claim 29, wherein the test feed-through configuration is pre-compiled.

35. The method of claim 29, wherein the computer system includes a display for displaying one or more panels, wherein the one or more panels display information specifying the functionality of the program.

36. The method of claim 29, wherein the program is a measurement program which is executable to perform a measurement function.

37. The method of claim 29, wherein the program is an automation program which is executable to perform an automation function.

38. The method of claim 29, wherein the program is a simulation program which is executable to perform a simulation function.

39. The method of claim 29, wherein the program is a control program which is executable to perform a control function.

40. The method of claim 29, wherein the programmable hardware element comprises a field programmable gate array (FPGA).

41. The method of claim 29,
wherein the one or more fixed hardware resources comprise fixed hardware including one or more of:
analog to digital converters (ADCs), digital to analog converters (DACs), and digital lines.

42. The method of claim 29, wherein said executing includes the one or more fixed hardware resources providing one or more of:
a control and data path to the computer system;
I/O interfacing to an external system;
optimized hardware elements; and
basic operating services.

43. The method of claim 29,
wherein the program includes one or more I/O primitives, wherein the one or more I/O primitives are convertible into a portion of a hardware configuration program to invoke the one or more fixed hardware resources, and wherein said executing includes executing the one or more I/O primitives in the program on the computer system to communicate through the programmable hardware element to the one or more fixed hardware resources.

44. The method of claim 29, wherein the program is a graphical program.

45. The method of claim 29,
wherein the programmable hardware element is configured to implement a processor, wherein the device further comprises a memory, and wherein a portion of the program is stored in the memory;
wherein the program is compiled for the implemented processor; and
wherein, for debugging purposes, the compiled program is executable on the implemented processor to test performance of the function including the usage of the one or more fixed hardware resources.

46. A method for debugging a measurement program which is usable to configure a reconfigurable measurement device, wherein the device includes a programmable hardware element coupled to one or more fixed hardware resources, the method comprising:
storing a measurement program on a memory of a computer system, wherein the measurement program specifies a measurement function, and wherein the measurement program is operable to be converted into a hardware configuration program and deployed on the programmable hardware element;
wherein the measurement program specifies a hardware configuration program that is operable to use one or more fixed hardware resources coupled to the programmable hardware element
configuring the programmable hardware element with a test feed-through configuration, wherein, after configuration with the test feed-through configuration, the programmable hardware element provides for communication between the program and the one or more fixed hardware resources;
for debugging purposes, the computer system executing the measurement program to test performance of the function including the usage of the one or more fixed hardware resources, wherein said executing includes the measurement program communicating with the one or more fixed hardware resources through the programmable hardware element.

47. The method of claim 46, wherein the test feed-through configuration is pre-compiled.

48. The method of claim 46, wherein said executing the measurement program includes the measurement program invoking the one or more fixed hardware resources through the programmable hardware element configured with the test feed-through configuration.

49. The method of claim 46,
wherein said executing the measurement program simulates execution of the hardware configuration program on the programmable hardware element.

50. The method of claim 49, wherein the information is useable in debugging the measurement program.

51. The method of claim 46, further comprising:
displaying information on a display regarding said executing the measurement program.

52. The method of claim 46, wherein the computer system includes a display for displaying one or more panels, wherein the one or more panels display information specifying the functionality of the measurement program.

53. The method of claim 46, wherein the programmable hardware element comprises an field programmable gate array (FPGA).

54. The method of claim 46,
wherein the one or more fixed hardware resources comprise fixed hardware including one or more of:
analog to digital converters (ADCs), digital to analog converters (DACs), and digital lines.

55. The method of claim 46, wherein said executing includes the one or more fixed hardware resources providing one or more of:
a control and data path to the computer system;
I/O interfacing to an external system;
optimized hardware elements; and
basic operating services.

56. The method of claim 46,
wherein the measurement program includes one or more I/O primitives, wherein the one or more I/O primitives are convertible into a portion of a hardware configuration program to invoke the one or more fixed hardware resources, and wherein said executing includes executing the one or more I/O primitives in the measurement program on the computer system to communicate through the programmable hardware element to the one or more fixed hardware resources.

57. The method of claim 46, wherein the measurement program is a graphical program.

58. The method of claim 46,
wherein the programmable hardware element is configured to implement a processor, wherein the device further comprises a memory, and wherein a portion of the measurement program is stored in the memory;
wherein the measurement program is compiled for the implemented processor; and
wherein, for debugging purposes, the compiled measurement program is executable on the implemented processor to test performance of the function including the usage of the one or more fixed hardware resources.

59. A memory medium comprised in a computer system, comprising:
a program that specifies a function, wherein the program is operable to be converted into a hardware configuration program and deployed on a programmable hardware element;
a hardware configuration program generated based on the program, wherein the hardware configuration program specifies a configuration for the programmable hardware element that implements the function, and wherein the hardware configuration program further specifies usage of the one or more fixed hardware resources by the programmable hardware element in performing the function; and
a test configuration;
a deployment program executable to deploy the test configuration onto the programmable hardware element, wherein, after configuration with the test configuration, the programmable hardware element provides for communication between the one or more fixed hardware resources and the program;
wherein, for debugging purposes, the program is executable by a processor in the computer system, to test performance of the function including the usage of the one or more fixed hardware resources, wherein during execution the program communicates with the one or more fixed hardware resources through the programmable hardware element.

60. The memory medium of claim 59, wherein the test configuration is a test feed-through configuration.

61. The memory medium of claim 59, wherein execution of the program by the processor simulates execution of the hardware configuration program on the programmable hardware element.

62. The memory medium of claim 59, further comprising:
a display program which is executable to display information on a display regarding said executing the program, wherein the information is useable in debugging the program.

63. The memory medium of claim 59, wherein the test configuration is pre-compiled.

64. The memory medium of claim 59, wherein the program is a measurement program which is executable to perform a measurement function.

65. The memory medium of claim 59, wherein the program is an automation program which is executable to perform an automation function.

66. The memory medium of claim 59, wherein the program is a simulation program which is executable to perform a simulation function.

67. The memory medium of claim 59, wherein the program is a control program which is executable to perform a control function.

68. The memory medium of claim 59, further comprising:
a graphical program comprising one or more panels for displaying information specifying the functionality of the program.

69. A memory medium containing program instructions which are executable to perform:
storing a measurement program on a memory of a computer system, wherein the measurement program specifies a measurement function, and wherein the measurement program is operable to be converted into a hardware configuration program and deployed on a programmable hardware element;
wherein the hardware configuration program specifies usage of one or more fixed hardware resources by the programmable hardware element;
configuring the programmable hardware element with a test feed-through configuration, wherein, after configuration with the test feed-through configuration, the programmable hardware element provides for communication between the one or more fixed hardware resources and the measurement program;
for debugging purposes, executing the measurement program on the computer system to test performance of the function including the usage of the one or more fixed hardware resources, wherein said executing includes the measurement program communicating with the one or more fixed hardware resources through the programmable hardware element.

70. The memory medium of claim 69, wherein said executing the measurement program includes the program invoking the one or more fixed hardware resources through the programmable hardware element configured with the test feed-through configuration.

71. The memory medium of claim 69, wherein said executing the measurement program simulates execution of the hardware configuration program on the programmable hardware element.

72. The memory medium of claim 69, wherein the program instructions are further executable to perform:
displaying information on a display regarding said executing the measurement program, wherein the information is useable in debugging the program.

73. The memory medium of claim 69, wherein the test feed-through configuration is pre-compiled.

74. The memory medium of claim 69, wherein the computer system includes a display for displaying one or more panels, wherein the program instructions are further executable to implement the one or more panels, and wherein the one or more panels display information specifying the functionality of the measurement program.

75. The memory medium of claim 69, wherein the programmable hardware element comprises a field programmable gate array (FPGA).

76. A memory medium containing program instructions which are executable to perform:
storing a program on a memory of a computer system, wherein the software program specifies a function, and wherein the software program is operable to be converted into a hardware configuration program and deployed on the programmable hardware element;
wherein the hardware configuration program specifies usage of the one or more fixed hardware resources by the programmable hardware element;
configuring the programmable hardware element with a test feed-through configuration, wherein, after configuration with the test feed-through configuration, the programmable hardware element provides for communication between the one or more fixed hardware resources and the software program;
for debugging purposes, executing the software program on the computer system to test performance of the function including the usage of the one or more fixed hardware resources, wherein said executing includes the software program communicating with the one or more fixed hardware resources through the programmable hardware element.

77. The memory medium of claim 76, wherein said executing the measurement program includes the program invoking the one or more fixed hardware resources through the programmable hardware element configured with the test feed-through configuration.

78. The memory medium of claim 76, wherein said executing the measurement program simulates execution of the hardware configuration program on the programmable hardware element.

79. The memory medium of claim 76, wherein the program instructions are further executable to perform:
displaying information on a display regarding said executing the measurement program, wherein the information is useable in debugging the program.

80. The memory medium of claim 76, wherein the test feed-through configuration is pre-compiled.

81. The memory medium of claim 76, wherein the software program is a measurement software program which is executable to perform a measurement function.

82. The memory medium of claim 76, wherein the software program is an automation software program which is executable to perform an automation function.

83. The memory medium of claim 76, wherein the software program is a simulation software program which is executable to perform a simulation function.

84. The memory medium of claim 76, wherein the software program is a control software program which is executable to perform a control function.

85. A memory medium comprised in a computer system, comprising:
- a user interface program which is executable to receive user input specifying a function;
- a configuration generation program which is executable to generate a hardware configuration program based on the user input, where the hardware configuration program is deployable on a programmable hardware element, and wherein the hardware configuration program specifies a configuration for the programmable hardware element that implements the function, and wherein the hardware configuration program further specifies usage of one or more fixed hardware resources by the programmable hardware element in performing the function; and
- a test configuration;
- a deployment program executable to deploy the test configuration onto the programmable hardware element, wherein, after configuration with the test configuration, the programmable hardware element provides for communication between the one or more fixed hardware resources and the program;

wherein, for debugging purposes, the program is executable by a processor in the computer system to test performance of the function including the usage of the one or more fixed hardware resources, wherein during execution the program communicates with the one or more fixed hardware resources through the programmable hardware element.

86. The memory medium of claim 85, wherein the test configuration is a test feed-through configuration.

87. The memory medium of claim 85, wherein execution of the program by the processor simulates execution of the hardware configuration program on the programmable hardware element.

88. The memory medium of claim 85, wherein the programmable hardware element comprises a field programmable gate array (FPGA).

* * * * *

UNITED STATES PATENT AND TRADEMARK OFFICE
CERTIFICATE OF CORRECTION

PATENT NO. : 7,024,660 B2  Page 1 of 1
APPLICATION NO. : 10/055691
DATED : April 4, 2006
INVENTOR(S) : Andrade et al.

It is certified that error appears in the above-identified patent and that said Letters Patent is hereby corrected as shown below:

Column 80
Line 6, please delete "element comprises an field" and substitute
-- element comprises a field --;

Column 80
Line 65, please delete "the computer system, to test" and substitute
-- the computer system to test --.

Signed and Sealed this

First Day of August, 2006

JON W. DUDAS
*Director of the United States Patent and Trademark Office*